(12) United States Patent
Umayabashi et al.

(10) Patent No.: US 8,675,665 B2
(45) Date of Patent: Mar. 18, 2014

(54) CLOCK SYNCHRONIZATION SYSTEM, ITS METHOD AND PROGRAM

(75) Inventors: Masaki Umayabashi, Tokyo (JP); Hideo Yoshimi, Tokyo (JP); Zhenlong Cui, Tokyo (JP); Kazuo Takagi, Tokyo (JP); Atsushi Iwata, Tokyo (JP)

(73) Assignee: NEC Corporation, Tokyo (JP)

( * ) Notice: Subject to any disclaimer, the term of this patent is extended or adjusted under 35 U.S.C. 154(b) by 500 days.

(21) Appl. No.: 12/678,167

(22) PCT Filed: Sep. 12, 2008

(86) PCT No.: PCT/JP2008/066567
§ 371 (c)(1),
(2), (4) Date: Mar. 15, 2010

(87) PCT Pub. No.: WO2009/035091
PCT Pub. Date: Mar. 19, 2009

(65) Prior Publication Data
US 2010/0309934 A1 Dec. 9, 2010

(30) Foreign Application Priority Data

Sep. 14, 2007 (JP) ................. 2007-239415
Jul. 1, 2008 (JP) ................. 2008-172578

(51) Int. Cl.
*H04L 12/28* (2006.01)

(52) U.S. Cl.
USPC ....... 370/395.62; 370/252; 370/350; 370/503

(58) Field of Classification Search
USPC ................. 370/395.62, 350, 503, 328, 252
See application file for complete search history.

(56) References Cited

U.S. PATENT DOCUMENTS

| 5,367,643 | A | * | 11/1994 | Chang et al. | 710/62 |
| 5,491,728 | A | * | 2/1996 | Verhille et al. | 375/362 |
| 6,005,869 | A | * | 12/1999 | Sakai et al. | 370/452 |
| 6,914,883 | B2 | * | 7/2005 | Dharanikota | 370/230.1 |
| 2004/0076191 | A1 | * | 4/2004 | Sundqvist et al. | 370/516 |
| 2004/0264485 | A1 | * | 12/2004 | Okamura | 370/412 |
| 2006/0109789 | A1 | * | 5/2006 | Skerritt | 370/238 |
| 2006/0267695 | A1 | * | 11/2006 | Keating | 331/16 |

FOREIGN PATENT DOCUMENTS

| JP | 2000-244473 A | 9/2000 |
| JP | 2000-278275 A | 10/2000 |
| JP | 2001-244809 A | 9/2001 |
| JP | 2004-153546 A | 5/2004 |
| JP | 2004-248123 A | 9/2004 |
| JP | 2007-018074 A | 1/2007 |
| JP | 2007-104347 A | 4/2007 |

(Continued)

OTHER PUBLICATIONS

International Search Report for PCT/JP2008/066567, mailed Dec. 16, 2008.

*Primary Examiner* — Wanda Z Russell
(74) *Attorney, Agent, or Firm* — Sughrue Mion, PLLC

(57) ABSTRACT

The clock synchronization accuracy between a master node and a slave node is stably measured. The slave node synchronizes its own clock with the clock of the master node by means of the packets transmitted from the master node. It reproduces the clock of the slave node by means of the transmitted packets, accumulates information on the transmitted packets and the clock of the slave node and performs clock synchronization on the basis of the accumulated information.

26 Claims, 45 Drawing Sheets

(56) References Cited

FOREIGN PATENT DOCUMENTS

| JP | 2007-104569 A | 4/2007 |
|----|---------------|--------|
| JP | 2007-134873 A | 5/2007 |
| JP | 2007-239415 A | 9/2007 |
| JP | 2008-053797 A | 3/2008 |
| WO | 01/50674 A | 7/2001 |
| WO | 2004/075447 A | 9/2004 |

* cited by examiner

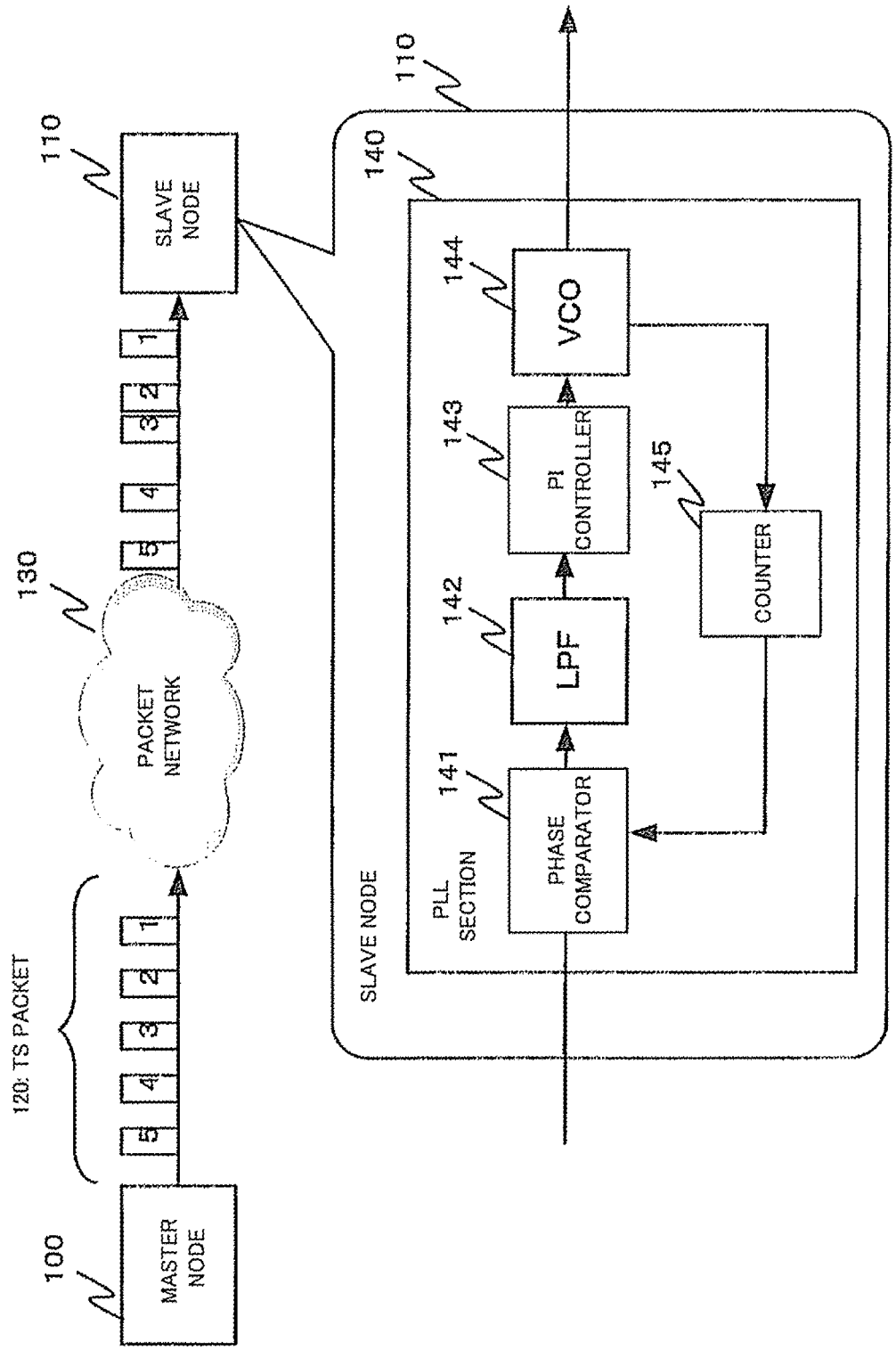

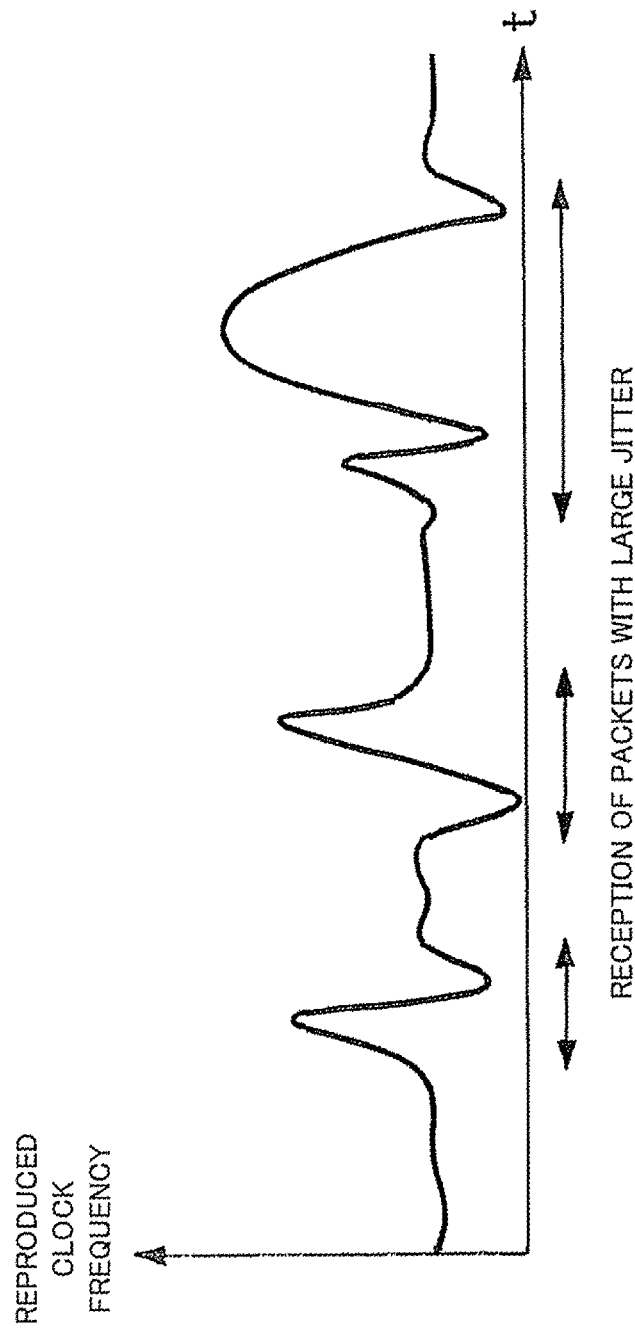

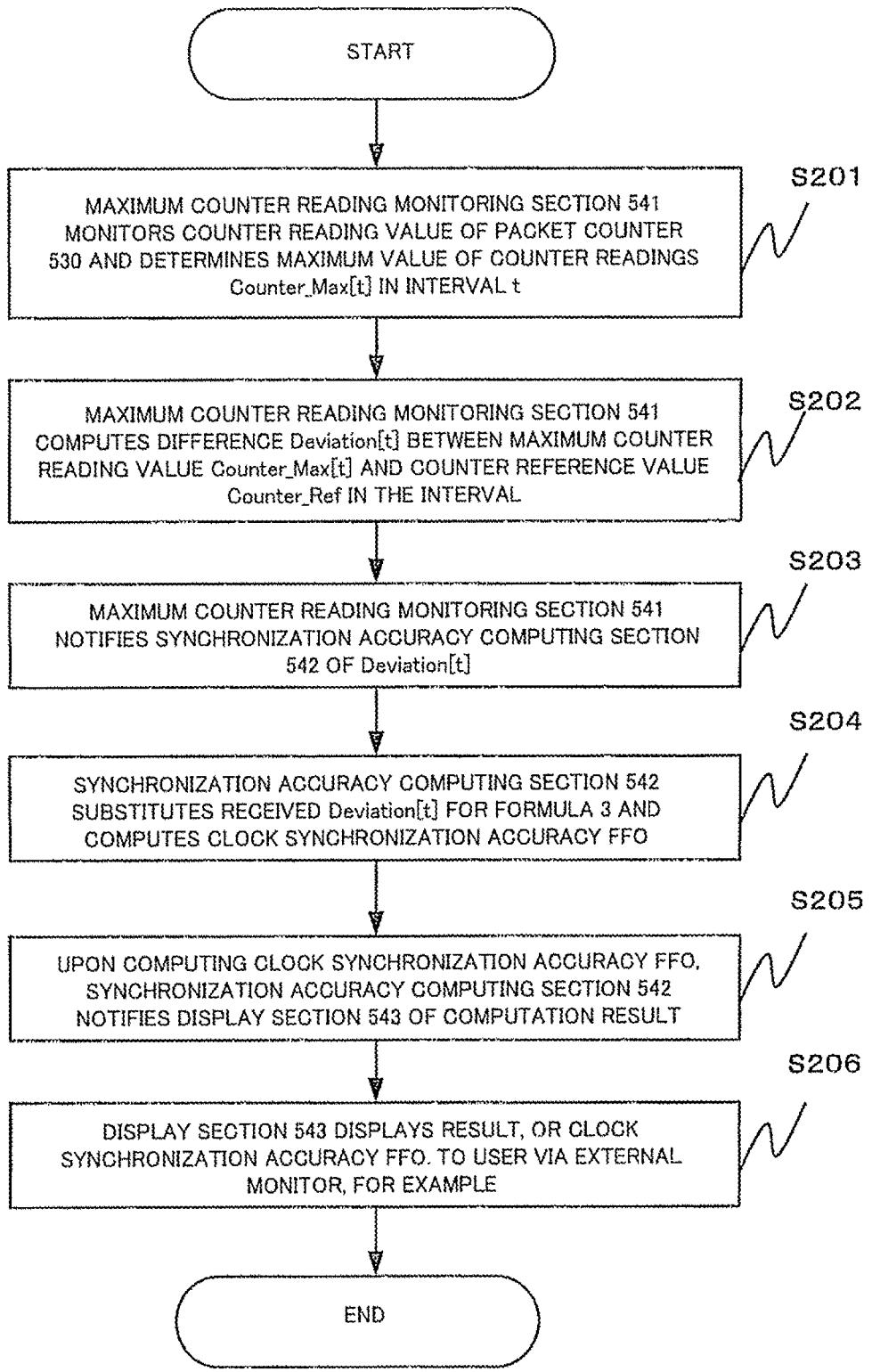

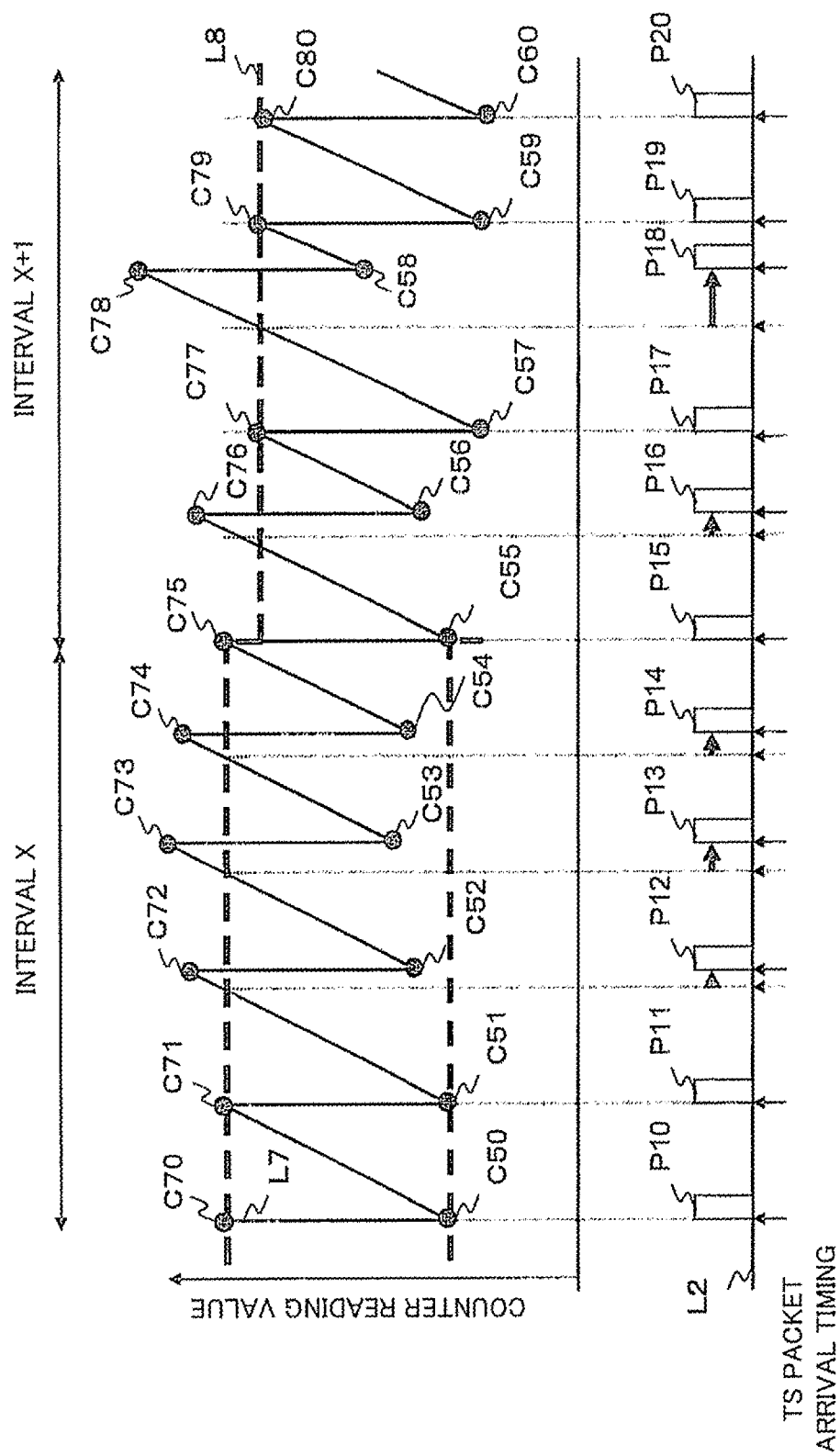

FIG.41

| NUMBER | P10 | P11 | P12 | P13 | P14 | P15 | P16 | P17 | P18 | P19 | P20 |
|---|---|---|---|---|---|---|---|---|---|---|---|
| TSm(t) | 10000 | 11000 | 12000 | - | 14000 | 15000 | 16000 | 17000 | - | - | 20000 |
| Δ | 1000 | 1000 | 1000 | - | 2000 | 1000 | 1000 | 1000 | - | - | 3000 |
| X | 1 | 1 | 1 | - | 2 | 1 | 1 | 1 | - | - | 3 |

CLOCK SYNCHRONIZATION SYSTEM, ITS METHOD AND PROGRAM

The present patent application is the National Phase of PCT/JP2008/066567, filed on Sep. 12, 2008, which is based on Japanese Patent Application No. 2007-239415 (filed on Sep. 14, 2007) and Japanese Patent Application No. 2008-172578 (filed on Jul. 1, 2008) and claims the benefit of priority of Japanese Patent Application No. 2007-239415 and Japanese Patent Application No. 2008-172578 according to Paris Convention. The disclosures of Japanese Patent Application No. 2007-239415 and Japanese Patent Application No. 2008-172578 are incorporated herein by reference.

TECHNICAL FIELD

The present invention relates to a system for measuring a clock synchronization accuracy between relevant devices via a packet network and its method and program.

BACKGROUND ART

As the amount of data to be transferred by way of networks rises, the need of realizing high speed data communication networks at low cost has been intensified to common carriers for telecommunications. A shift from high cost networks employing a time division multiplexing (TDM) system to low cost and high efficiency networks employing an Internet protocol system (to be referred to as "IP system" hereinafter) is on the way.

Accurate clock synchronization is required to some traffics of data being transferred on networks both at the sending node side and at the receiving node side. For example, in order to exchange high quality data including audio and video data on a real time basis, the data needs to be reproduced at predetermined timings. Stable clock synchronization is required for this purpose.

In the case of mobile network services, again for example, accurate clock synchronization is required to realize handovers between cells without delay. More specifically, a very high clock synchronization accuracy of 50 [ppb: parts per billion] is required to each base station device on a mobile network relative to a radio network controller. If the clock synchronization accuracy of the base station device falls short of the required level of 50 [ppb], the inter-cell handover may fail and some data may become missing to degrade the communication quality.

In this regard, a receiving node can extract the clock information of the corresponding sending node via the transmission path in the case of networks based on a TDM system and hence it is possible to realize a high accuracy clock synchronization between the sending and receiving nodes. On the other hand, in the case of IP networks based on an IP system, data are transferred asynchronously in the network so that fluctuations of time intervals take place to data arrivals at a receiving node. Therefore, it is difficult to extract high accuracy clock information from the received data. Hence, the receiving node needs to reproduce the clock of the sending side.

Time stamp systems have been proposed as a technique of realizing a high accuracy clock reproduction via a packet network such as an IP network, which is described above. The arrangement of a time stamp system will be described below by referring to FIG. 1.

Referring to FIG. 1, master node 100 and slave node 110 are connected to each other via a packet network 130. With the time stamp system, a master node 100, which operates as a sending node, transmits a TS packet that stores a time stamp (to be referred to as "TS" hereinafter) to a slave node 110, which operates as a receiving node.

The TS packet arrives at the slave node 110 by way of the packet network 130 (see the upper part in FIG. 1). Upon receiving the TS packet, the slave node 110 adjusts its own clock, utilizing the TS information stored in the TS packet, so as to synchronize it with the clock of the master node 100. Now, the operation of clock synchronization will be described in greater detail below by explaining the configuration of the slave node 110, referring to the lower part of FIG. 1.

The slave node 110 has a phase-locked loop (PPL) (to be referred to as "PPL" hereinafter and also in the drawings) and realizes clock synchronization by computing the difference between the TS generated by its own clock and the TS received from the master node 100 and adjusting its own clock according to the difference by means of the PLL 140.

The PLL 140 has five functions including a phase comparator 141, a loop filter (LPF: low pass filter) 142, a proportion/integration (PI) circuit (to be referred to as "PI controller" hereinafter and also in the drawings) 143, a voltage controlled oscillator (VCO) 144 and a counter 145.

The phase comparator 141 computes the difference between the received TS and the TS generated by its own clock. The difference signal is then input to the LPF 142, where jitter and noise are removed from it. The difference signal smoothed by the LPF 142 is input to the PI controller 143. The PI controller 143 computes a control signal for ultimately converging the difference signal to nil and outputs it to the VCO 144. The VCO 144 outputs a clock of the frequency that is determined by the control signal from the PI controller 143 so that the slave side clock is adjusted by it. Additionally, the counter 145 generates a slave side TS on the basis of the adjusted clock and delivers it to the phase comparator 141.

Thus, it is possible for the slave node 110 to reproduce the clock of the master node 100 and synchronizes itself with the master node 100 by means of an operation of the PLL 140 as described above even by way of a packet network 130 (see, for example, PTL 1).

CITATION LIST

Patent Literature

{PTL 1} JP-A-2004-248123

SUMMARY OF INVENTION

Technical Problem

Cases where the best clock synchronization accuracy is achieved are those in which only a certain fixed delay exists between a maser node and a slave node and a time stamp periodically arrives at the slave node. However, such cases cannot be found in packet networks because fluctuations of delay inevitably exists on a packet network and jitter is brought in at the time of arrival of a time stamp. For this reason, it is very difficult to realize clock synchronization.

There are two major factors that make as if jitter appear at a slave node side. The first factor is clock drift between a master node and a slave node, although its influence is small if compared with the second factor.

The second factor is delay fluctuations of network, which is described above. This gives rise to a very large jitter to the time stamp arrival time. Note that the cause of delay fluctuations is that packets being transferred are forced to wait randomly by a queue of switches.

In this regard, jitter of a certain extent can be absorbed by the LPF of a PLL. However, when jitter that exceeds the tolerance comes in, it can no longer be absorbed by the LPF and the synchronization accuracy is degraded.

FIG. 2 shows how the clock synchronization accuracy is degraded when a packet comes in with a large jitter.

Thus, a conceivable solution for maintaining a clock synchronization accuracy is arranging a packet filter upstream relative to a PLL and taking countermeasures of blocking any time stamp that contains jitter exceeding a tolerance (threshold value) and allowing only time stamps not higher than the tolerance (threshold value) to pass in order to utilize it for clock synchronization.

However, when a time stamp is blocked, the PLL falls into an unstable self-running state for a while. Once it falls into such a self-running state, there arises a problem that its clock fluctuates due to temperature drift and aging. Temperature drift of a PLL is very large even in a temperature compensation type crystal oscillator (TCXO) that is designed to be held highly stable by adding a temperature compensation circuit (up to 3,000 ppb/° C.). Therefore, the influence of such temperature drift becomes noticeable to give rise to an out of synchronism situation if time stamps are filtered continuously.

Thus, realizing stable clock synchronization is a matter of tradeoff where the influence of temperature drift caused by delay fluctuations of network and a situation where the clock falls into a self-running state are complicatedly involved. It is very difficult to dissolve such a problem.

To solve the tradeoff problem, it is necessary to grasp the relationship between accuracy degradation due to delay fluctuations and accuracy degradation due to temperature drift and lead out conditions that can minimize their influences. Apart from the above-described problem, there is another problem.

As in the above-described instance of mobile network based on an IP system, a required synchronization accuracy may be defined depending on services. For this reason, it is important to grasp the current synchronization accuracy when clock synchronization is being controlled between a master node and a slave node. The synchronization accuracy is measured on the basis of the discrepancy between the clock of the master node and the clock of the slave node.

This matter will be described firstly by way of an example of laboratory environment. A system where a master node 100 and a slave node 110 are connected to a measuring instrument 200 is formed in a laboratory environment as shown in FIG. 19. As a result, the measuring instrument is directly connected to the master node and the slave node so that it can acquire their respective clocks and measure the synchronization accuracy from the discrepancy between the two clocks. A network emulator may be connected between the master node 100 and the slave node 110 in order to simulate a packet network.

However, in a situation where a master node and a slave node are arranged on a real field so as to be provided with services, the master node and the slave node are generally located at places that are physically remote from each other and hence it is difficult to establish a system where they are directly connected to a measuring instrument. Then, it is difficult to measure the synchronization accuracy.

A possible method of measuring the synchronization accuracy in such a situation is the use of a global positioning system (GSP). More specifically, the master node and the slave node receive time information delivered from the GPS and synchronizes themselves with the GPS. As a result, the slave node can use the delivered information from the GPS as a master and measure the synchronization accuracy from the difference between the GPS and itself. With this method, the synchronization accuracy can be measured by utilizing information on an external GPS as common master information if the master node and the slave node are located at places that are physically remote from each other. On the other hand, there arises a problem of raised cost because each node needs to carry a GPS function. Additionally, there will be a problem that a highly accurate GPS is required to achieve a high synchronization accuracy at further raised cost.

Furthermore, if radio waves can not or hardly reach either or both of the nodes due to the sites and structures of the buildings where the nodes are located and the surrounding environments, this method cannot be used to measure the synchronization accuracy.

Therefore, it is an object of the present invention to provide a clock synchronization system using a clock synchronization accuracy monitor that can reduce the influence of delay fluctuation of network and suppress the influence of temperature drift in a self-running state to realize accurate clock synchronization and its method and program.

Another object of the present invention is to provide a clock synchronization accuracy measuring system that can measure the clock synchronization accuracy between a master node and a slave node stably at low cost and its method and program.

Solution to Problem

According to the present invention, there is provided a slave node characterized by receiving the packet transmitted from a master node, reproducing the clock of the slave node by using the received packet, accumulating the information relating to the clock of the slave node obtained from the information contained in the received packet and by the reproduction and conducting clock synchronization according to the accumulated information.

Additionally, according to the present invention, there is provided a clock synchronization method characterized in that a slave node receives the packet transmitted from a master node, reproduces the clock of the slave node by using the received packet, accumulates the information relating to the clock of the slave node obtained from the information contained in the received packet and by the reproduction and conducts clock synchronization according to the accumulated information.

Furthermore, according to the present invention, there is provided a clock synchronization program characterized by causing a computer to have a slave node receive the packet transmitted from a master node, reproduce the clock of the slave node by using the received packet, accumulate the information relating to the clock of the slave node obtained from the information contained in the received packet and by the reproduction and conduct clock synchronization according to the accumulated information.

Advantageous Effects of Invention

Thus, according to the present invention, it is possible to realize clock synchronization that works stably by monitoring the influence of delay fluctuations of network and that of temperature drift in a self-running state and leading out a filter threshold value that can minimize their influences.

Additionally, according to the present invention, it is possible to compute the current clock synchronization accuracy on the basis of the maximum transmission/reception bit count of the TS packets being managed by a slave node. Therefore, the present invention provides an advantage that the current synchronization accuracy can be grasped between a master node and a slave node.

BRIEF DESCRIPTION OF DRAWINGS

FIG. 1 An illustration of the configuration of a network and that of a slave node based on a related technique using a time stamp system.

FIG. 2 An illustration of degradation of clock synchronization accuracy that arises when a packet having a large jitter comes in on a network based on a related technique using a time stamp system.

FIG. 26-1 An illustration of the processing flow of the synchronization accuracy measuring section 314 when formula 3 is employed in the fourth exemplary embodiment of the present invention.

FIG. 26-2 An illustration of the processing flow of the synchronization accuracy measuring section 314 when formula 4 and formula 5 are employed in the fourth exemplary embodiment of the present invention.

FIG. 32-1 An illustration of the processing flow of the synchronization accuracy measuring section 540 when formula 3 is employed in the sixth exemplary embodiment of the present invention.

FIG. 32-2 An illustration of the processing flow of the synchronization accuracy measuring section 540 when formula 4 and formula 5 are employed in the sixth exemplary embodiment of the present invention.

FIG. 35-1 An illustration of the processing flow of the synchronization accuracy measuring section 3440 when formula 3 is employed in the seventh exemplary embodiment of the present invention.

FIG. 35-2 An illustration of the processing flow of the synchronization accuracy measuring section 3440 when formula 4 and formula 5 are employed in the seventh exemplary embodiment of the present invention.

FIG. 36 An illustration of arrival timing of a TS packet and the corresponding increase/decrease of the reading of the subtraction/addition packet counter 3430 according to an eighth exemplary embodiment of the present invention.

FIG. 37-1 An illustration of the processing flow of the synchronization accuracy measuring section 3440 when formula 3 is employed in the eighth exemplary embodiment of the present invention.

FIG. 37-2 An illustration of the processing flow of the synchronization accuracy measuring section 3440 when formula 4 and formula 5 are employed in the eighth exemplary embodiment of the present invention.

FIG. 41 An illustration of arrival timing of a TS packet and the corresponding increase/decrease of the reading of the packet counter 530 in the ninth exemplary embodiment of the present invention.

REFERENCE SIGNS LIST

Figure 3:
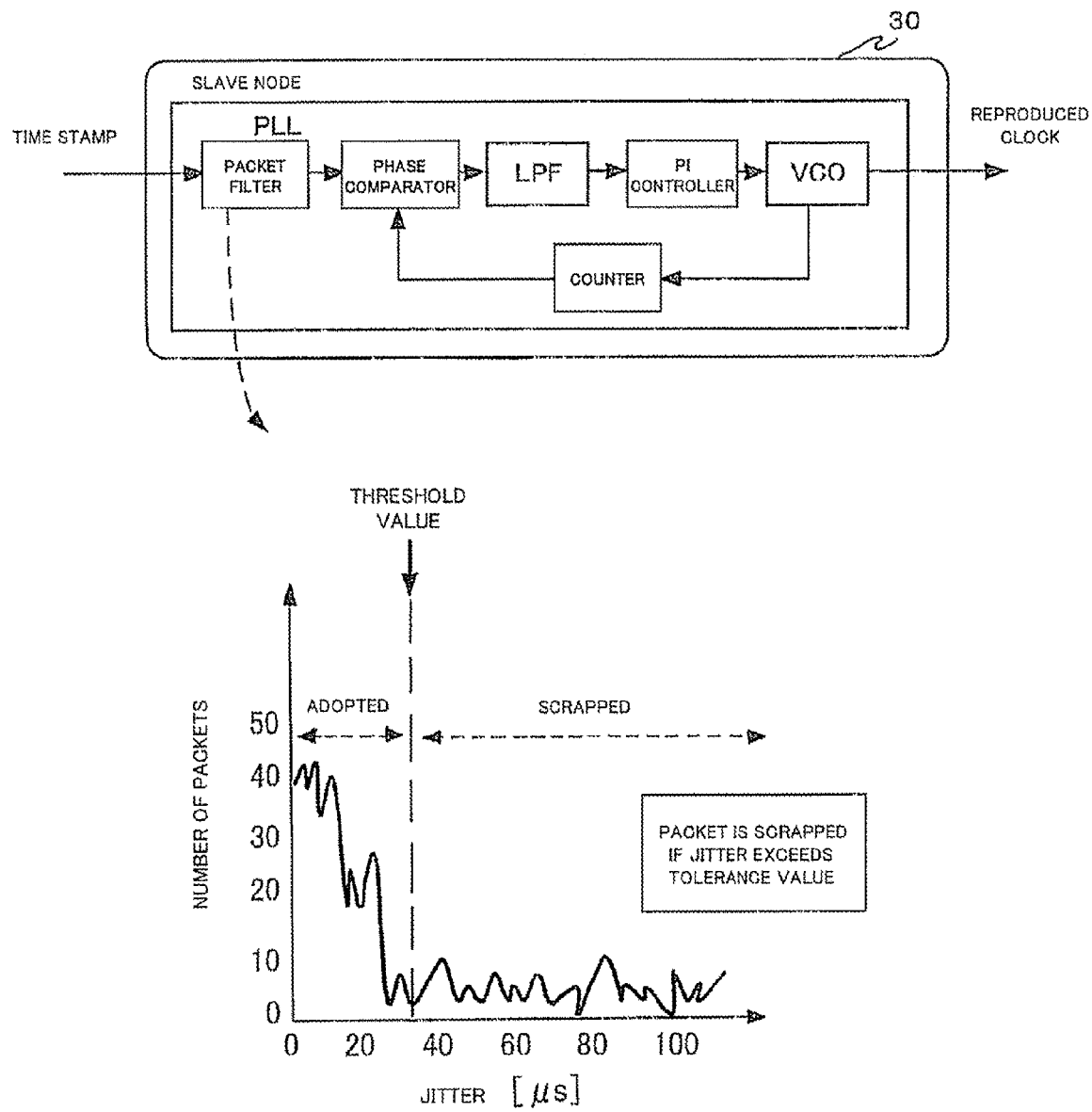
FIG. 3 An illustration of the configuration a network having a packet filter and based on a related technique using a time stamp system.

1, 12, 100, 400: master node
130: packet network
31, 32, 110, 500, 610, 710, 810, 910, 1010: slave node
40: first TDM device
41: second TDM device
50, 51: TDM network
111: RTP Encap
112: UDP/IP/Ethernet Encap
113: clock section
114: UDP/IP/Ethernet Decap
115: RTP Decap
116: buffer
120: TS packet
200: measuring instrument
141, 521, 3021: phase comparator
142, 522, 3022: LPF
143, 523, 3023: PI controller
144, 524, 3024: VCO
145, 525, 3025: counter
301, 315, 321 packet filter
302, 316, 322, 520: PLL
303, 317, 323: buffer
304, 318, 324: accuracy monitoring section
305, 319, 325: threshold value control section
311: RTP Encap
312: UDP/IP/Ethernet Encap
313: UDP/IP/Ethernet Decap
314: RTP Decap
326, 542: synchronization accuracy computing section
327, 543: display section
410: TS packet generating section
420: TS packet transmitting section
510: TS packet receiving section
530: packet counter

540, 930: synchronization accuracy measuring section
541: maximum counter reading monitoring section
611: packet filter
711: parameter control section
811: packet receiving section
812: packet buffer
813: queue length monitoring section
814: clock reproducing section
920: subtraction/addition packet counter
931: minimum counter reading monitoring section
1011: packet counter control section

DESCRIPTION OF EMBODIMENTS

Now, the features and implementation of the present invention will be described below by referring to the accompanying drawings that illustrate exemplary embodiments.

It should be understood, however, that the drawing and the descriptions that follow are only for illustration of exemplary embodiments of the present invention and hence do not by any means limit the scope of the present invention.

First Exemplary Embodiment

The first exemplary embodiment of the present invention will be described in detail by referring to the drawings.
<Configuration>

Figure 4:
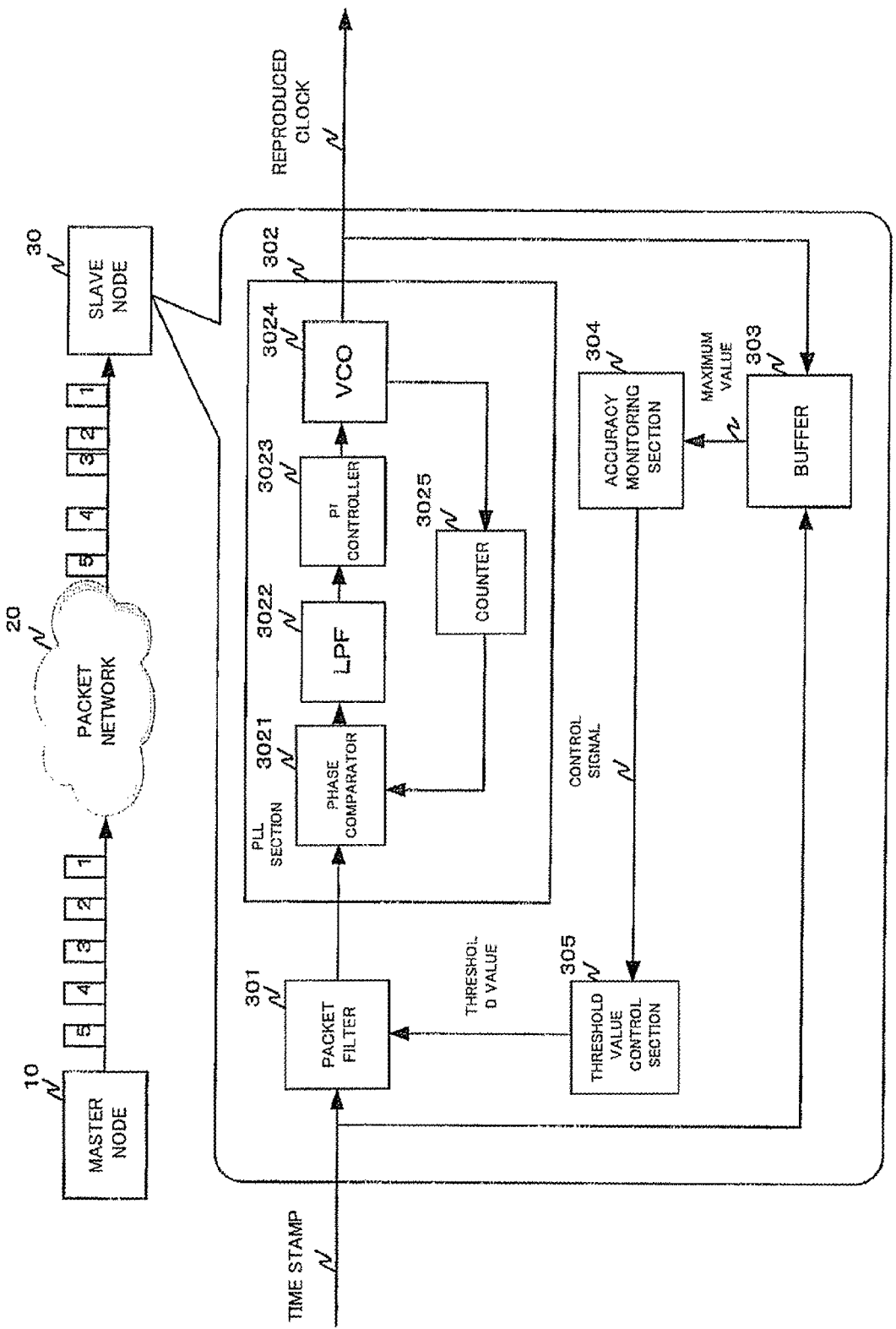
FIG. 4 An illustration of the basic configuration of a first exemplary embodiment of the present invention.

Referring to the upper part of FIG. 4, the first exemplary embodiment of the present invention includes a packet network 20, a master node 10 and a slave node 30.
<Master Node>

The master node 10 periodically transmits packets equipped with a TS for clock synchronization to the slave node 30.

A TS is generated on the basis of the clock of the master node 10. The value of the TS may typically be incremented sequentially by 1 for each packet.
<Slave Node>

The slave node 30 includes a packet filter 301, a PLL 302, a buffer 303, an accuracy monitoring section 304 and a threshold value control section 305. The slave node 30 receives the packets equipped with a TS from the master node 10.

The received packets are sent to the packet filter 301 and the buffer 303. The packet filter 301 checks the TS of each of the packets and also if the delay jitter that the packet has received is found within a range of threshold value. If the range of threshold value is exceeded, it scraps the packet. If, on the other hand, the delay jitter is within the range of threshold value, it delivers the TS to PLL 302.

The packet filter 301 constantly monitors the delay time of the arriving packet in order to know the delay jitter (Dvar) of each packet.

Figure 5:
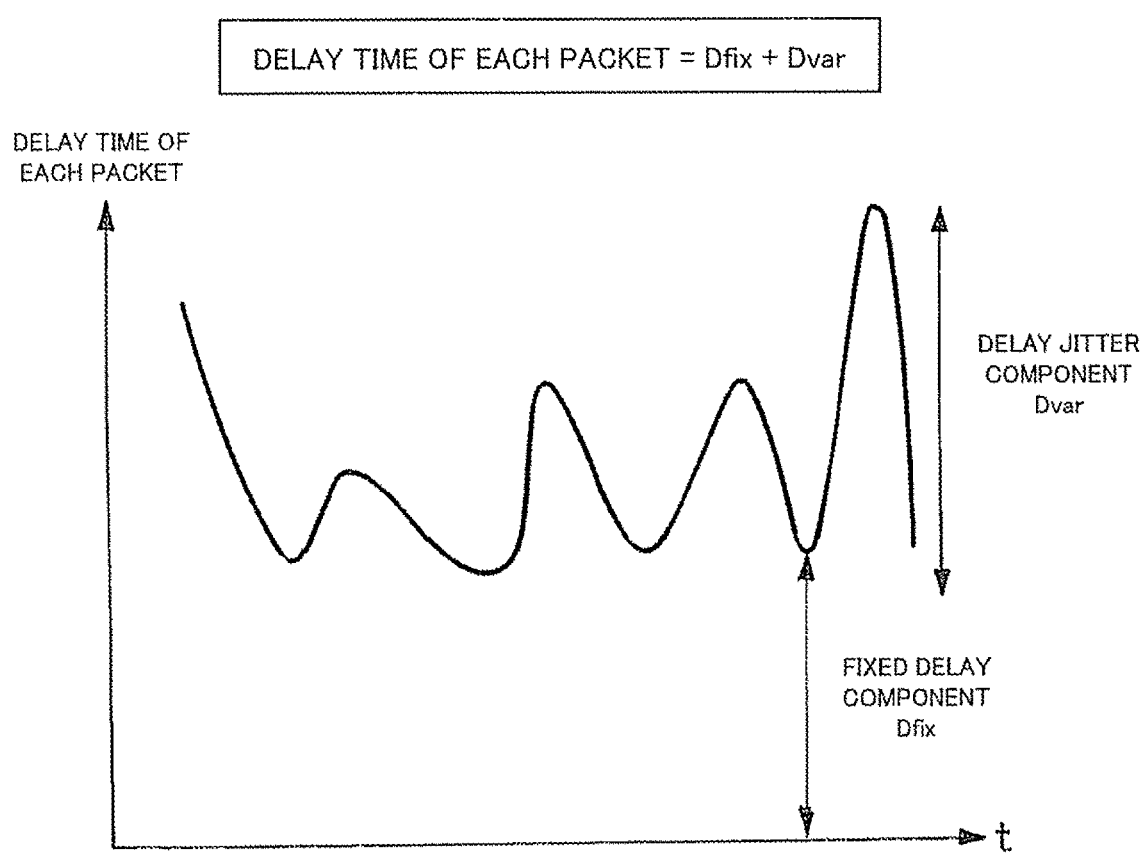
FIG. 5 An illustration of the delay time of each packet in the first exemplary embodiment of the present invention.

FIG. 5 shows the delay time of each packet. The delay time of each packet includes not only the delay jitter component (Dvar) but also a fixed delay component (Dfix). Therefore, the influence of the fixed delay component (Dfix) needs to be removed to find out the delay jitter that each packet has received.

More specifically, the packet filter 301 monitors the delay times of packets in a predetermined time period (e.g., 10 minutes) in order to grasp the fixed delay component (Dfix) and takes the minimum value thereof for the fixed delay component (Dfix).

After determining the fixed delay component (Dfix), it employs a means of subtracting the fixed delay component (Dfix) from the delay time of each packet it receives thereafter to determine the delay jitter (Dvar) thereof The PLL 302 includes a phase comparator 3021, an LPF 3022, a PI controller 3023, a VCO 3024 and a counter 3025.

The phase comparator 3021 computes the difference signal between the received TS and the output signal of the counter 3025 and outputs it to the LPF 3022.

The LPF 3022 smoothes the difference signal and suppresses jitter and noise. Then, it outputs the obtained result to the PI controller 3023.

The PI controller 3023 generates a control signal that ultimately reduces the difference signal to nil and outputs it the VCO 3024.

The VCO 3024 generates a clock of the frequency that is determined by the control signal and outputs it to the counter 3025.

The counter 3025 generates a TS on the basis of the clock and outputs it to the phase comparator 3021.

The buffer 303 accumulates the received packets in the buffer and takes out data accumulated in the buffer at a speed that is determined by the clock of the VCO 3024.

The accuracy monitoring section 304 monitors the accumulated amount of the buffer and determines the maximum value in a certain time range. It then computes the amount by which and the direction in which the threshold value of the filter is to be shifted and outputs them to the threshold value control section 305.

The threshold value control section 305 controls the threshold value of the packet filter 301 according to the received signal. The control algorithm for controlling the threshold value is such that the threshold value is adjusted so as to gradually approach an optimum value.

Now, determining an optimum threshold value of the first exemplary embodiment will be described in detail below.

As pointed out above, it is necessary to grasp the tradeoff relation of the degradation of accuracy due to delay fluctuations of the network and the degradation of accuracy due to temperature drift in a self-running state and lead out conditions that can minimize their influences in order to realize a very high clock synchronization accuracy.

Figure 6:
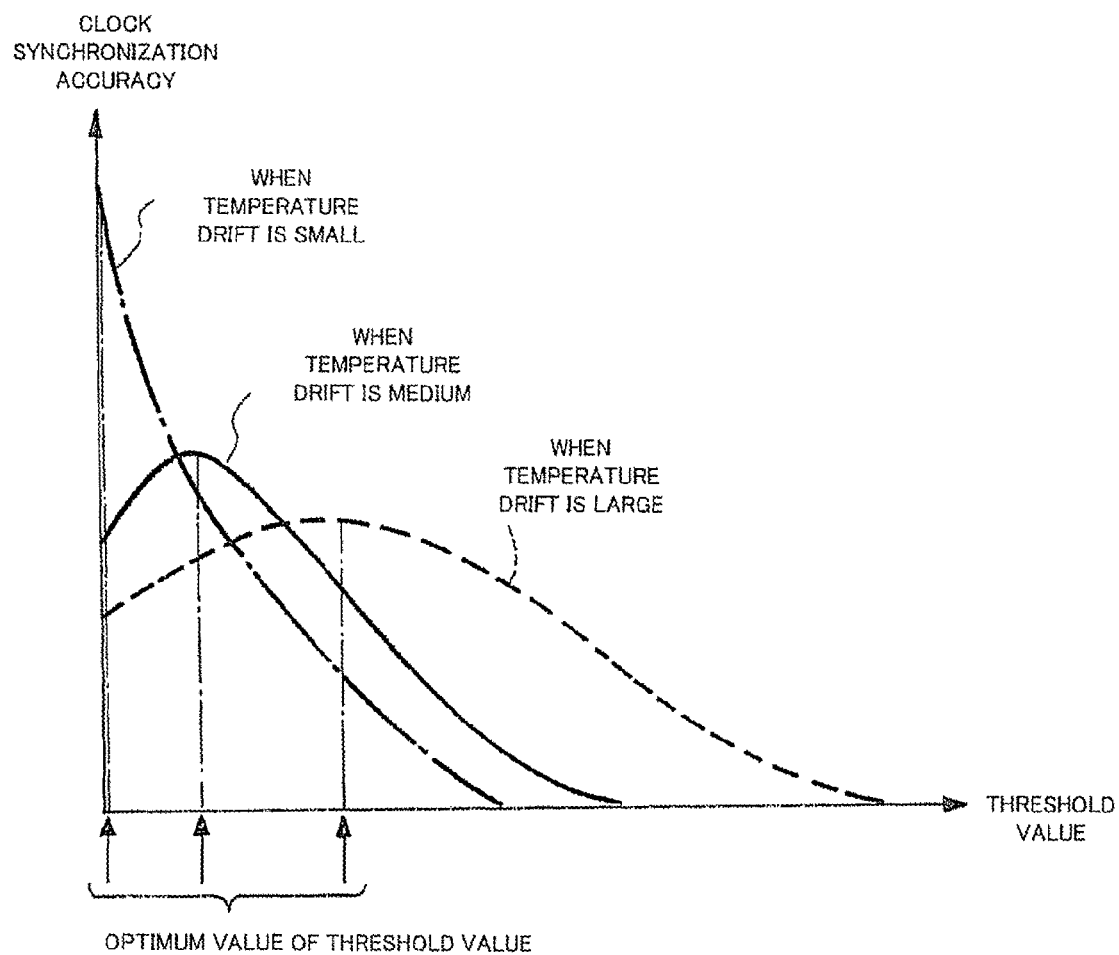
FIG. 6 An illustration of the relationship between the threshold value of the packet filter 301 and the clock synchronization accuracy of the first exemplary embodiment of the present invention.

Firstly, FIG. 6 shows the relationship between the threshold value of the packet filter 301 and clock synchronization accuracy to be referred to for the following description of the tradeoff relation.

For example, FIG. 6 shows the relationship when the temperature drift is small. The influence of delay fluctuations of the network can be suppressed by selecting a small value for the threshold value of the packet filter 301. Then, the probability by which packets are continuously filtered is raised to prolong the time period during which the PLL 302 is in a self-running state. However, the synchronization accuracy is not degraded if the duration of a self-running state is prolonged so long as the temperature drift is small. Therefore, when the temperature drift is small in a self-running state, the synchronization accuracy is improved by decreasing the threshold value of the packet filter 301 to filter TSs that contain jitter to a greater extent.

On the other hand, FIG. 6 also shows the relationship when the temperature drift is medium. In this case, it is necessary to select a somewhat large value for the threshold value to reduce the time period during which the PLL 302 is in a self-running state because the degradation of accuracy due to the temperature drift in a self-running state becomes remarkable if a too small value is selected for the threshold value of the packet filter.

FIG. 6 further shows the tendency of the relationship when the temperature drift is large.

In this case, it is necessary to select a considerably large value for the threshold value to reduce the time period during which the PLL 302 is in a self-running state to about nil because otherwise the degradation of accuracy due to the temperature drift in a self-running state becomes remarkable.

Thus, there is an optimum threshold value for the packet filter 301 that maximizes the clock synchronization accuracy. The influence of degradation of accuracy due to delay fluctuations and temperature drift can be minimized when the threshold value is optimized.

In other words, it is necessary to lead out an optimum threshold value for the packet filter 301 in order to achieve the objective of realizing a high accuracy clock synchronization.

However, it is not possible to find out on optimum value when the current clock synchronization accuracy level is not known because then there is no way to control the threshold value.

The accuracy monitoring section 304 exists in the first exemplary embodiment of the present invention in order to monitor the current clock synchronization accuracy. The accuracy monitoring section 304 constantly monitors the state of the buffer 303 in order to monitor the clock accuracy level.

Now, the principle of detection of synchronization accuracy of the present invention will be described below.

Figure 7:
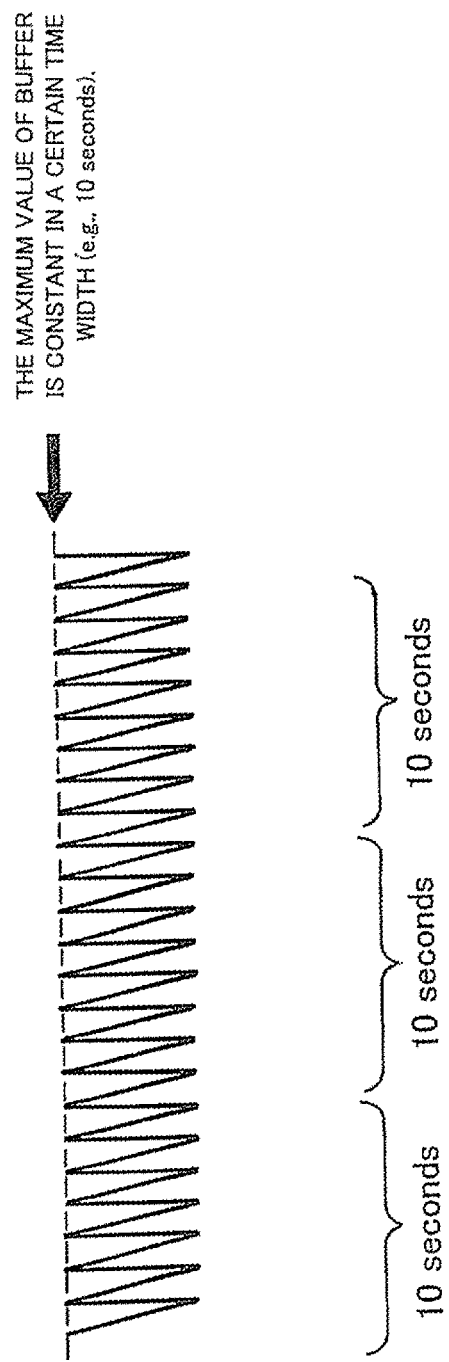
FIG. 7 An illustration of the accumulated amount of the buffer 303 when the slave side clock is accurately synchronized with the master side clock and the delay jitter of the network is constantly equal to 0 in the first exemplary embodiment of the present invention.

FIG. 7 is an illustration of the accumulated amount of the buffer 303 when the slave side clock is accurately synchronized with the master side clock and the delay jitter of the network is constantly equal to 0. In FIG. 7, the horizontal axis indicates the elapsed time and the vertical axis indicates the accumulated amount of the buffer.

Figure 8:
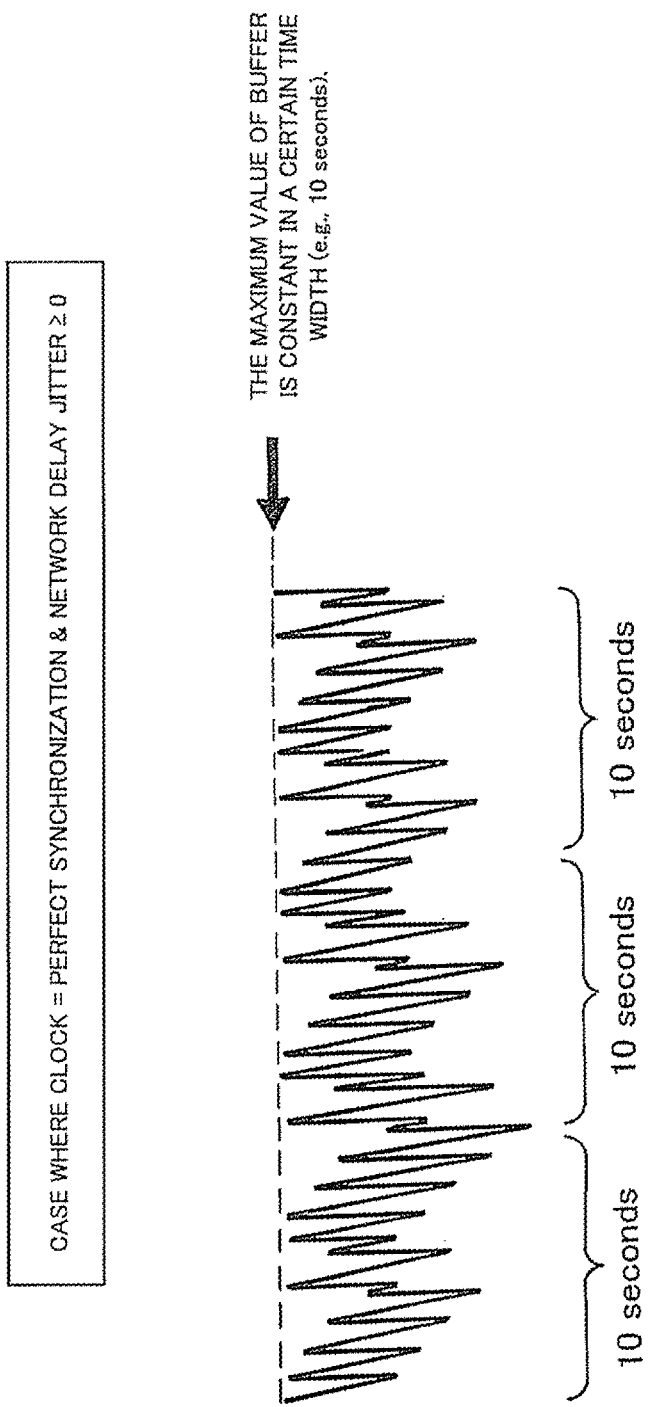
FIG. 8 An illustration of the accumulated amount of the buffer 303 when the slave side clock is accurately synchronized with the master side clock and delay jitter exists in the first exemplary embodiment of the present invention.

FIG. 8 is an illustration of the accumulated amount of the buffer 303 when the slave side clock is accurately synchronized with the master side clock and delay jitter exists.

Figure 9:
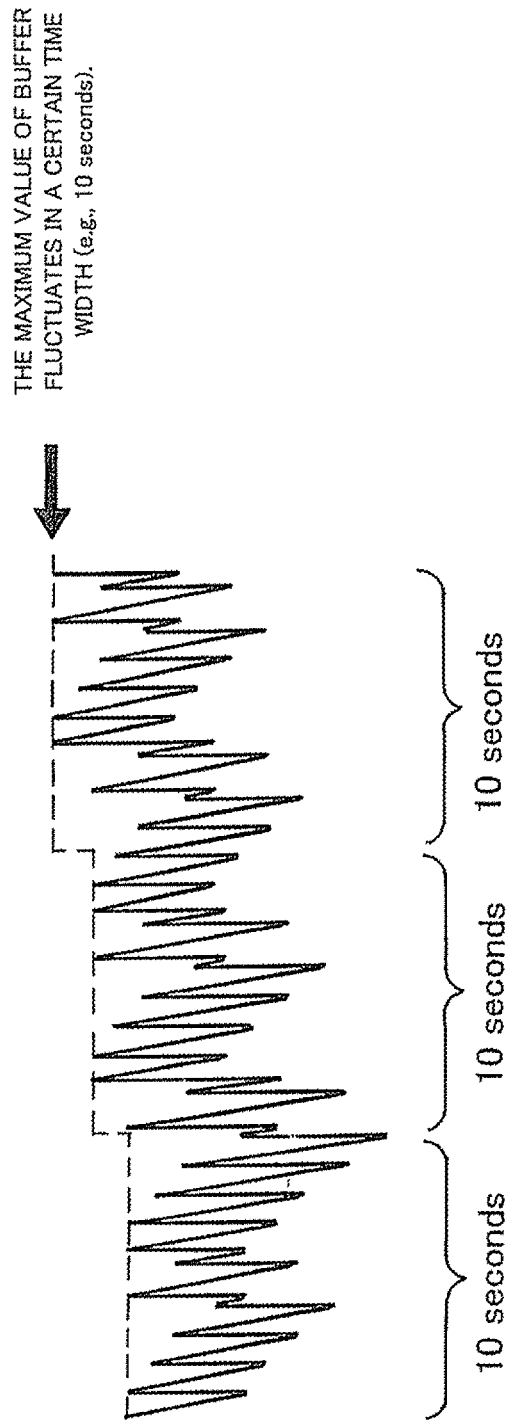
FIG. 9 An illustration of the accumulated amount of the buffer 303 when the slave side clock is not synchronized with the master side clock and delay jitter exists in the first exemplary embodiment of the present invention.

FIG. 9 is an illustration of the accumulated amount of the buffer 303 when the slave side clock is not synchronized with the master side clock and delay jitter exists. Note that FIG. 9 shows an instance where the slave side clock is delayed.

As seen from FIG. 7, the buffer repeats increase/decrease at regular time intervals when the clocks are synchronized and there is not any delay jitter.

The buffer occupancy ratio increases when a packet arrives. It increases by the data size of the packet at a time.

On the other hand, the buffer occupancy ratio decreases as data are led out from the data stored in the buffer at the clock speed of the VCO 3024. The decrease proceeds gradually.

On the other hand, FIG. 8 shows an instance where jitter exists. Since the time intervals of packet arrivals fluctuate due to the delay jitter, the timings of increases of the buffer occupancy ratio also fluctuates. Thus, the lower limit values of the buffer are held not constant but random under the influence thereof However, it is found by looking into the upper limit values of the buffer at certain regular time intervals (e.g., at every 10 seconds) that they are held to a constant level. The upper limit value of the buffer is reached when a packet that is not subjected to delay jitter in the packet network arrives. Thus, when viewed over a long time span, it will be found that the upper limit values of the buffer are held to a constant level.

On the other hand, FIG. 9 shows an instance where clock synchronization is out of order (the slave side clock is delayed relative to the master side clock).

In this instance, the upper limit values of the buffer are not held to a constant level. For example, assume that the transmission side clock is 1 Mbps and the reception side clock is 0.9 Mbps. Then, there is a discrepancy of 0.1 Mbps between the two clocks so that the accumulated amount of the buffer increases by 0.1 Mbit in every 1 second so that the buffer upper limits are not held to a constant level.

From the above, it is possible to find out if clock synchronization is being realized accurately or not by monitoring the upper limit values of the buffer and detecting the fluctuations of the upper limit values.

Once the clock synchronization accuracy is determined, it is not difficult to control the threshold value to an optimum value.

Figure 10:
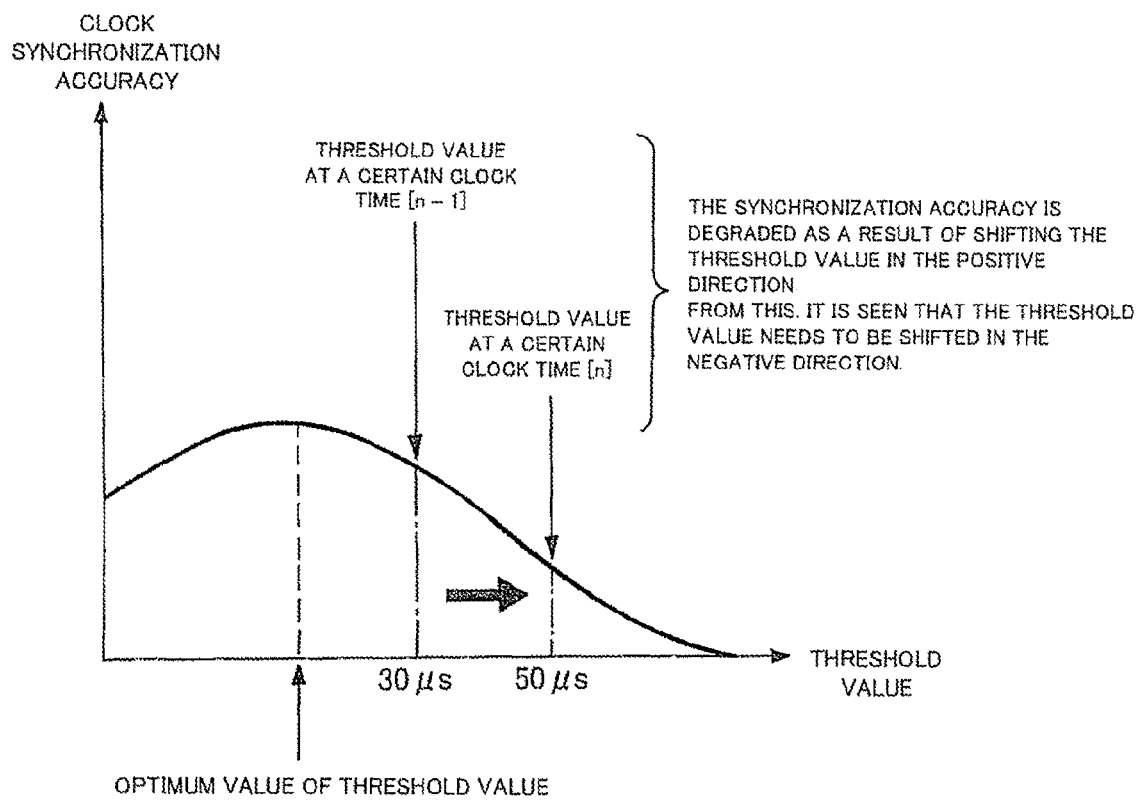
FIG. 10 An illustration of the control algorithm of threshold values of the first exemplary embodiment of the present invention.

The threshold value control algorithm will be summarily described below by referring to FIG. 10.

As an example, assume here that the threshold value at certain clock time [n−1] is 30 μs and the clock synchronization accuracy at that time is determined by the above-described method.

Then, the threshold value is raised to 50 μs at clock time [n] and the clock synchronization accuracy at that time is also determined in a similar manner.

Then, it is possible to determine of the threshold value should be raised or not by comparing the two clock synchronization accuracies.

If the clock synchronization accuracy at clock time [n] is better, a process of raising the threshold value further from 50 is will be executed.

If, on the other hand, the clock synchronization accuracy at clock time [n] is worse, a process of lowering the threshold value further from 30 μm will be executed. The threshold values can be converged to an optimum value by repeating the above-described process.

<Operation>

Figure 11:
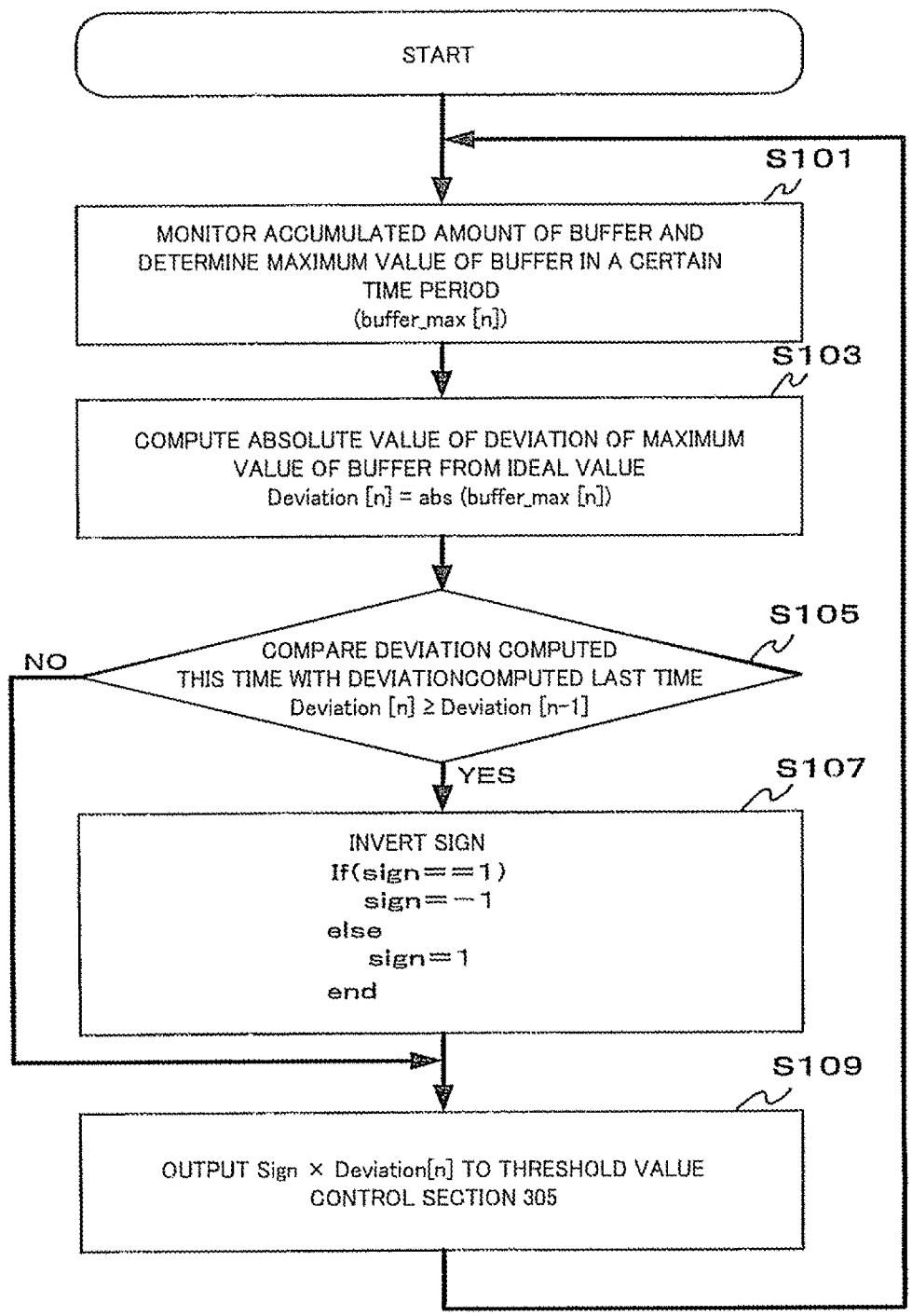
FIG. 11 An illustration of the sequence for converging threshold values to an optimum value in the first exemplary embodiment of the invention.

The accuracy monitoring section 304 operates in the sequence shown in FIG. 11 in order to execute the following process.

1: It monitors the accumulated amount of the buffer 303 and determines the maximum value of the buffer in a time period (Step S101).

(buffer_max)[*n*])

2: It computes the absolute value of the deviation of the maximum value of the buffer from an ideal value (Step S103).

Deviation [*n*]=abs(buffer_max[*n*]−ideal)

The ideal value may be the average value of the maximum values in the past, the last maximum value or a predetermined fixed value. The deviation computed in this step is a numerical value that shows the inferiority of the current clock synchronization accuracy.

3. It compares Deviation [n] computed in Step S103 and Deviation [n−1] computed last time and sees which is larger (Step S105).

In other words, it compares the present clock synchronization accuracy and the past clock synchronization accuracy.

4: If the past synchronization accuracy shows a better value, it reverses the direction of shifting the filter threshold value (Step S107). This operation is executed by reversing the sign value. The sign here is the value for determining the direction of shifting the threshold value.

5: Finally, it outputs sign×Deviation [n] to the threshold value control section (Step S109). As a result, the filter threshold value can be shifted by the amount of the deviation.

Note that the absolute value of the deviation (Deviation [n]) shows a amount that is closely related to the clock synchronization accuracy as pointed out so that accurate clock synchronization is realized when Deviation [n] becomes equal to nil Then, the threshold value control section 305 controls the threshold value of the packet filter 301 so as to make the Deviation [n] equal to nil and hence the clock synchronization accuracy best.

The threshold value control section 305 may be a system formed by an PI controller in order to converge the threshold values to an optimum value. In such a case, the output data from the accuracy monitoring section 304 is input to the threshold value control section 305 that is a PI controller. Then, a control signal is generated for threshold values in order to converge Deviations [n] ultimately to nil. Then, the threshold value control section 305 controls the threshold value of the packet filter according to the control signal.

As described above, it is possible to determine an optimum value that maximizes the clock synchronization accuracy as threshold value by monitoring the current synchronization accuracy according to the accumulated amount of the buffer and adjusting the threshold value of the packet filter according to the result of monitoring.

Since the operation of the PLL 302 of the slave node 30 is completely the same as that of a slave node of the known TS system described above as related technique, it will not be described here.

However, when the threshold value of the packet filter 305 is made small, the number of effective packets is reduced to prolong the time required for clock synchronization. In an aspect, as the time required for clock synchronization is prolonged, the clock synchronization system becomes liable to be influenced by temperature drift as described above and hence its operation is likely to become unstable.

To avoid this problem, it is desirable for the threshold value control section 305 to control not only the threshold value of the packet filter but also the time constant of the PLL. More specifically, it is desirable to perform a control operation such that a high value is selected for the cutoff frequency of the LPF when the threshold value is made small, whereas a low value is selected for the cutoff frequency of the LPF.

Figure 12:
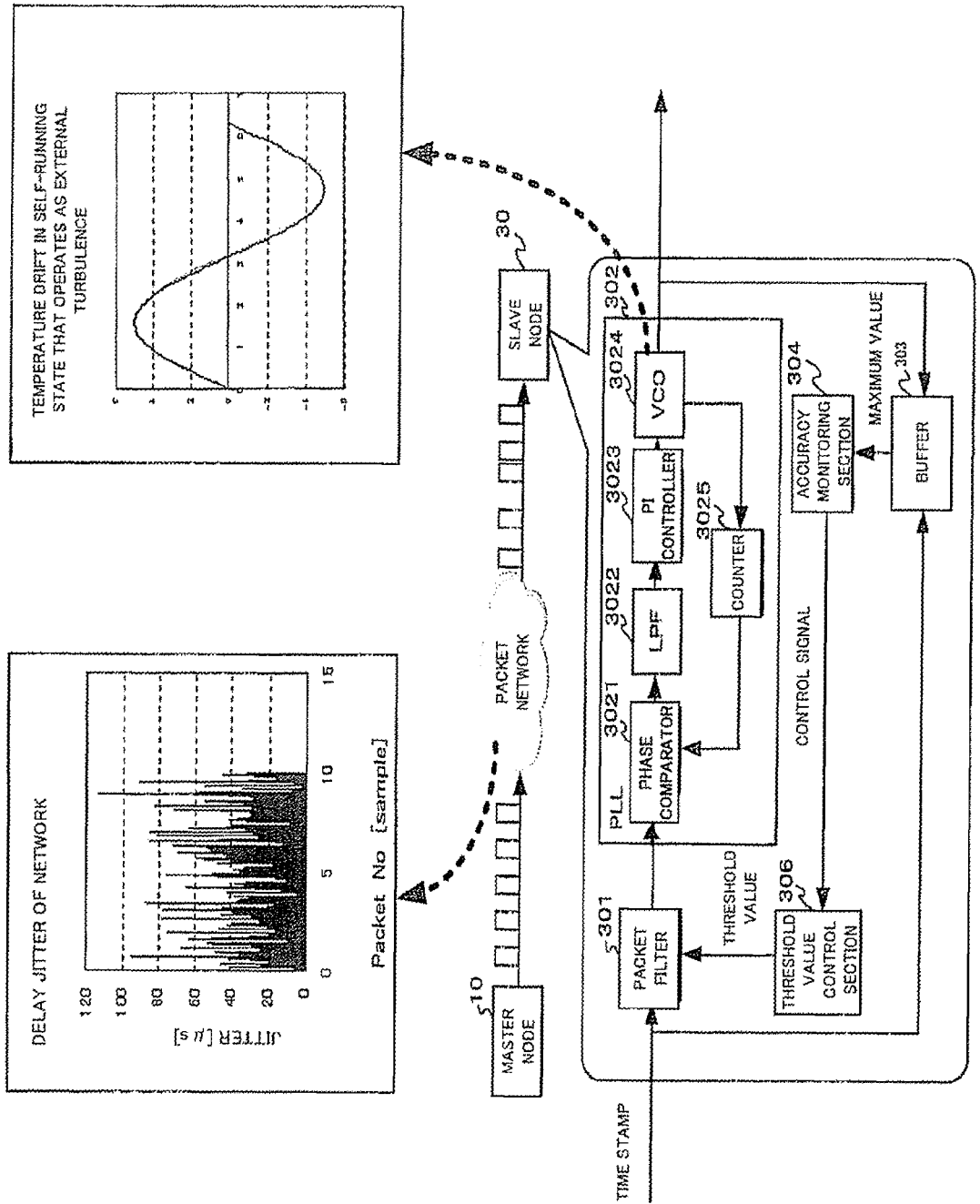
FIG. 12 An illustration of the simulation model used to show the effectiveness of the first exemplary embodiment of the present invention.

FIG. 12 is an illustration of the simulation model used to show the effectiveness of the first exemplary embodiment.

A normal distribution of average 0 and variance 5 μs is employed for delay jitter of the packet network. Drift on a sine wave is employed as drift in a self-running state.

Figure 13:
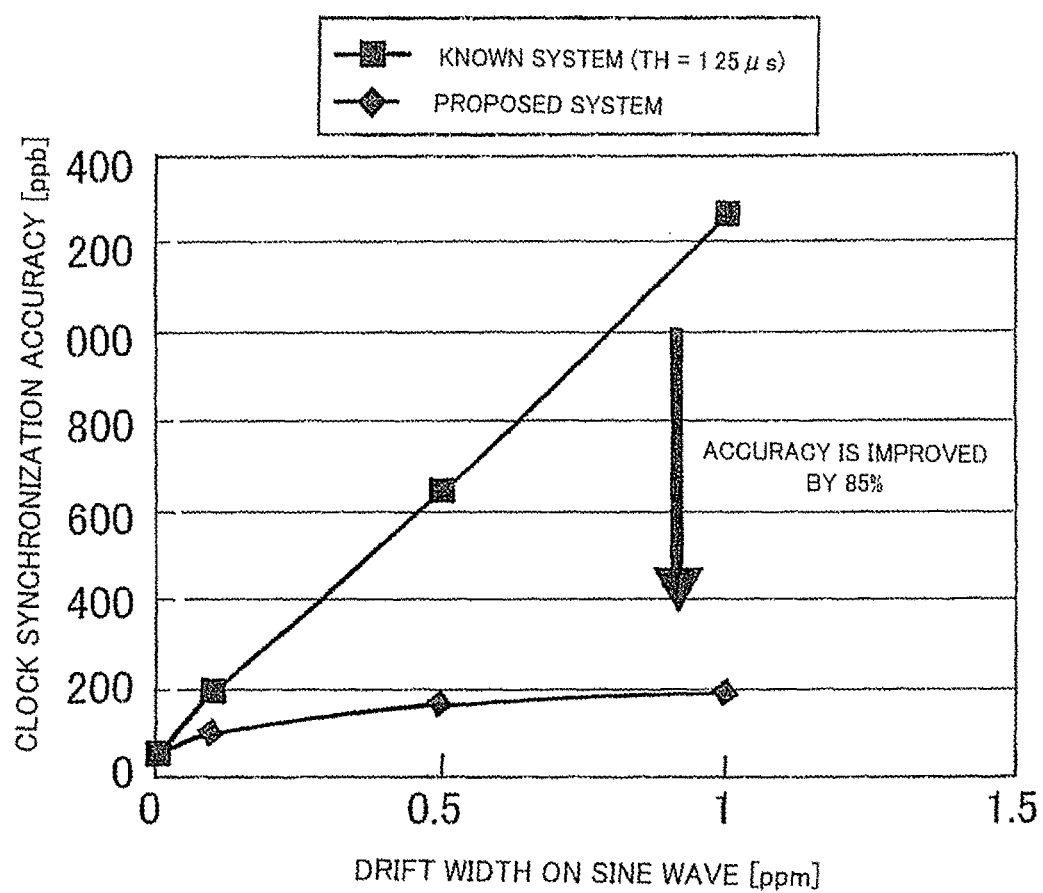
FIG. 13 An illustration of the clock synchronization accuracy of the first exemplary embodiment of the present invention as compared with that of a conventional system.

FIG. 13 is an illustration of the clock synchronization accuracy of the first exemplary embodiment as compared with that of a conventional system. In FIG. 13, the X-axis indicates the amplitude of drift on a sine wave and Y-axis indicates the clock synchronization accuracy.

As seen from FIG. 13, the clock synchronization accuracy of the first embodiment can be improved by 85% if compared with the conventional system.

Thus, it has been proven that this exemplary embodiment can suppress the influence of delay fluctuations of the network and that of clock drift in a self-running state to realize accurate clock synchronization.

<Advantageous Effects>

Now, the advantages of the first exemplary embodiment for carrying out the present invention will be described below.

The first exemplary embodiment for carrying out the present invention can achieve the object of the present invention because it can suppress delay fluctuations and clock drift to realize accurate clock synchronization by monitoring the current clock synchronization accuracy from the changes in the accumulated amount of the buffer and adjusting the threshold value of the packet filter so as to improve the clock synchronization accuracy.

Second Exemplary Embodiment

Figure 15:
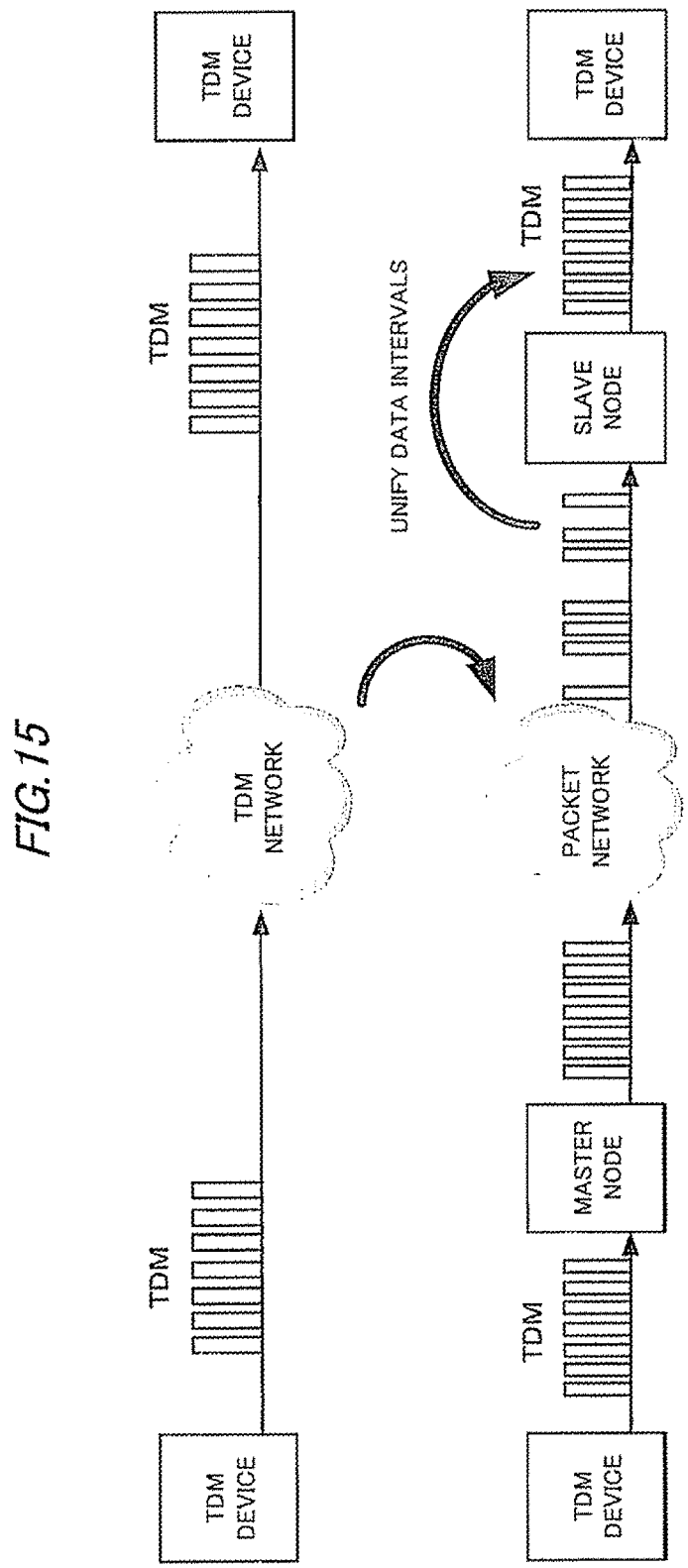
FIG. 15 An illustration of an arrangement for Pseudo-Wire Emulation Edge to Edge.

The second exemplary embodiment of the present invention can suppress delay fluctuations and clock drift to reproduce an accurate clock at the side of the slave node in a network configuration for encapsulating TDM data by means of a packet network and transferring them. The network configuration is an configuration of PWE3 (Pseudo-Wire Emulation Edge to Edge) for which standardization is in progress in RFC4197 and RFC4553. FIG. 15 is a schematic illustration of PWE3.

With PWE3, a master node and a slave node are arranged between a TDM network for communication between TDM devices as shown in the upper part of FIG. 15. Communications between the master node and the slave node are carried out by means of a packet network.

Now, the second exemplary embodiment of the present invention will be described in detail by referring to the drawings.

<Configuration>

Figure 14:
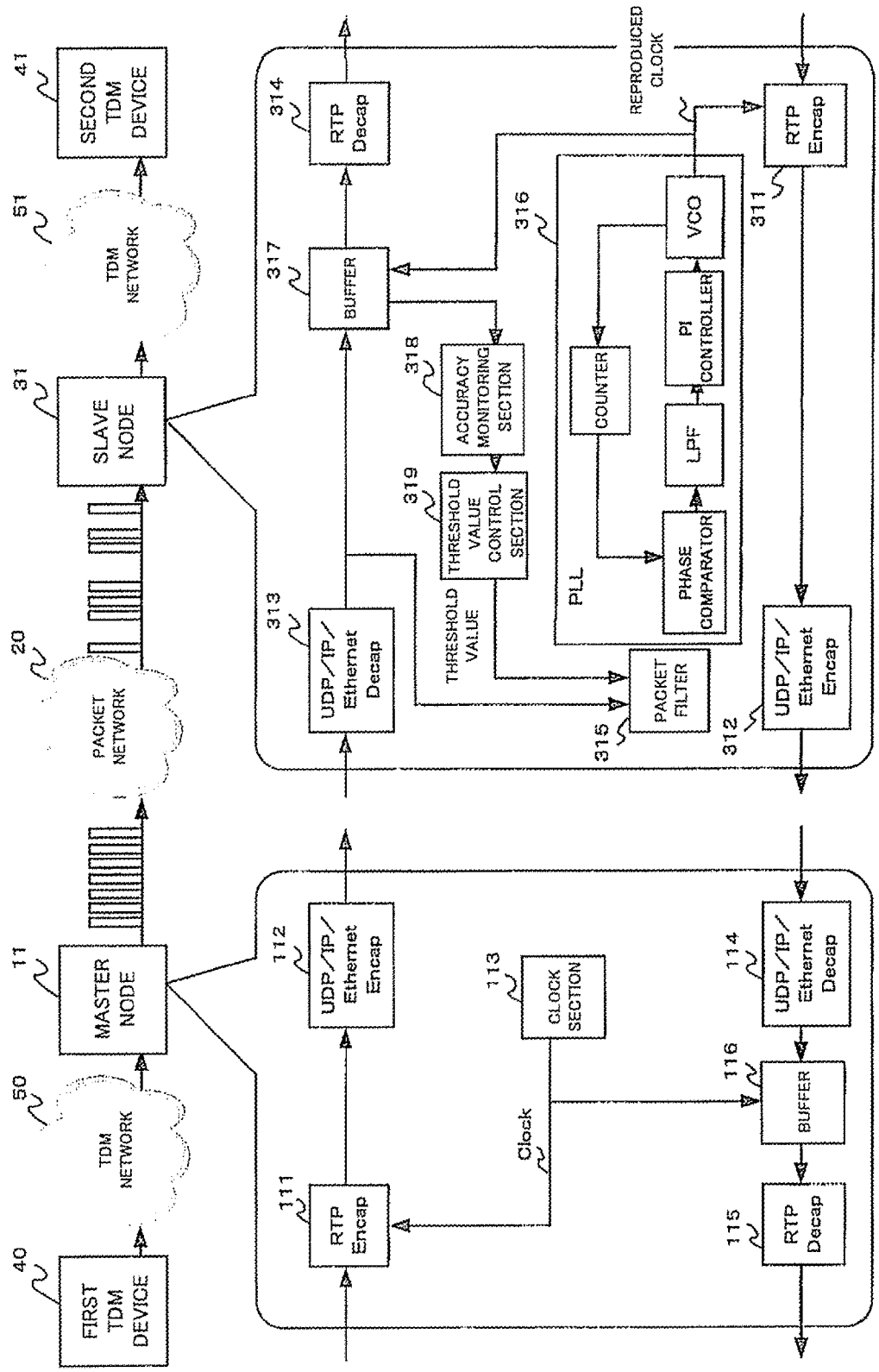
FIG. 14 An illustration of the configuration of a second exemplary embodiment of the present invention.

Referring to FIG. 14, the second exemplary embodiment of the present invention includes a master node 11, a slave node 31, a first TDM device 40, a second TDM device 41, a packet network 20, a TDM network 50 and a TDM network 51.

The first TDM device 40 and the second TDM device 41 transmit and receive TDM frames by way of the TDM network.

Upon receiving a TDM frame from the TDM network, the master node 11 and the slave node 31 encapsulate it by a packet header and transmits it to the packet network 20.

Additionally, upon receiving a packet from the packet network 20, the master node 11 and the slave node 31 decapsulate it by a packet header and transmit it to the TDM network.

In short, the network configuration is such that the first TDM device 40 and the second TDM device 41 are terminal devices and no network exists between them but the packet network operates for relays and transfers.

<Master Node>

Referring to FIG. 14, the master node 11 includes an RTP Encap 111, a UDP/IP/Ethernet Encap 112, a clock section 113, a UDP/IP/Ethernet Decap 114, an RTP Decap 115 and a buffer 116.

Upon receiving a TDM frame from the first TDM device 40, the master node 11 firstly attaches an RTP header at the RTP Encap 111.

The RTP header includes a TS and the value of the TS is controlled by the clock section 113.

Then, it attaches an UDP/IP/Ethernet header to the packet at the UDP/IP/Ethernet Encap 112 and subsequently sends it out to the packet network 20.

Additionally, upon receiving a packet from the packet network 20, the master node 11 firstly removes the UDP/IP/Ethernet header at the UDP/IP/Ethernet Decap 114.

Then, it stores the packet from which the header is removed in the buffer 116 and absorbs the delay jitter of the network, while it also corrects the order of packets. Then, the packet is delivered to the RTP Decap 115 at a timing that is controlled by the clock section 113.

Lastly, it removes the RTP header of the packet at the RTP Decap 115 and subsequently sends it out to the TDM network 50.

<Slave Node>

Referring to FIG. 14, the slave node 31 includes an RTP Encap 311, a UDP/IP/Ethernet Encap 312, a UDP/IP/Ethernet Decap 313, an RTP Decap 314, a packet filter 315, a PLL 316, a buffer 317, an accuracy monitoring section 318 and a threshold value control section 319.

Upon receiving a packet from the packet network 20, the slave node 30 firstly removes the UDP/IP/Ethernet header at the UDP/IP/Ethernet Decap 313.

Then, it stores the packet in the buffer 317 and absorbs the delay jitter of the network, while it corrects the order of packets. Then, the packet is delivered to the RTP Decap 314 at a timing that is controlled by the clock reproduced by the PLL 316.

Lastly, it removes the RTP header of the packet at the RTP Decap 314 and subsequently sends it out to the TDM network 51.

Since the PLL 316, the buffer 317, the accuracy monitoring section 318 and the threshold value control section 319 of the slave node 31 are the same as those of the first exemplary embodiment in terms of configuration and operation, they will no be described here any further.

Upon receiving a TDM frame from the second TDM device 41, the slave node 31 firstly attaches an RTP header at the RTP Encap 311. The RTP header includes a TS and its value is controlled by the clock reproduced by the PLL 316. Then, it attaches a UDP/IP/Ethernet header to the packet at the UDP/IP/Ethernet Encap 312 and subsequently sends it out to the packet network.

<Operation>

Now, the operation of the second exemplary embodiment of the present invention will be described below. The second exemplary embodiment of the present invention provides a method of reproducing an accurate clock by suppressing delay fluctuations and clock drift from the TS of an RTP header by means of the technique of PWE3 for encapsulating TDM data and transferring them by way of a packet network.

This can be achieved by applying a synchronization system of the first exemplary embodiment having a configuration as described above and shown in FIG. 12. The operation of the clock synchronization system is the same as that of the first exemplary embodiment and hence will not be described here any further.

<Advantageous Effects>

Now, the advantages of the second exemplary embodiment for carrying out the present invention will be described below.

The second exemplary embodiment for carrying out the present invention can achieve the object of the present invention because it can suppress delay fluctuations and clock drift to realize accurate clock synchronization by computing the current clock synchronization accuracy from the changes in the accumulated amount of the buffer by means of PWE3 for encapsulating TDM data and transferring them by way of a packet network and adjusting the threshold value of the packet filter so as to improve the clock synchronization accuracy.

Third Exemplary Embodiment

The third exemplary embodiment of the present invention will be described in detail by referring to the drawings.

<Configuration>

Figure 16:
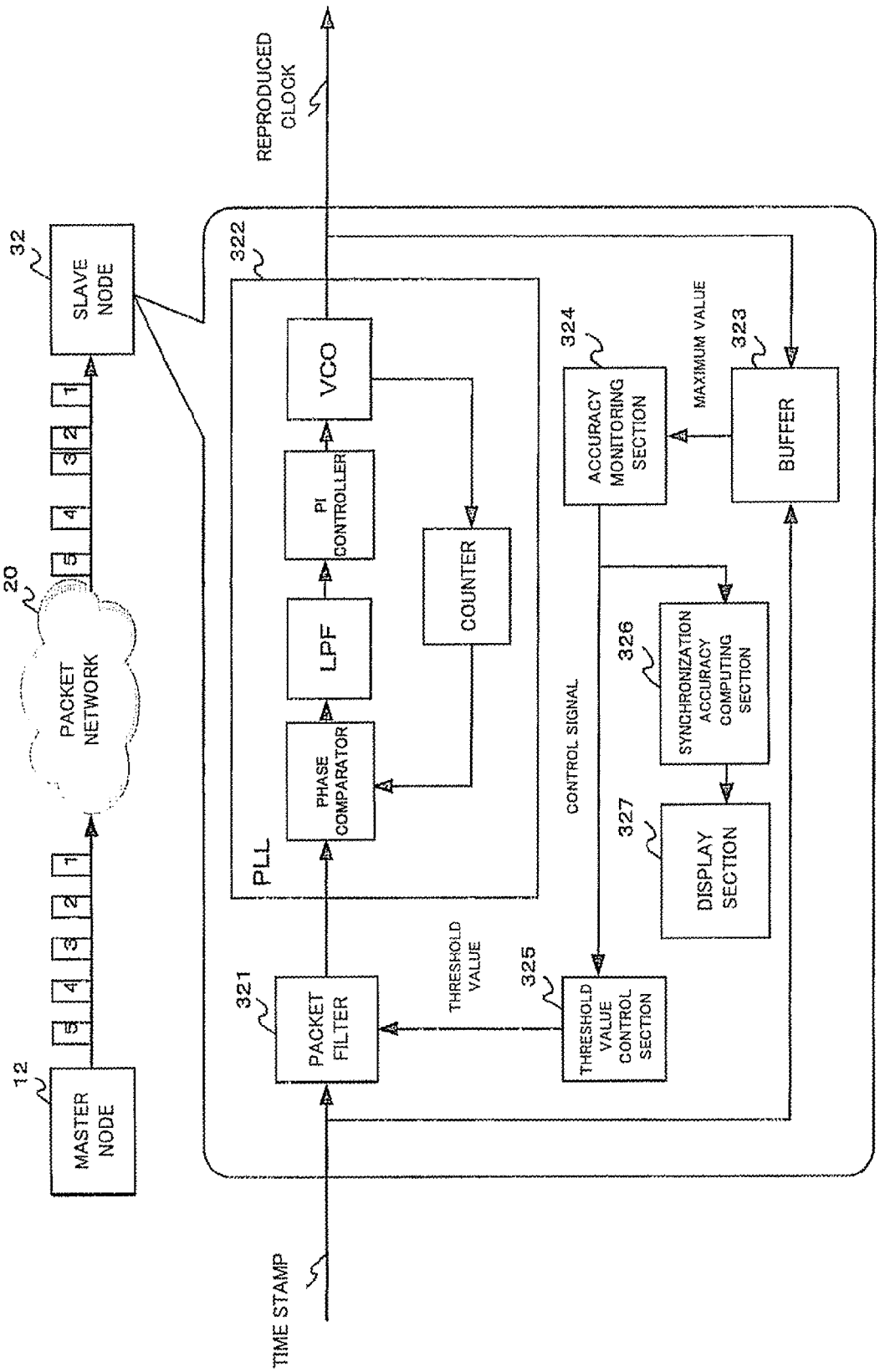
FIG. 16 An illustration of the configuration of a third exemplary embodiment of the present invention.

Referring to FIG. 16, the third exemplary embodiment of the present invention includes a master node 12 and a slave node 32 and a packet network 20.

<Master Node>

Since the configuration of the master node is totally the same as that of the first exemplary embodiment and hence will not be described here any further.

<Slave Node>

Referring to FIG. 16, the slave node 32 includes a synchronization accuracy computing section 326 and a display section 327 in addition to the configuration of the slave node 10 of the first exemplary embodiment.

The synchronization accuracy computing section 326 receives a control signal from the accuracy monitoring section 324 and computes current accuracy information. It also delivers the computed synchronization accuracy information to the display section 327.

The display section 327 is a part that displays the synchronization accuracy information delivered from the synchronization accuracy computing section 326 to the outside.

Since the configuration of the remaining part is totally the same as that of the first exemplary embodiment and hence will not be described here any further.

<Operation>

Now, the operation of the third exemplary embodiment will be described below in detail.

The third exemplary embodiment of the present invention provides a method of notifying the user of the current clock synchronization accuracy.

Since the operation of this exemplary embodiment is the same as that of the first exemplary embodiment except that of the synchronization accuracy computing section 326 and the display section 327, it will not be described here any further. Referring to FIG. 16, the synchronization accuracy computing section receives a control signal from the accuracy monitoring section.

The control signal is sign×Deviation [n] as described above for the first exemplary embodiment by referring to FIG. 11. The synchronization accuracy computing section computes the synchronization accuracy on the basis of the value of the deviation.

As an example of computing method, if
the deviation amount of the maximum value of the accumulated amount of the buffer=Deviation [n] [bits],
the time width for the accuracy monitoring section to observe the maximum value of the accumulated amount of the buffer=T [second],
the bit rate of TS packet=B [bit per second] and
a coefficient=C,
the synchronization accuracy computing section can compute the clock synchronization accuracy by means of the mathematical formula shown below.

[Numeral 1]

$$\text{Clock Synchronization Accuracy} = \frac{C \cdot \text{Deviation}(n)}{B \cdot T} \quad \text{(Formula 1)}$$

Alternatively, it can computes the synchronization accuracy by means of the mathematical formula shown below on the basis of the definition of FFO (fractional frequency offset) defined by the International Standard of Telcordia.

[Numeral 2]

$$\text{Clock Synchronization Accuracy} = \sum_{i=1}^{N}\left[\frac{C \cdot \text{Deviation}(i)}{B \cdot T} \cdot \left(\frac{2i}{N^2-1} - \frac{1}{N-1}\right)\right] \quad \text{(Formula 2)}$$

Figure 18:
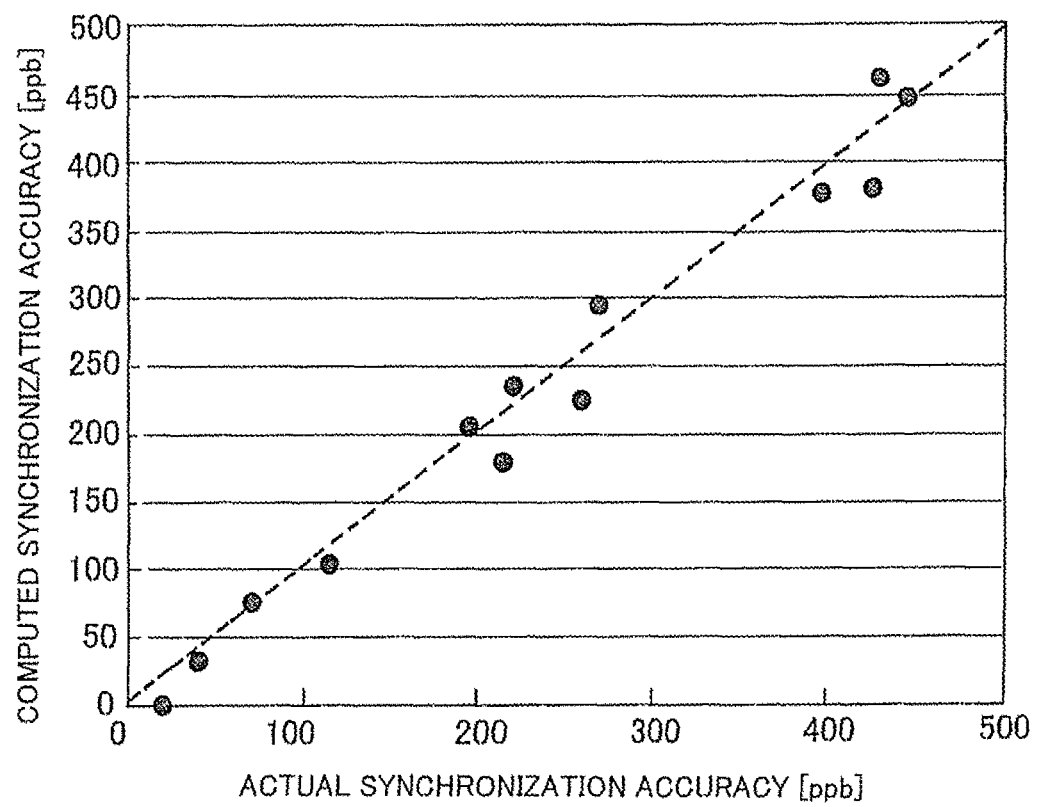
FIG. 18 An illustration of the relationship between the clock synchronization accuracy computed by this exemplary embodiment of the present invention and the actual synchronization accuracy.
Figure 19:
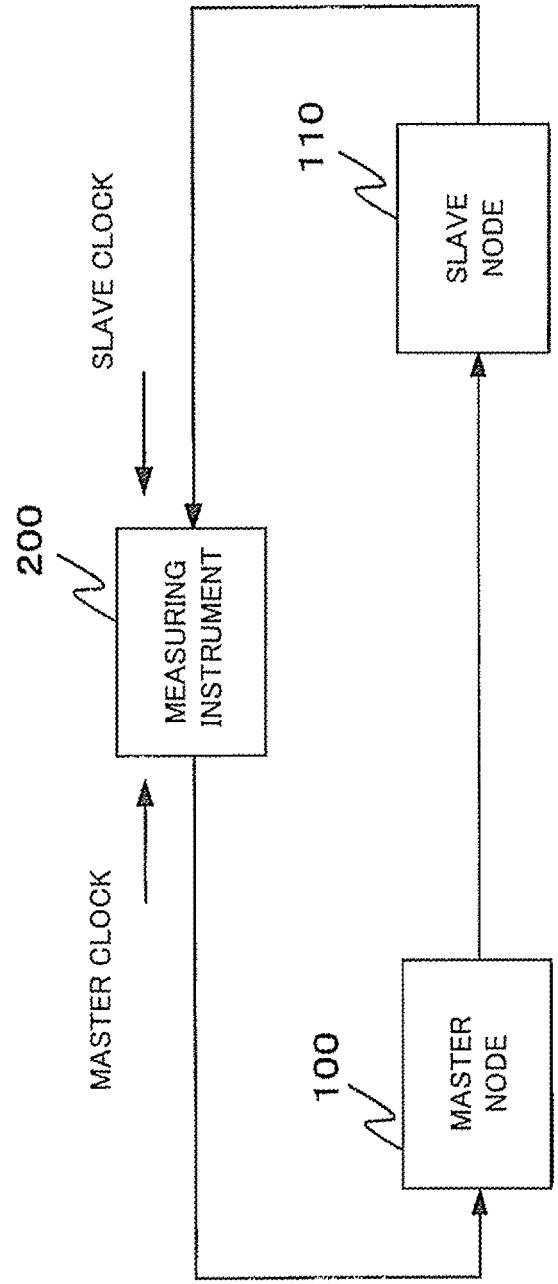
FIG. 19 An illustration of an exemplar configuration of a network for measuring the clock synchronization accuracy between a master node and a slave node.

FIG. 18 illustrates to what extent the clock synchronization accuracy (measured accuracy) computed in this way agrees with the actual clock synchronization accuracy (reference accuracy). From FIG. 18, it will be seen they agree with each other to a considerable extent. The synchronization accuracy computing section 326 delivers the clock synchronization accuracy computed in this way to the display section 327.

The display section can displays the delivered clock synchronization accuracy information on an external monitor and/or a lamp and notifies the user of it.

Figure 17:
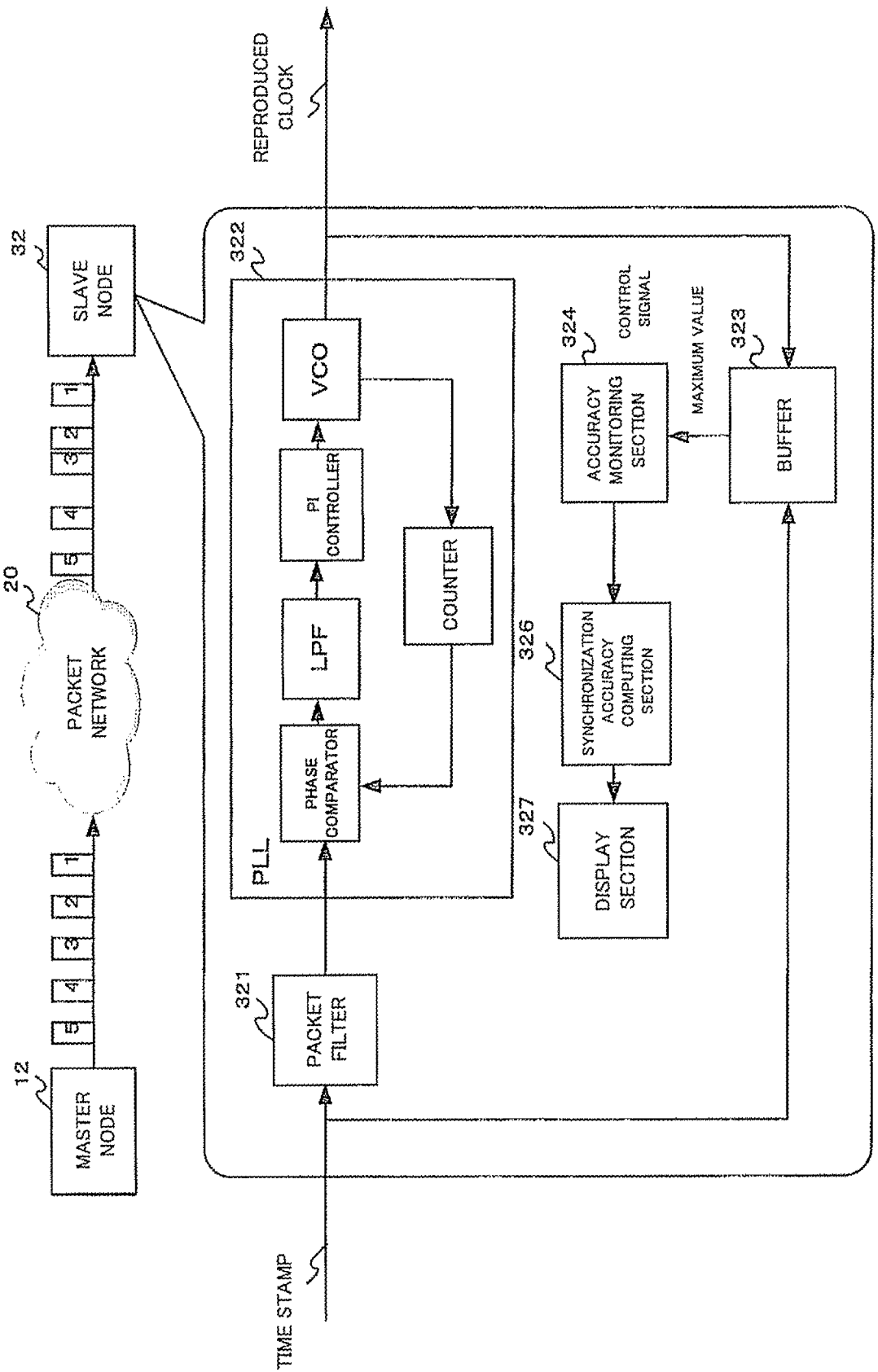
FIG. 17 An illustration of the configuration of a modified arrangement of the third exemplary embodiment of the present invention.

While a synchronization accuracy monitor 327 and a threshold value control section 326 having a threshold value control function are combined in the above description of a configuration example, the synchronization accuracy monitor 327 operates normally without the threshold value control section 326. FIG. 17 illustrates the configuration of such a case. The principle of operation of the synchronization accuracy monitor is the same as the above-described one and hence will not be described here any further.

<Advantageous Effects>

Now, the advantages of the third exemplary embodiment for carrying out the present invention will be described below.

The third exemplary embodiment for carrying out the present invention computes the current synchronization accuracy information on the basis of the data of the accuracy monitoring section and displays it on the synchronization accuracy monitor. As a result, it can achieve the object of the present invention because the user can grasp the current synchronization accuracy and at the same time it can suppress delay fluctuations and clock drift to realize accurate clock synchronization.

Now, the fourth exemplary embodiment for carrying out the present invention will be described in detail below by referring to the drawings.

<Explanation of Configuration>

Figure 20:
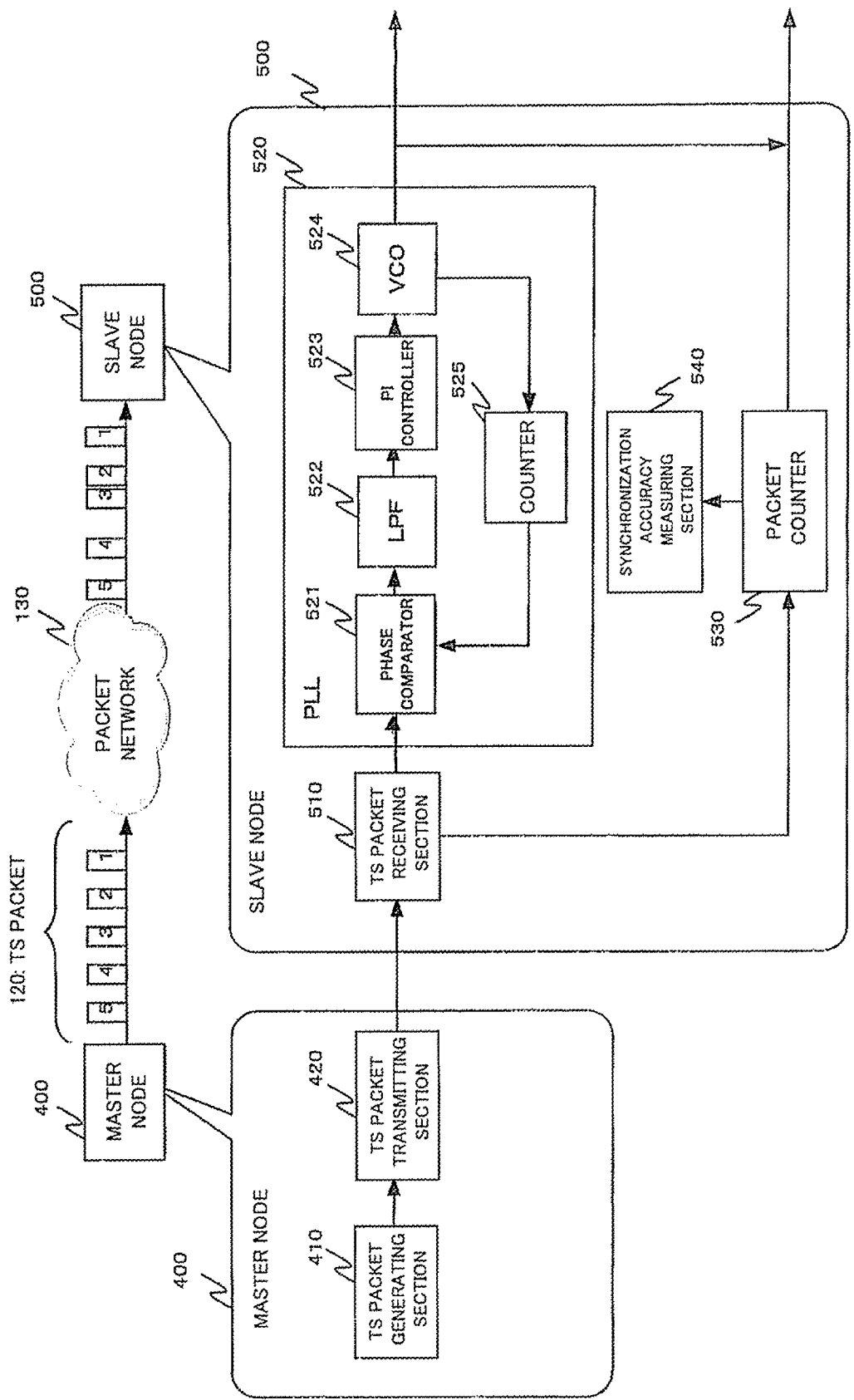
FIG. 20 An illustration of the configuration of a fourth exemplary embodiment of the present invention.

Referring to the upper part of FIG. 20, the fourth exemplary embodiment of the present invention includes a master node 400, a slave node 500 and a packet network 130. Additionally, the master node 400 and the slave node 500 include the sections listed below.

<Master Node>

The master node 400 includes a TS packet generating section 410 and a TS packet transmitting section 420.

The TS packet generating section 410 generates TS packets that store respective TSs for clock synchronization. A TS is a numerical value to be used for clock synchronization between the nodes. It is a numerical value showing the time information generated on the basis of the clock of the master node 400. For example, a numerical value obtained by incrementing the minimum time unit (e.g., 125 usec) of the clock of the master node 400 sequentially by 1 may be used for it.

The TS packet transmitting section 420 receives the TS packet generated by the TS packet generating section 410 and transmits the received TS packet to the slave node 510 on a periodical basis.

<Slave Node>

The slave node 510 includes a TS packet receiving section 510, a PLL 520, a packet counter 530 and a synchronization accuracy measuring section 540.

The TS packet receiving section 510 receives the TS packet transferred from the master node 400 by way of the packet network 130. A reception TS is added to the received TS packet, which received TS packet is then sent to the PLL 312 and the packet counter 530.

The PLL 520 includes a phase comparator 521, an LPF 522, a PI controller 523, a VCO 524 and a counter 525. The internal configuration or the packet counter 530 and that of the synchronization accuracy measuring section 540 will be described hereinafter.

The phase comparator 521 computes a difference signal of the reception TS stored in the TS packet received from the TS packet receiving section 510 and the TS generated by the counter 525 (to be referred to as "counter TS" hereinafter) and outputs it to the LPF 522.

The LPF 522 smoothes the difference signal and suppresses jitter and noise. Then, it outputs the obtained result to the PI controller 523.

The PI controller 523 generates a control signal that ultimately reduces the smoothed difference signal to nil and outputs it the VCO 524.

The VCO 524 generates a clock of the frequency that is determined by the control signal input from the PI controller 523 and outputs it to the counter 525.

The counter 525 generates a counter TS on the basis of the clock input from the VCO 524 and transfers it to the phase comparator 521.

The packet counter 530 increments the counter reading value by a predetermined increment each time it receives a TS packet from the TS packet receiving section 510. At the same time, it decrements the counter reading value according to the frequency determined by the VCO 524. The packet counter 530 may alternatively be a packet buffer. In the case of a packet buffer, as it receives a TS packet from the TS packet receiving section 510, it accumulates the packet in the buffer and at the same time outputs the accumulated packet according to the frequency determined by the VCO 524.

The synchronization accuracy measuring section 540 monitors the counter reading value of the packet counter 530 and measures the maximum value of the counter reading value in a certain time period (time interval). Then, it measures the clock synchronization accuracy on the basis of the maximum value.

<Explanation of Operation>
<Explanation of Synchronization Accuracy Computation Method>

Before describing the operation of this exemplary embodiment, the synchronization accuracy computation method of this exemplary embodiment will be explained below.

As described above in the part of configuration, each section of the PLL 312 acts to synchronize the clock of the master node 400 and that of the slave node 510 on the basis of the difference of the TS value stored in the TS packet received from the master node 400 and the TS value produced from the clock of the slave node 510 itself. The synchronization accuracy measuring section 540 measures the current synchronization accuracy during the clock synchronization control. Now, the synchronization accuracy measuring method of the synchronization accuracy measuring section 540 will be described below.

The synchronization accuracy measuring method of this exemplary embodiment employs the following principle on the relationship between the state of clock synchronization and the counter reading value.

Figure 21:
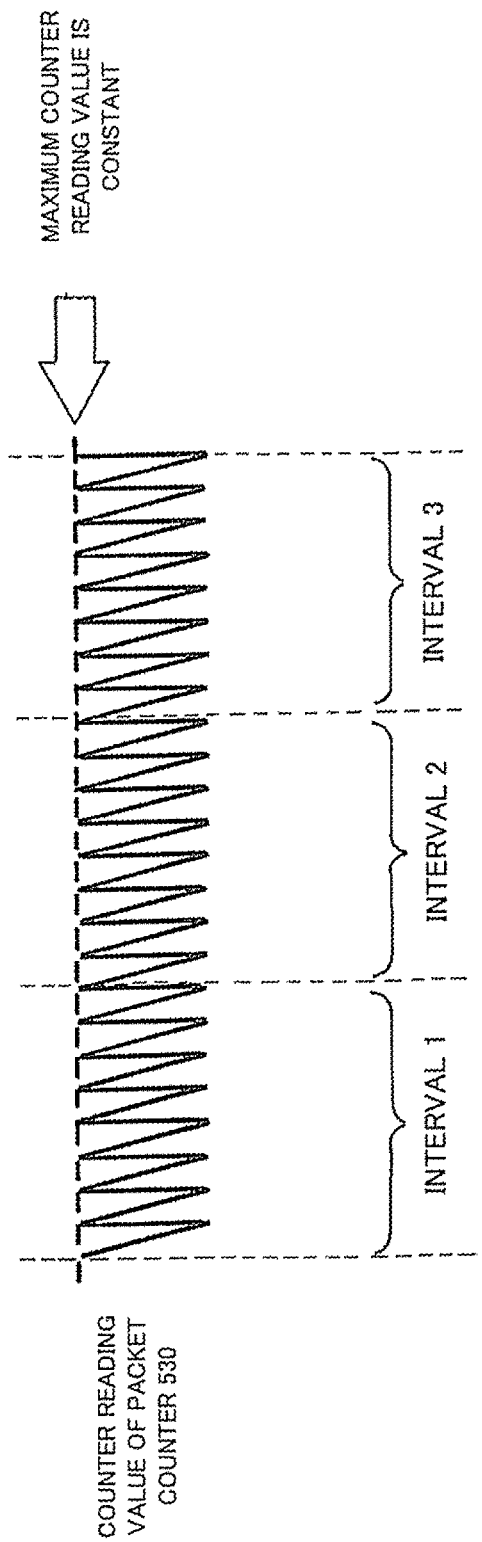
FIG. 21 An illustration of the reading of the packet counter 313 of the fourth exemplary embodiment when the clock of a slave node is synchronized with the clock of a master node and no jitter exists in the packet network.

FIG. 21 is an illustration of the counter reading value of the packet counter 530 when the slave side clock is accurately synchronized with the master side clock and constantly no jitter exists in the network. The elapsed time is shown in the direction of the horizontal axis and the counter reading value is shown in the direction of the vertical axis.

Figure 22:
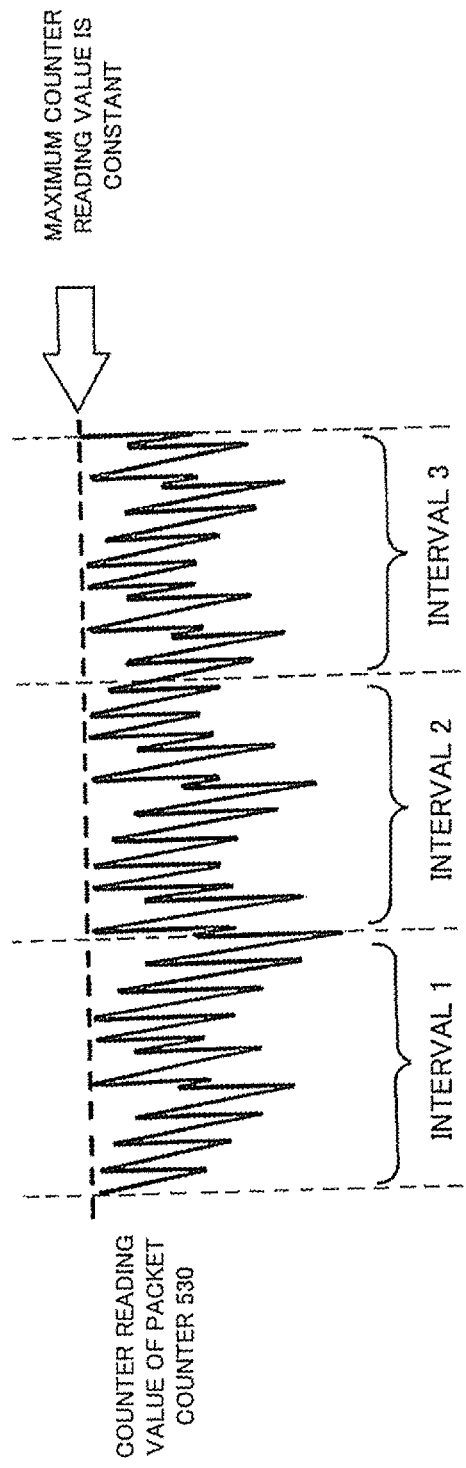
FIG. 22 An illustration of the reading of the packet counter 313 of the fourth exemplary embodiment when the clock of a slave node is synchronized with the clock of a master node and jitter exists in the packet network.

FIG. 22 is an illustration of the counter reading value when the clocks are accurately synchronized between the master and the slave and jitter exists in the network. As in FIG. 21, the elapsed time is shown in the direction of the horizontal axis and the counter reading value is shown the direction of the vertical axis.

Figure 23:
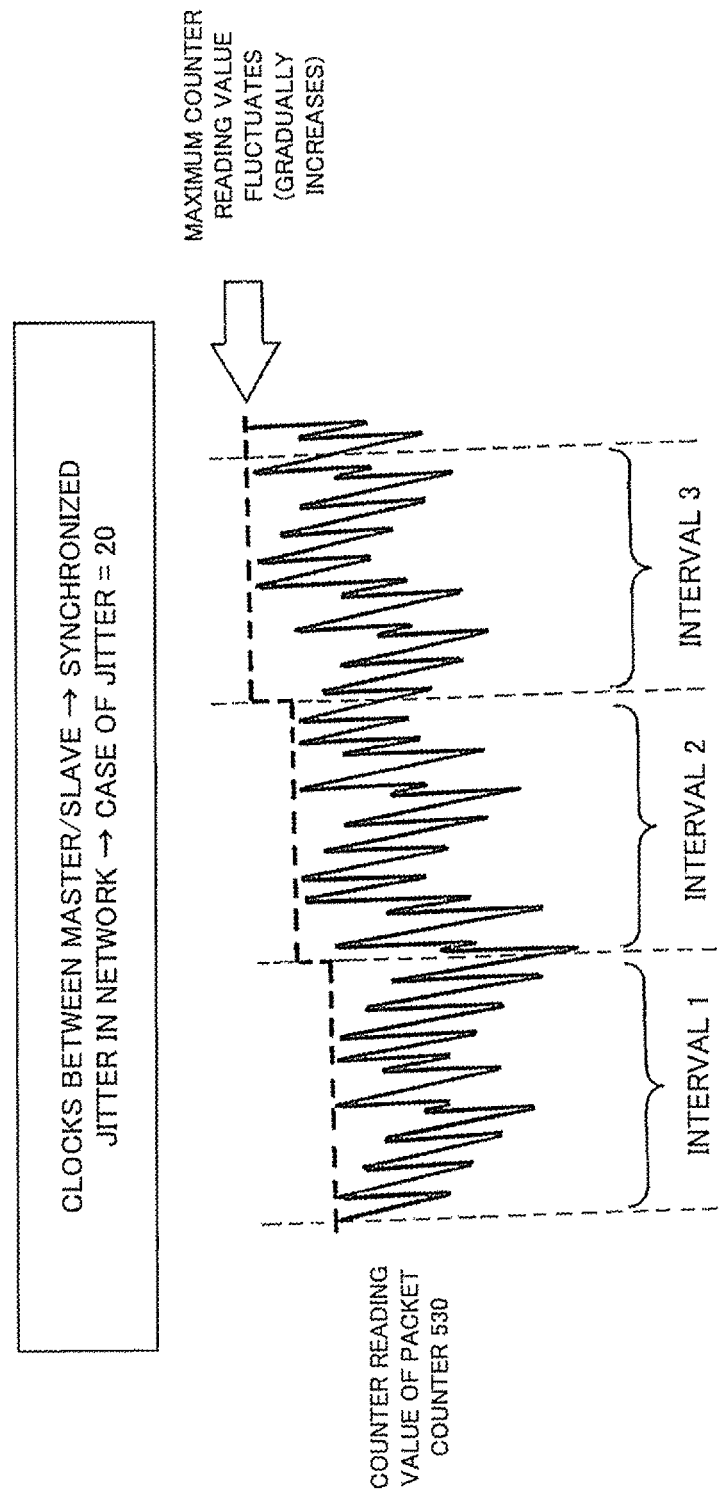
FIG. 23 An illustration of the reading of the packet counter 313 of the fourth exemplary embodiment when the clock of a slave node is not synchronized with the clock of a master node and jitter exists in the packet network.

Additionally, FIG. 23 is an illustration of the counter reading value when the clocks are not synchronized between the master and the slave and jitter exists in the packet network. As in FIG. 21, the elapsed time is shown in the direction of the horizontal axis and the counter reading value is shown the direction of the vertical axis. Note that FIG. 23 shows a case where the slave side clock is delayed as an example where the clocks are not synchronized between the master and the slave.

Now, the above drawings will be described in detail below.

When the clocks are synchronized between the master and the slave and no jitter exists in the network as shown in FIG. 21, the maximum values of counter reading value are held to a constant value.

As a TS packet arrives at the packet counter 530, the counter reading value is incremented by a predetermined value. On the other hand, the counter reading value is decremented according to the speed of the VCO 524. In this instance, the decrementing rate of the VCO 524 is such that the counter reading value of a packet is decreased at a packet arriving interval. Since the master clock and the slave clock are synchronized, the counter reading value is repeatedly incremented and decremented at regular time intervals that are packet arriving intervals and the maximum values observed when the counter reading value is incremented are held to a constant level.

FIG. 22 shows a case where the clocks are synchronized between the master and the slave and jitter exists in the network. As a packet arrival is delayed due to the jitter, the amount of decrement of the counter reading value is raised according to the delay to make the lower limit value of the counter reading value fall. Thus, the counter reading value at the time of a packet arrival may be lower than other counter reading values. However, the counter reading value gets to a proper level when a packet that is not subjected to jitter arrives. Assume that a packet that is not subjected to jitter arrives in a certain time interval (e.g., 10 seconds), the maximum value of the counter reading value will be held to a constant value. Summarily, if jitter exists in the network and the maximum values of counter reading are monitored at certain time intervals (time period during which at least a packet that is not subjected to jitter will reliably arrive), they will be held to a constant level when the master and the slave are synchronized.

Now, FIG. 23 shows a case where the clocks are not synchronized between the master and the slave (case where the slave side clock is delayed relative to the master side clock). As in the instance of FIG. 22, the counter reading value at the time of packet arrival does not get to the maximum value at certain points when the packet arrival is delayed under the influence of jitter. However, the counter reading value at the time of packet arrival gets to the maximum value when a packet that is not subjected to jitter arrives. The difference from FIG. 22 is that the maximum values of counter reading fluctuate from time interval to time interval. The slave side clock is delayed relative to the master side clock in the illustrated instance. In other words, the counter reading value lingers because the decrementing rate of the packet counter is lower than the incrementing rate thereof. Thus, the maximum values of counter reading fluctuate from time interval to time interval (increase in this instance).

As seen from the above three cases, the clocks are synchronized or not between the master and the slave can be found by monitoring the maximum values of counter reading and seeing the fluctuations of the maximum values from time interval to time interval. In other words, they are synchronized when the maximum values of counter reading are held to a constant level, whereas they are not synchronized when the maximum values fluctuate. Then, when the maximum values fluctuate, the synchronization accuracy at a clock time can be computed on the basis of the deviation amount. Methods of computing the synchronization accuracy on the basis of the deviation amount will be described below.

For the purpose of the present invention, two methods of computing the synchronization accuracy on the basis of the deviation amount of a maximum value of counter reading will be shown below as examples.

<First Computation Method>

The clock synchronization accuracy is generally considered to be "the ratio of the number of deviated clocks relative to the total number of clocks". For example, if there arises a deviation of 1 clock during a time interval of 10^9 clocks, the clock synchronization accuracy will be 1/10^9=10^-9=1 ppb.

This will be applied to the above-described deviation amount of a maximum value of counter reading to establish an idea of "the ratio of the amount of deviated data relative to the total amount of processed data" in a certain time interval. When the deviation amount of the maximum value of counter reading=Deviation [bit],
the interval=T [sec] and
the bit rate of TS packet=B [bit], the clock synchronization accuracy (FFO) is determined by means of the formula shown below.

[Numeral 3]

$$\text{Clock Synchronization Accuracy} = \frac{\text{Deviation}}{B \cdot T} \quad \text{(Formula 3)}$$

<Second Computation Method>

This second computation method is a method of computing the clock synchronization accuracy on the basis of the formula defined by Telcordia GR1244. GR1244 employs the following parameters for the clock synchronization accuracy FFO.

x[i]: Time Interval Error (TIE) (unit: nano second)
Interval: (unit: second)
N: the number of interval samples for determining FFO (number of intervals).

Then, GR1244 defines the clock synchronization accuracy (FFO) by means of the formula shown below.

[Numeral 4]

$$\text{Clock Synchronization Accuracy} = \frac{6 \times 10^{-9}}{N \cdot B \cdot T} \sum_{i=1}^{N} \text{Deviation}\,[i] \cdot \left(\frac{2i}{N^2 - 1} - \frac{1}{N - 1}\right) \quad \text{(Formula 4)}$$

Figure 24:
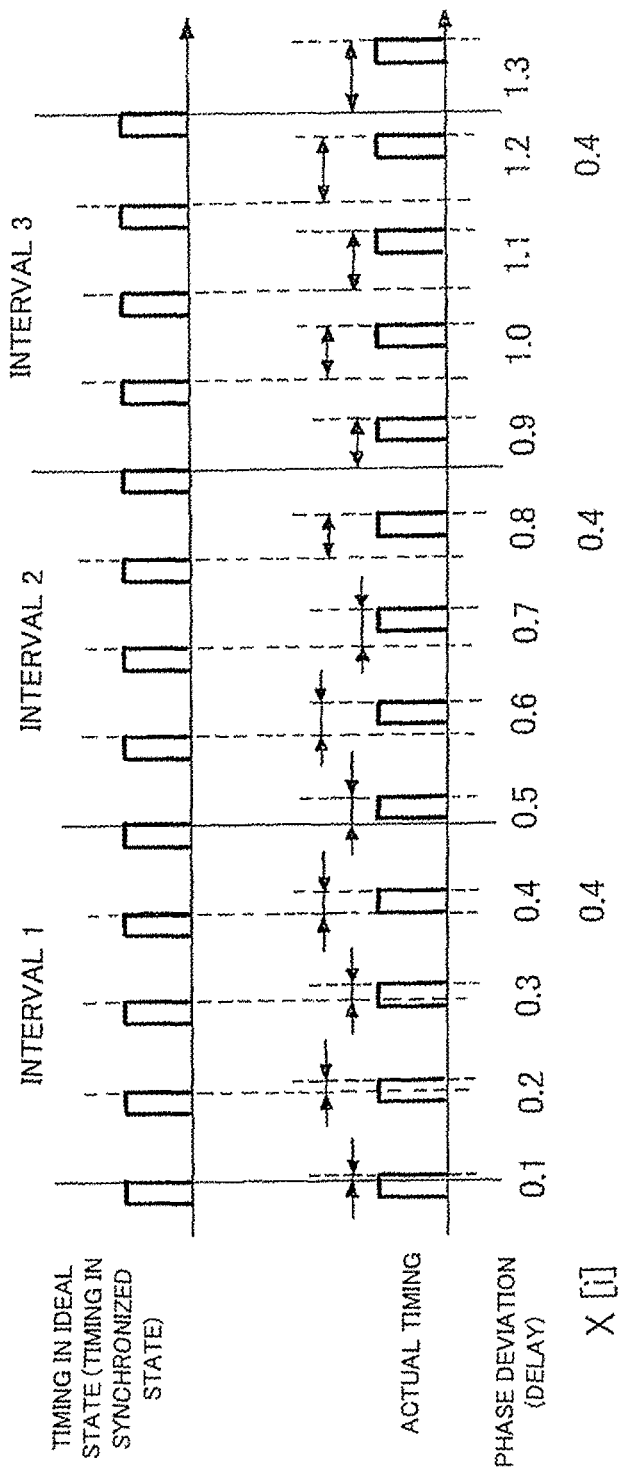
FIG. 24 An illustration of time interval error.

With this formula, the clock synchronization accuracy FFO is computed from the value of TIE in N intervals. TIE as used herein is the value of the phase deviation of each packet that arrives in the intervals as shown in FIG. 24. FIG. 24 shows the timings of pulling out packets in an ideal state of traffic at the slave side (a state of being synchronized with the master) (upper part) and the timings of actually pulling out packets (lower part). In this instance, the timings of actually pulling out packets are delayed from the ideal state by a magnitude of 0.1 per packet. How much deviation of timings arises in an interval is expressed by x[i]=TIE. In the instance of FIG. 24, it is 0.4 in each interval.

Since the slave node cannot know the timings in an ideal state, the value of TIE is determined from the deviation amount of a maximum value of counter reading for the purpose of the present invention. The deviation amount of a maximum value of counter reading is considered to be the number of bits of the deviation that arises as a result of the phase shift of a packet that arrives in an interval. The amount of delay that is required to the number of bits of the deviation is determined by dividing the deviation amount by the bit rate of TS, which value is TIE (=x[i]).

[Numeral 5]

$$x[i] = \frac{\text{Deviation}\,[i]}{B} \quad \text{(Formula 5)}$$

The clock synchronization accuracy (FFO) can be computed by substituting it for x[i] in the above-described formula 4 of GR1244.

Thus, it is possible to compute the synchronization accuracy by means of either of the above two methods on the basis of the deviation amount of a maximum value of counter reading.

<Explanation of Operation of Node>

The operation of the slave node will be described below. The operation of the node is common for a large part between a case of using the first computation method and a case of using the second computation method except that the formula for computing FFO differs. Therefore, two cases will be described commonly and only the part that differs will be described individually.

Figure 25:
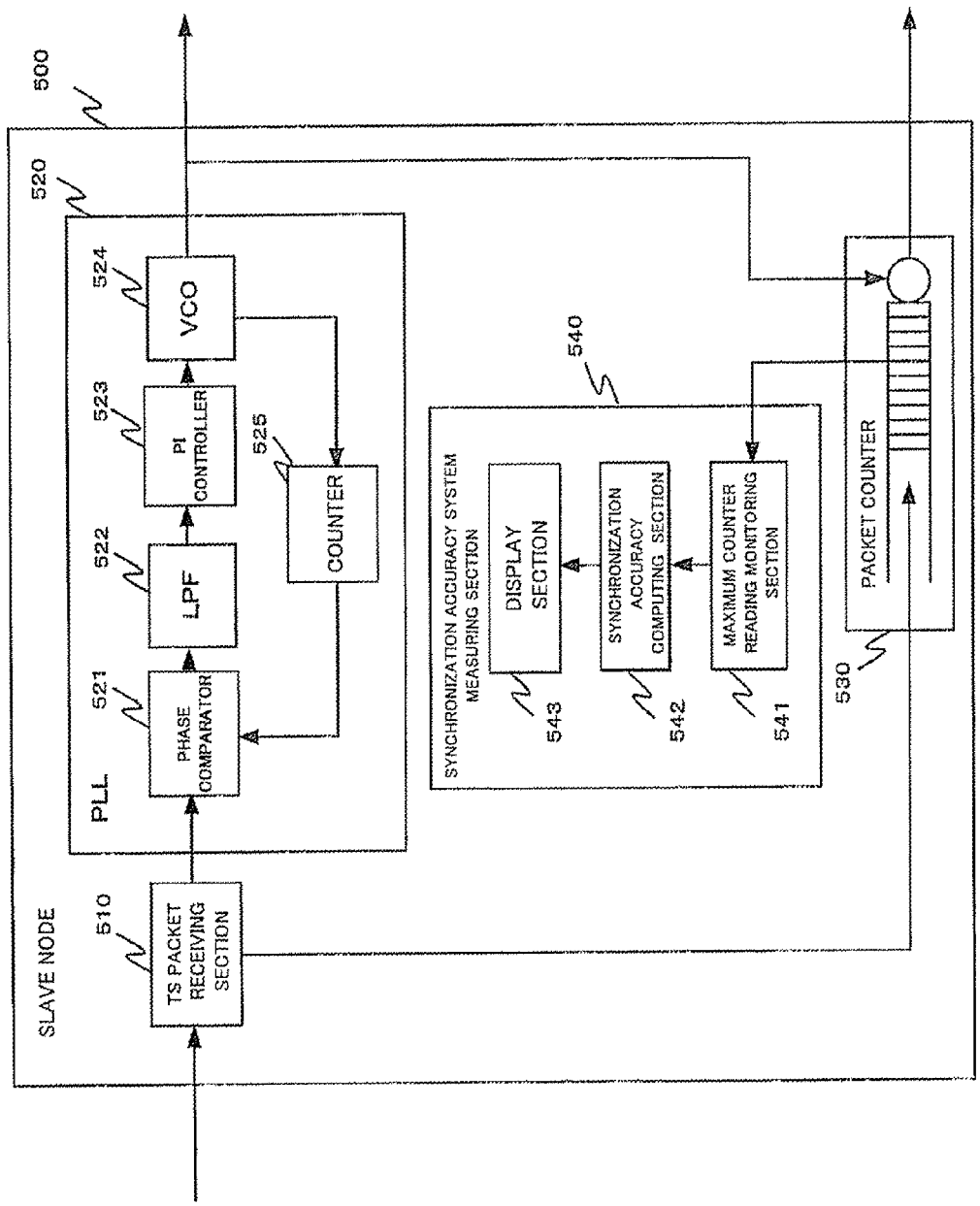
FIG. 25 An illustration of the basic configuration of the fourth exemplary embodiment of the present invention including the configuration of the synchronization accuracy measuring section 314 thereof shown in detail.

FIG. 25 is an illustration of the configuration of the slave node 510 including the configuration of the packet counter 530 and that of the synchronization accuracy measuring section 540 shown in detail.

The packet counter 530 has a counter and increments the counter reading value by a predetermined value each time it receives a TS packet from the TS packet receiving section 510 as described above. At the same time, it decrements the counter reading value according to the frequency that is determined by the VCO 524.

The synchronization accuracy measuring section 540 includes a maximum counter reading monitoring section 541, a synchronization accuracy computing section 542 and a display section 543.

Figures 2, 26:
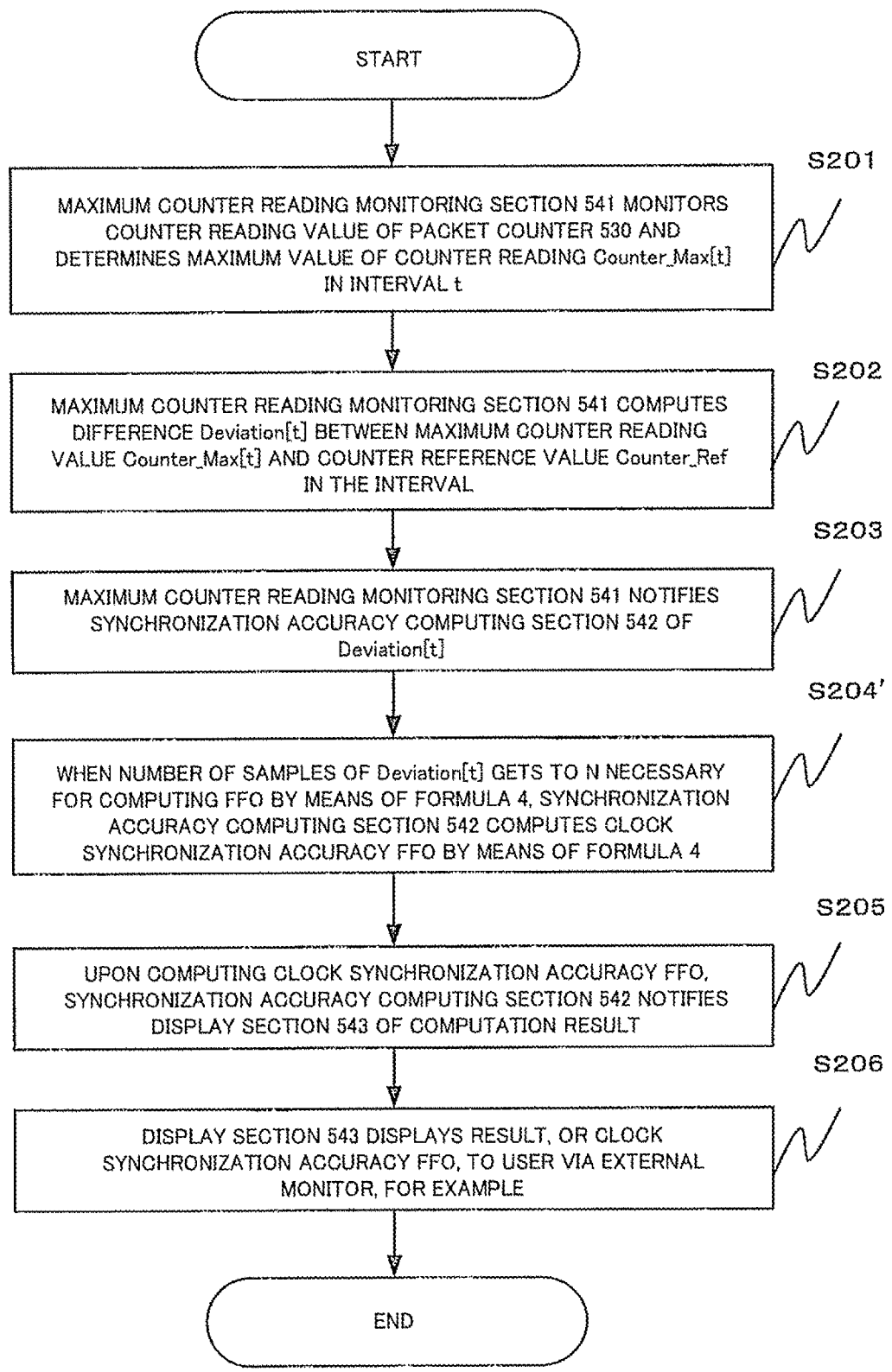
Figures 1, 32:
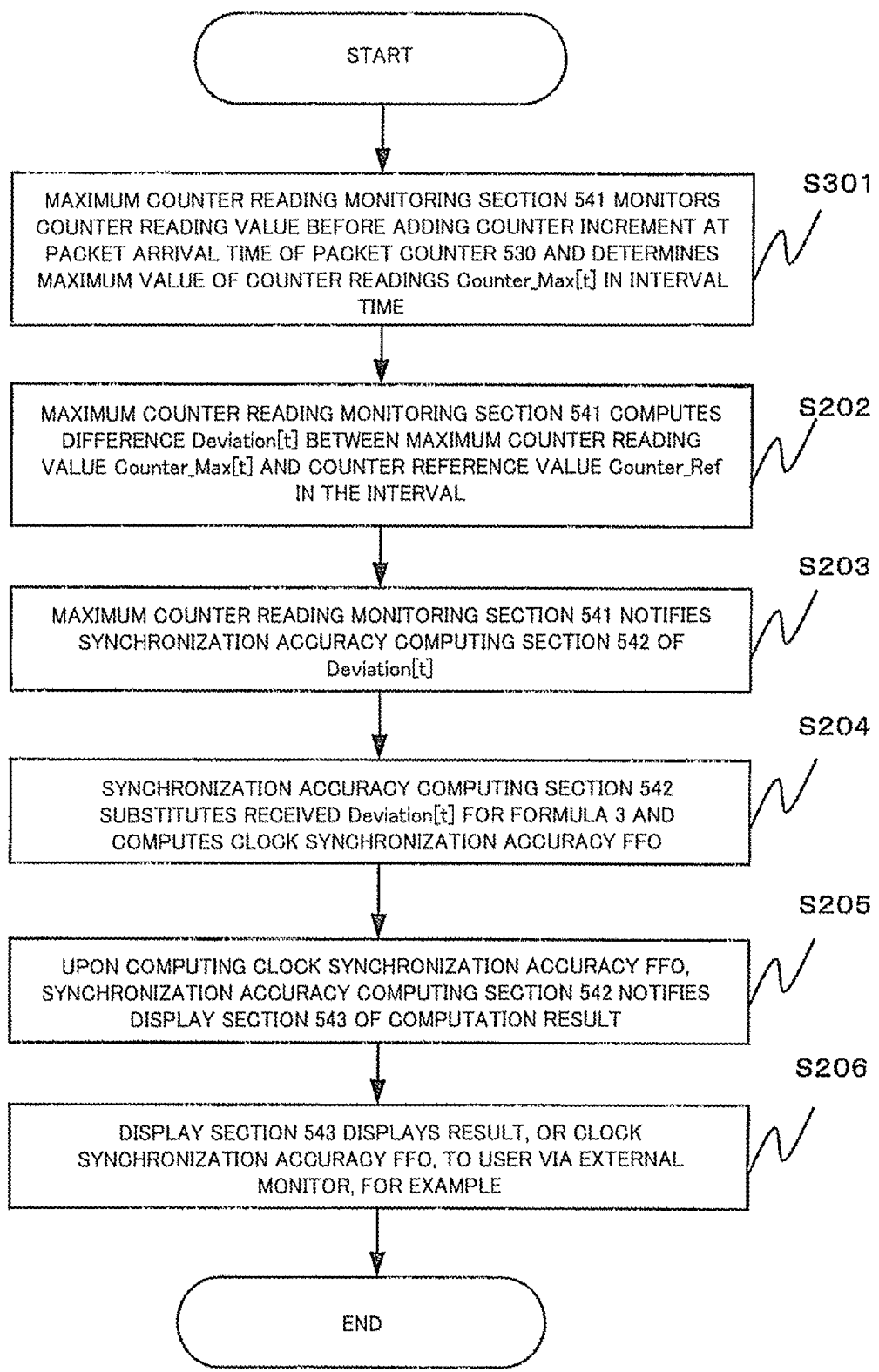
Figures 2, 32:
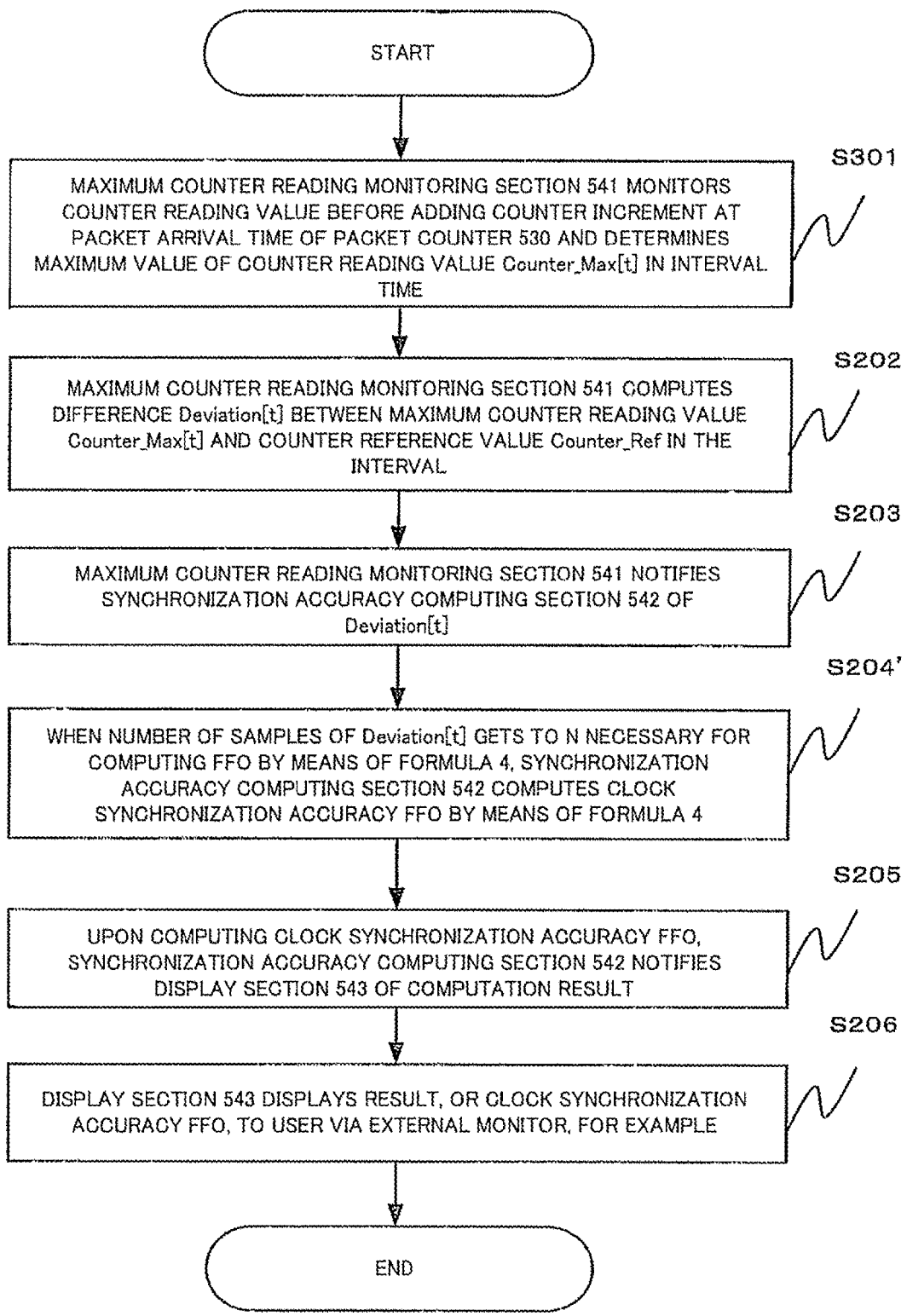

FIG. 26-1 and FIG. 26-2 show the processing flows of the synchronization accuracy measuring section 540. The operation of the synchronization accuracy measuring section 540 will be described by referring to FIG. 25, FIG. 26-1 and FIG. 26-2. Firstly, a case where the first computation method is employed will be described by referring to FIG. 26-1.

To begin with, the maximum counter reading monitoring section 541 monitors the counter reading value of the packet counter 530. Then, it determines the maximum value Counter_Max[t] of counter reading in interval t (Step S201).

Then, after determining the maximum counter reading value Counter_Max[t], the maximum counter reading monitoring section 541 computes the amount of difference, or Deviation [t], between the maximum counter reading value Counter_Max[t] and a reference counter reading value Counter_Ref (Step S202). The mathematical formula that is employed at this time is shown below.

$$\text{Deviation}[t] = \text{Counter\_Max}[t] - \text{Counter\_Ref}$$

The amount of difference, or Deviation[t], is the deviation amount of the maximum counter reading value as referred to in the above description. The Counter_Ref is the counter reading value at the time when the measurement is started, a predetermined counter reading value or both.

Subsequently, after determining Deviation[t], the maximum counter reading monitoring section 541 notifies the synchronization accuracy computing section 542 of Deviation[t] (Step S203).

Then, the synchronization accuracy computing section 542 substitutes the received value of Deviation[t] for the formula 3 and compute the clock synchronization accuracy FFO (Step S204).

The synchronization accuracy computing section 542 that computes the clock synchronization accuracy FFO notifies the display section 543 of the result of computation (Step S205).

Finally, the display section 543 displays the result of computation of the clock synchronization accuracy FFO to the user typically by means of an external monitor (Step S206).

Now, a case where the second computation method is employed will be described by referring to FIG. 26-2. The difference from the above-described case employing the first computation method lies in that Step S204 is replaced by Step S204'.

In Step S204', if the number of received values of Deviation [t] is equal to N that is the number of samples required for computing FFO by means of the above-described formula 4, the synchronization accuracy computing section 542 computes the clock synchronization accuracy FFO by means of the formula 4. The operations of the other steps are common with the case where the computation method 1 is employed.

<Advantageous Effects>

As described above, according to the present invention, the maximum values of the packet counter for managing the state of arrivals and that of outputs of TS packets at a slave node are managed on an interval by interval basis to make it possible to compute the current clock synchronization accuracy on the basis of the deviation amount of the maximum value. Then, as a result, the present invention provides an advantage of making it possible to grasp the current clock synchronization accuracy between a master node and a slave node while providing services.

Particularly, since the present invention makes it possible to measure the accuracy by way of a process at the slave node so that the present invention can be applied to a network that is being actually run. The problem that it is difficult to measure the synchronization accuracy on an actual field where a master node and a slave node are located at places that are physically remote from each other can be dissolved. Additionally, since the accuracy can be computed from the information obtained by monitoring the counter reading value at the slave node, it is not necessary to provide a specific system such as GPS. Therefore, a system according to the present invention can be realized at low cost and stably because the present invention is free from particular restrictions for providing services typically in terms of places for installing devices.

Fifth Exemplary Embodiment

Now, another exemplary embodiment for carrying out the present invention will be described in detail by referring to the drawings. Methods of using a time stamp system are described for a fourth exemplary embodiment as methods of synchronizing clocks between a master node and a slave node. A case of using some other clock synchronization method will be described for this exemplary embodiment.

First Example

Explanation of Configuration

As the first example of this exemplary embodiment, an instance where a packet filter feature is additionally employed will be described below as an example of applying a time stamp system to a clock synchronization method.

Figure 27:
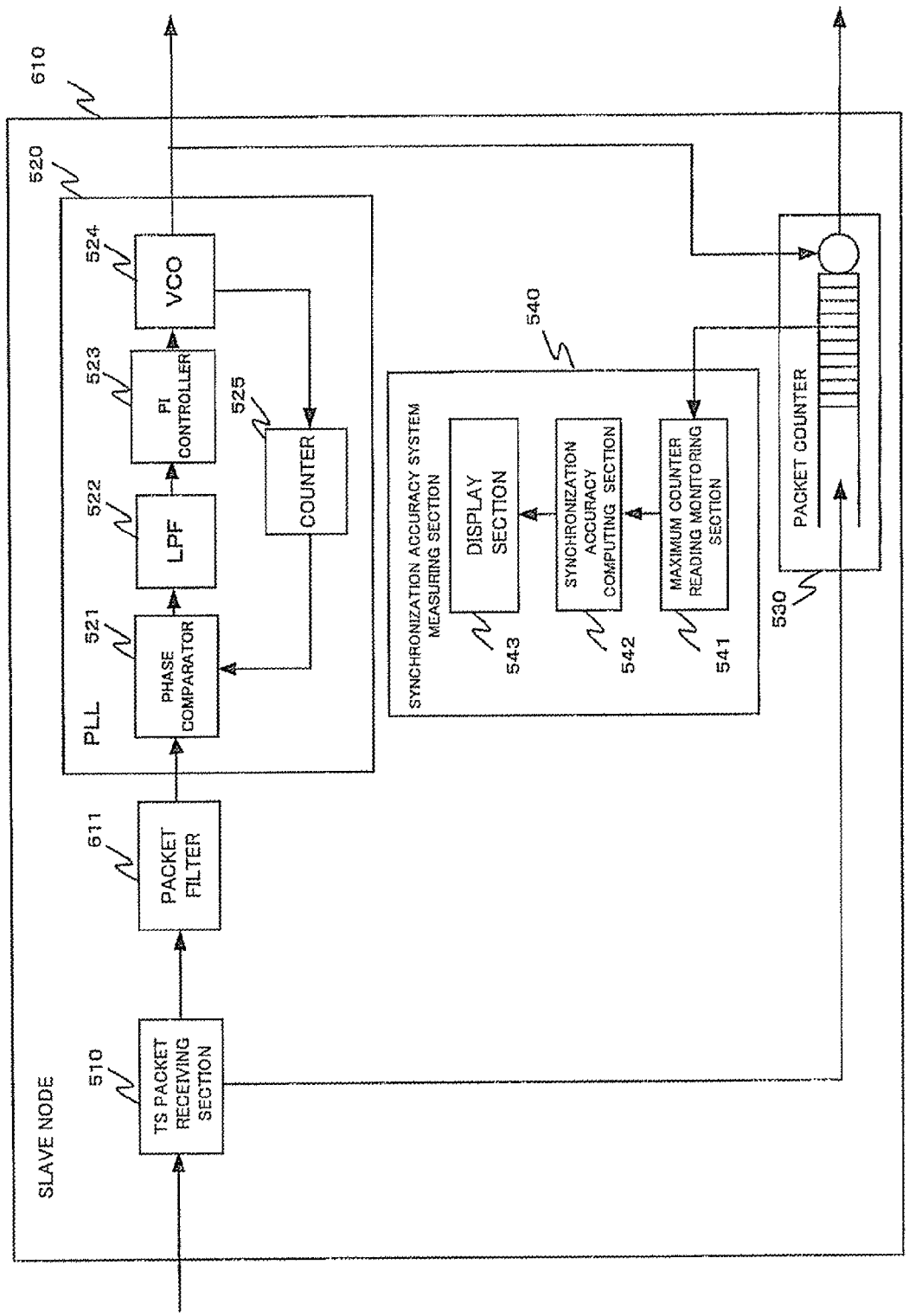
FIG. 27 An illustration of the configuration of slave node of a fifth exemplary embodiment of the present invention when a packet filtering function is employed with a time stamp system for clock synchronization control.

When the overall configuration of the fifth exemplary embodiment of the present invention is compared with the configuration of the fourth exemplary embodiment, the slave node 510 is replaced by a slave node 610 having a configuration as shown in FIG. 27. The specific configuration of the master node is similar to that of the first exemplary embodiment.

<Slave Node>

The slave node 610 has a packet filter 611 in addition to the configuration of the slave node 510 shown in FIG. 20.

The packet filter 611 computes the jitter to which the packet is subjected from the TS of the TS packet it receives from the TS packet receiving section 510. Then, the packet filter 611 selects a TS packet to be transferred to the PLL 521 according to the magnitude of the computed jitter. More specifically, the threshold value according to which the object to be transferred is determined is defined in advance and a TS packet whose jitter is short of the threshold value is sent to the PLL 521, whereas a TS packet whose jitter exceeds the threshold value is scrapped. This arrangement provides an effect of reducing the influence of jitter to the control of clock synchronization that is performed by the PLL 521.

The component sections of the PLL 521 and their configurations are the same as those of the first exemplary embodiment.

Referring to FIG. 27, the operation of the slave node for determining the clock synchronization accuracy when a packet filter feature is additionally employed for a time stamp system will be described below.

The TS packet receiving section 510 receives the TS packet transferred from the master node 400 via the packet network 130. The received TS packet is then sent to the packet filter 611 and the packet counter section 530.

The packet filter 611 computes the jitter to which the received packet is subjected to from the TS of the TS packet and sends the TS packet to the PLL 312 when the jitter is short of the threshold value, whereas it scraps the TS packet when the jitter exceeds the threshold value. Like the fourth exemplary embodiment, the phase comparator 521 computes a difference signal of the received TS and the TS generated by the counter 525, which is then output to the LPF 522. The LPF 522 smoothes the difference signal and the result thereof is output to the PI controller 523.

The PI controller 523 generates a control signal that ultimately reduces the smoothed difference signal to nil and outputs the control signal to the VCO 524, which VCO 524 generates a clock of the frequency that is determined by the input control signal and outputs it to the counter 525.

The counter 525 generates a TS on the basis of the clock and outputs it to the phase comparator 521. The difference between the generated TS and the received TS approaches nil as the feedback process is repeated so that the clock of the slave node 610 is synchronized by the clock of the master node 400. Thus, an advantage of reducing the influence of jitter to raise the synchronization accuracy is expected as TS packets having a large jitter are filtered by the packet filter 1001.

The synchronization accuracy measuring section 540 of the slave node 610 has a configuration similar to that of FIG. 25 of the fourth exemplary embodiment and includes a maximum counter reading monitoring section 541, a synchronization accuracy computing section 543 and a display section 543.

The operation of the synchronization accuracy measuring section 540 of the fifth exemplary embodiment will be described by referring to FIGS. 26-1 and 26-2 again.

The maximum counter reading monitoring section 541 monitors the counter reading value of the packet counter 530. Then, it determines the maximum value Counter_Max[t] of the counter reading in interval t. As the maximum counter reading monitoring section 541 determines the maximum counter reading value Counter_Max[t], it computes the amount of difference, or Deviation[t], between the maximum counter reading value in the interval and the reference counter reading value Counter_Ref.

After determining the amount of difference, or Deviation [t], by Deviation[t]=Counter_Max[t]−Counter_Ref, the maximum counter reading monitoring section 541 notifies the synchronization accuracy computing section 542 of Deviation[t]. The synchronization accuracy computing section 542 computes the clock synchronization accuracy FFO by means of the formula 3, the formula 4 or the formula 5 described above on the basis of the value of received Deviation[t]. After computing the clock synchronization accuracy FFO, the synchronization accuracy computing section 542 notifies the display section 543 of the result. The display section 543 displays, the result, or the clock synchronization accuracy FFO, to the user typically via an external monitor.

As described above, when a packet filter feature is additionally employed for a time stamp system as clock synchronization method, the synchronization accuracy measuring section 540 manages the state of arrivals and that of outputs of TS packets on an interval by interval basis to make it possible to compute the current clock synchronization accuracy on the basis of the deviation amount of the maximum value. Then, as a result, the present invention provides an advantage of making it possible for the user to grasp the current clock synchronization accuracy between a master node and a slave node while providing services.

Besides, there may be a case where the required value is not achieved for synchronization accuracy while monitoring the current clock synchronization accuracy. If such is the case, an action may be taken on the clock synchronization control to improve the synchronization accuracy by utilizing synchronization accuracy information.

Figure 28:
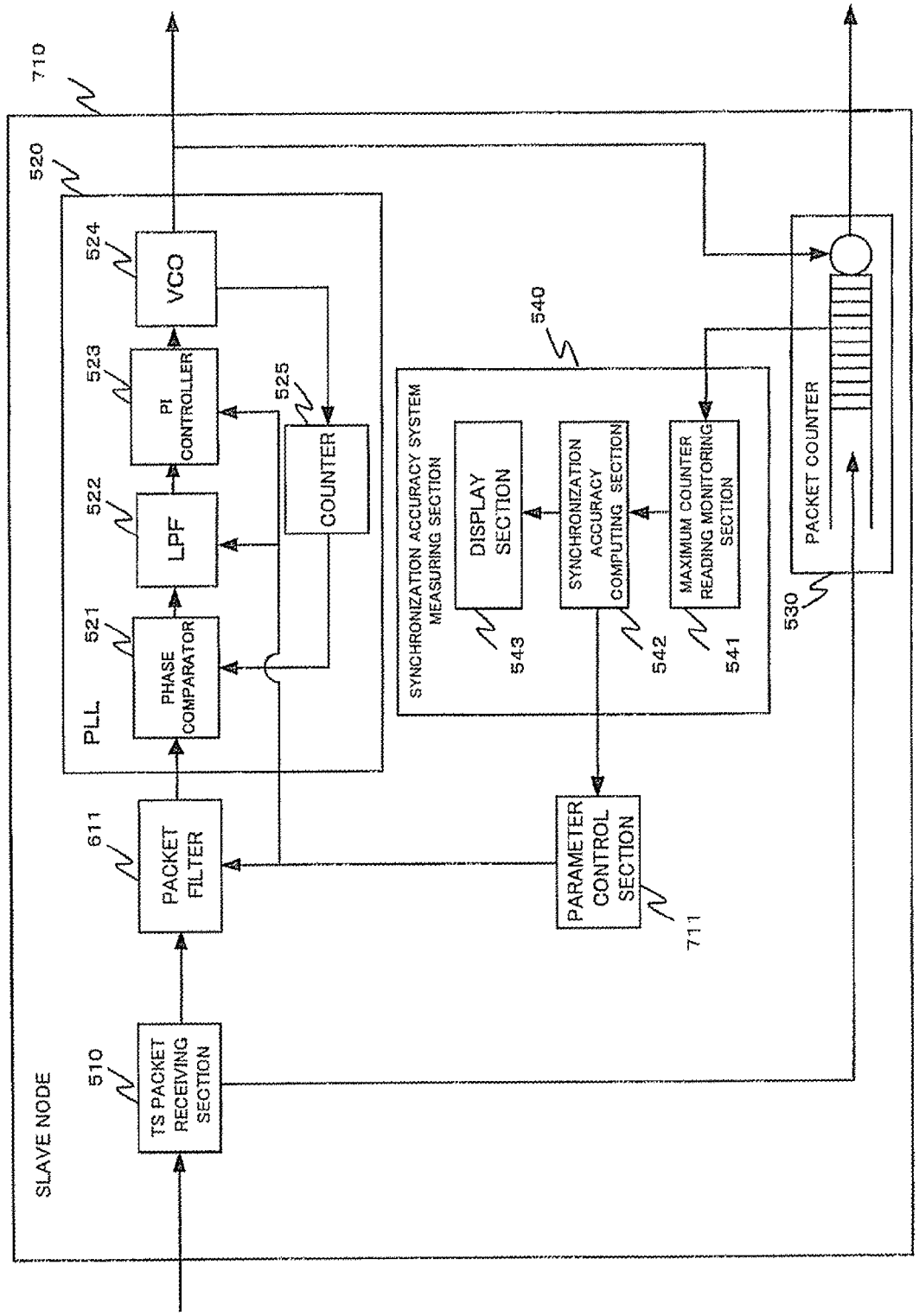
FIG. 28 An illustration of the configuration of slave node of the fifth exemplary embodiment of the present invention when an adaptive clock system is employed for clock synchronization control.

In the slave node 610 shown in FIG. 28, a parameter control section 711 is added to the configuration of the slave node 710 described above by referring to FIG. 27. The parameter control section 711 improves the synchronization accuracy by adjusting the filter threshold value of the packet filter 611 and/or adjusting the parameters of the LPF 522 and the PI control section 523 of the PLL 520 on the basis of the current clock synchronization accuracy computed by the synchronization accuracy computing section 542.

Second Example

Explanation of Configuration

As a modified example of the fifth exemplary embodiment, an instance where an adaptive clock method that is described in NPL 1 and becoming popular is employed as a clock synchronization method will be described below.

Figure 29:
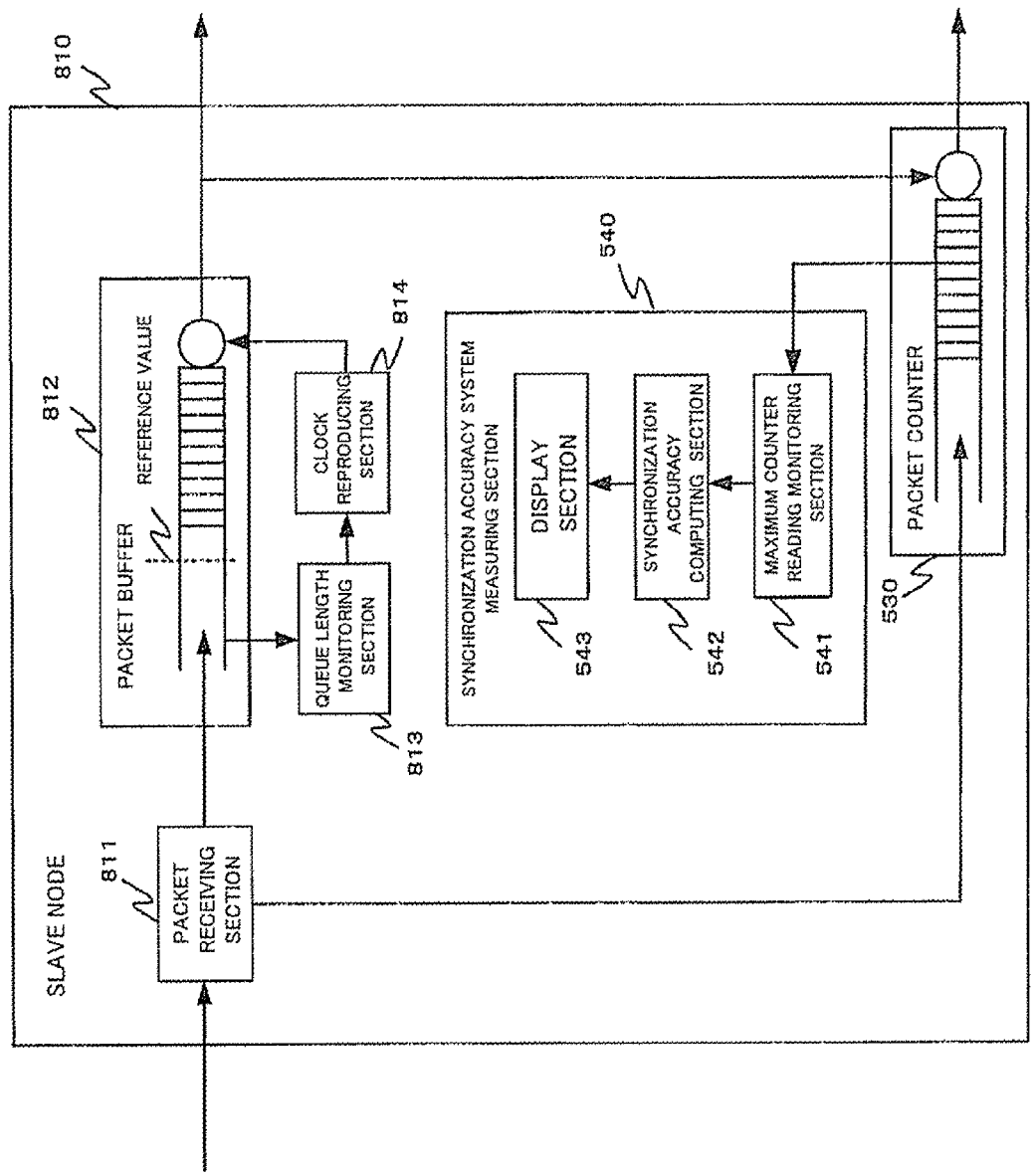
FIG. 29 An illustration of an application example of a slave node according to the fifth exemplary embodiment of the present invention.

If compared with the fourth exemplary embodiment, the slave node 510 is replaced by a slave node 810 having a configuration as shown in FIG. 29.
<Slave Node>

If compared with the configuration of the slave node 510 of FIG. 20, the slave node 810 includes a packet buffer 812, a queue length monitoring section 813 and a clock reproducing section 814 in place of the PLL 520. Additionally, the TS packet receiving section 510 is replaced by a packet receiving section 811.

The packet receiving section 811 receives the packet sent from the master node 400 and transfers it to the packet buffer 812 and the packet counter 530. Since the packet sent from the master node 400 is not a TS packet, the TS packet receiving section 510 is replaced by the packet receiving section 811. Since the packet sent from the master node 400 is not a TS packet, it is assumed that packets of the same size are sent at regular intervals.

The packet buffer 812 stores the packet sent from the packet receiving section 811 and outputs packets at the rate directed by the clock reproducing section 814.

The queue length monitoring section 813 monitors the accumulated amount of the packet buffer 812. Then, it notifies the clock reproducing section 814 of the magnitude relationship of the accumulated amount of the buffer and the reference value of the buffer.

The clock reproducing section 814 adjusts the frequency of the clock so as to make the accumulated amount of the buffer equal to the reference value of the buffer.

As the packet counter 530 receives a packet from the packet receiving section 811, it increments the counter reading value by a predetermined value. At the same time, it decrements the counter reading value according to the frequency determined by the clock reproducing section 814.

As in the fourth exemplary embodiment, the synchronization accuracy measuring section 540 monitors the counter reading value of the packet counter 530 and observes the maximum value of counter reading in a certain period of time (interval). Then, it measures the clock synchronization accuracy on the basis of the maximum value.
<Explanation of Operation>

Referring to FIG. 29, the operation of the slave node for determining the clock synchronization accuracy will be described when an adaptive clock method is employed as a clock synchronization method.

Upon receiving a packet, the packet receiving section 811 transfers it to the packet buffer 812 and the packet counter 530.

The queue length monitoring section 813 monitors the accumulated amount of the packet buffer 812 storing received packets. It determines if the accumulated amount of the buffer is the same as, greater than or smaller than the reference value of the buffer and notifies what it determines to the clock reproducing section 814. It may determine on the basis of the accumulated amount of the buffer at a certain time point or on the basis of the average value over a certain time period.

The clock reproducing section 814 controls the readout clock f2 so as to make the accumulated amount of the packet buffer 812 to be held to the reference value. In other words, when the accumulated amount of the buffer is equal to the reference value, the reproduction clock f2 is regarded as being synchronized with the clock f1 of the master node 400. On this ground, the reproduction clock f2 is held to the foregoing state when the accumulated amount of the buffer is equal to the reference value. f2>f1 is determined when the accumulated amount of the buffer is smaller than the reference value and the frequency of the clock f2 is adjusted so as to become lower. Conversely, f2<f1 is determined when the accumulated amount of the buffer is larger than the reference value and the frequency of the clock f2 is adjusted so as to become higher.

A process of synchronizing the clock of the master node 400 and that of the slave node 810 is executed by the above-described operations of the packet buffer 812, the queue length monitoring section 813 and the clock reproducing section 814. On the other hand, the synchronization accuracy measuring section 540 measures the current clock synchronization accuracy.

The synchronization accuracy measuring section 540 has a configuration similar to that of the fourth exemplary embodiment shown in FIG. 25 and includes a maximum counter reading monitoring section 541, a synchronization accuracy computing section 542 and a display section 543.

As the packet counter 530 is notified of reception of a packet by the packet receiving section 811, it increments the counter reading value by a predetermined value as in the case of the fourth exemplary embodiment. At the same time, it decrements the counter reading value according to the frequency determined by the clock reproducing section 814.

In response to the operation of the packet counter 530, the synchronization accuracy measuring section 540 measures the clock synchronization accuracy by way of a process similar to the corresponding process of the fourth exemplary embodiment.

The operation of the synchronization accuracy measuring section 540 of the fifth exemplary embodiment will be described below by referring to FIG. 26-1 and FIG. 26-2 once again.

The maximum counter reading monitoring section 541 monitors the counter reading value of the packet counter 530. Then, it determines the maximum value Counter_Max[t] of the counter reading in interval t. As the maximum counter reading monitoring section 541 determines the maximum counter reading value Counter_Max[t], it computes the amount of difference, or Deviation[t], between the maximum counter reading value in the interval and the reference counter reading value Counter_Ref.

After determining the amount of difference, or Deviation [t], by Deviation[t]=Counter_Max[t]−Counter_Ref, the maximum counter reading monitoring section 541 notifies the synchronization accuracy computing section 542 of Deviation[t]. The synchronization accuracy computing section 542 computes the clock synchronization accuracy FFO by means of the formula 3, the formula 4 or the formula 5 described above on the basis of the value of received Deviation[t]. After computing the clock synchronization accuracy FFO, the synchronization accuracy computing section 542 notifies the display section 543 of the result. The display section 543 displays, the result, or the clock synchronization accuracy FFO, to the user via an external monitor, for example.

As described above, when an adaptive clock method is employed as the clock synchronization method, the synchronization accuracy measuring section 540 manages the maximum value of the reading of the packet counter 530 that manages the state of arrivals and outputs of packets from the packet receiving section 811, on an interval by interval basis to make it possible to compute the current clock synchronization accuracy on the basis of the deviation amount of the maximum value. Then, as a result, the present invention provides an advantage of making it possible for the user to grasp the current clock synchronization accuracy between a master node and a slave node while providing services.

As may be seen from the two examples described above for this exemplary embodiment, the clock synchronization accuracy measuring method proposed according to the present invention does not depend on the clock synchronization method and can operate under the condition that packets of the same size are transmitted periodically from a master node to a slave node. Like the fourth exemplary embodiment, packets are input periodically to the packet counter 530 in parallel with the clock synchronization control process and the synchronization accuracy measuring section 540 manages the maximum values of packet counter reading on an interval by interval basis and computes the clock synchronization accuracy on the basis of the deviation amount of the maximum value. Particularly, since the measurement can be realized by a process at the slave node, this exemplary embodiment provides an advantage that the clock synchronization accuracy can be measured in a network that is being actually run stably at low cost.

Sixth Exemplary Embodiment

Another exemplary embodiment for carrying out the present invention will be described in detail by referring to the drawings. When computing the synchronization accuracy, the fourth exemplary embodiment and fifth exemplary embodiment monitor the maximum value of the counter reading of the packet counter 530 that the slave node 500 has as shown in FIG. 20 and computes the synchronization accuracy from the deviation amount of the maximum value. A synchronization accuracy computing method using a different method of monitoring the maximum value will be described in this exemplary embodiment.

Figure 30:
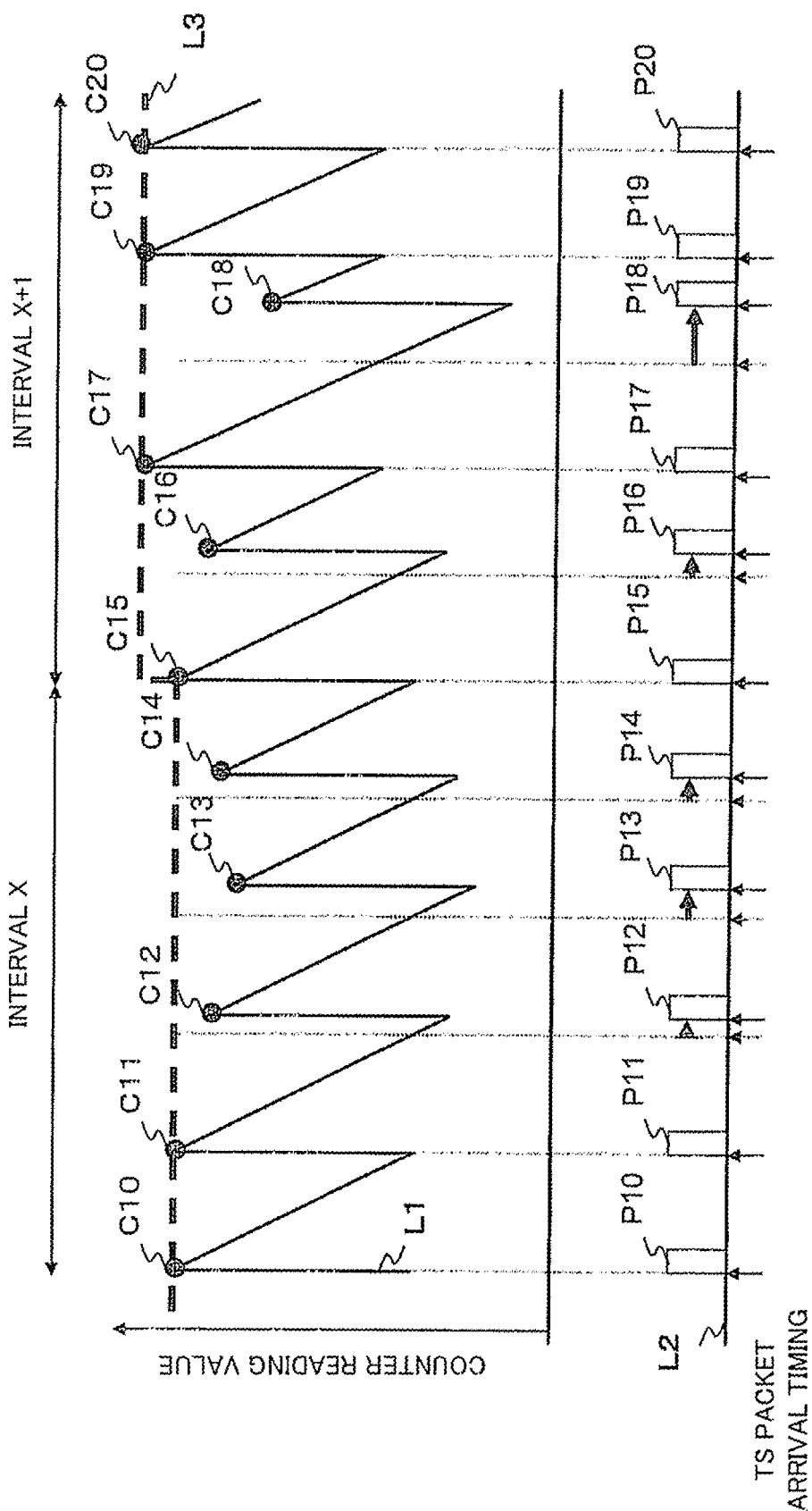
FIG. 30 An illustration of arrival timing of a TS packet and the corresponding increase/decrease of the reading of the packet counter 530 according to the fourth exemplary embodiment of the present invention.

Firstly, the state of the packet counter 530 of the fourth exemplary embodiment when TS packets 120 arrive and how the counter reading value is incremented and decremented correspondingly will be described anew by referring to FIG. 30. FIG. 30 corresponds to FIG. 23 and additionally illustrates the timings of arrival of TS packets 120. Note that "P" is employed as a mark for identifying a TS packet in the following description and also in the related drawings. Additionally, "C" is employed as a mark for identifying the counter reading value at a timing. Furthermore, "L" is employed as a mark for identifying a line that indicates the progress of counter reading value, the maximum value and the minimum value.

In FIG. 30, L1 that are lines illustrating the progress of the counter reading value that changes in response to the arrivals of TS packets P10 through P20 and counter reading values C10 through C20 observed when the packets arrive are shown in FIG. 30. Additionally, L3 that are lines indicating the maximum counter reading values in the respective intervals of the counter reading values C10 through C20 are also shown. A delay is randomly added to a TS packet due to the characteristics of packet network. In this instance, it is assumed that no delay is added to the TS packets P10, P11, P15, P17, P19 and P20 and a delay is added to the TS packets P12, P13, P14, P16 and P18. In FIG. 30, the elapsed time is shown in the direction of the horizontal axis and the counter reading value is shown in the direction of the vertical axis.

As described above, the packet counter 530 increments the counter reading value by a predetermined value each time it receives a TS packet 120 in the fourth exemplary embodiment. At the same time, it decrements the counter reading value according to the frequency that is determined by the VCO 524. By looking into how the counter reading value is handled in detail by means of FIG. 30, it will be found that the counter reading values C10 through C20 are those that are observed after adding the increment for a packet arrival. Then, the maximum counter reading value in each interval is monitored by referring to the counter reading values C10 through C20 at the respective packet arrivals. For example, in the interval X, the values of the counter reading values C10 and C11 that are the maximum values in the counter reading values C10 through C14 at the respective packet arrivals are defined as the maximum counter reading value. Similarly, in the interval X+1, the values of the counter reading values C17, C19 and C20 that are the maximum values in the counter reading values C15 through C20 at the respective packet arrivals are defined as the maximum counter reading value.

The values that are referred to as counter reading values at respective packet arrivals in this exemplary embodiment are different from those that are referred to as counter reading values by the counter reading value referring method of the fourth exemplary embodiment described above by referring to FIG. 30. This will be described below by referring to FIG. 31.

Figure 31:
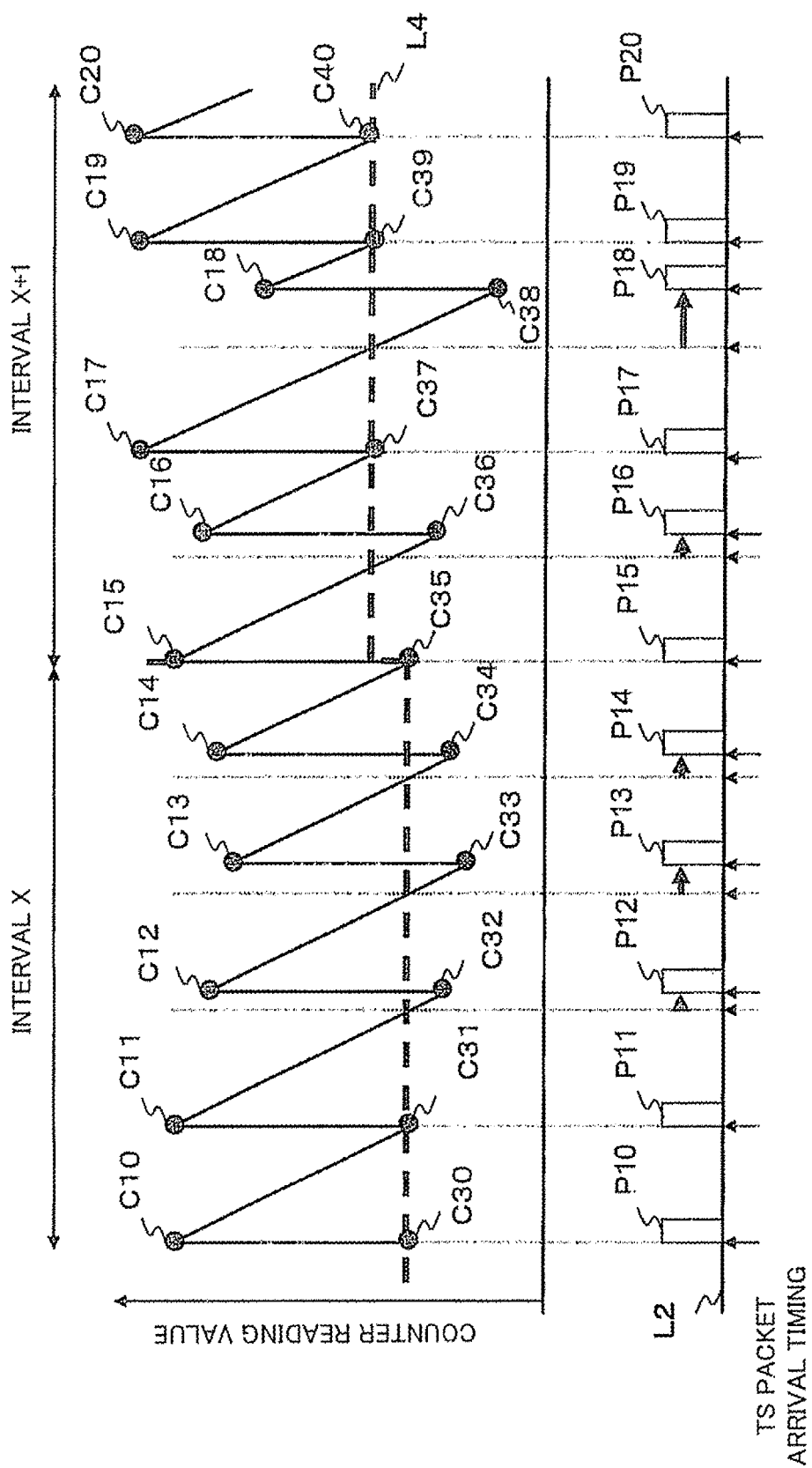
FIG. 31 An illustration of arrival timing of a TS packet and the corresponding increase/decrease of the reading of the packet counter 530 according to a sixth exemplary embodiment of the present invention.

The arriving TS packets P10 through P20 and the timings of arrival shown in FIG. 31 are the same as those shown in FIG. 30. While the counter reading values C10 through C20 at the times of arrival are obtained in the fourth exemplary embodiment after adding a predetermined increment as shown in FIG. 30, the counter reading values C30 through C40 at the times of arrival are obtained in this exemplary embodiment before adding a predetermined increment. Therefore, the maximum counter reading value L4 is also selected as maximum value in the counter reading values C30 through C40 since the counter readings C30 through C40 at the times of arrival are obtained before adding a predetermined increment. The maximum counter reading value L4 is the maximum value of the counter reading values C30 through C40 at the times of arrival that are obtained for reference before adding a predetermined increment and does not indicate the maximum value in the L1 illustrating the progress of counter reading value.

As described before, a constant increment is added for each packet by the packet counter 530 when the packet arrives. Therefore, if the use of the values obtained by adding an increment as values to be referred to as counter reading values at the times of arrival in the fourth exemplary embodiment is altered to the use of the values obtained before adding an increment as values to be referred as counter reading values at the times of arrival in this exemplary embodiment, the net result is that the latter counter reading values at the times of arrival are obtained by subtracting the decrement for a packet and hence both are equivalent from the viewpoint of the deviation amount of the maximum value in each interval.

On this ground, the maximum value of the counter readings at the times of arrival obtained before adding an increment is monitored in each interval and the synchronization accuracy is determined from the deviation amount of the maximum value in the sixth exemplary embodiment.

If the method of monitoring the maximum counter reading value is altered, the deviation amount of the maximum value in each interval is the same as that of the fourth exemplary embodiment. Thus, the operation of the slave node 500 is altered from that of the fourth exemplary embodiment in terms of determining the maximum counter reading value in each interval. On the other hand, it is the same as that of the fourth exemplary embodiment in terms of determining the synchronization accuracy from the deviation amount of the maximum value in each interval.

More specifically, only Step S201 of the processing flow of the synchronization accuracy measuring section 540 of the fourth exemplary embodiment described above by referring to FIG. 26 is replaced by Step S301 in this exemplary embodiment and all the subsequent steps are the same. The processing operation in Step S301 is that the maximum counter reading monitoring section 541 monitors the counter reading values of the packet counter 530 as in Step S201 of FIG. 26-1, 2. Particularly, it monitors the reading values before adding the increment for a packet in a situation where the counter reading value rises and falls and determines the maximum value Counter_Max(t) before adding the increment for a packet in interval t (Step S301). The processing operations of all the subsequent steps, Steps S202 through S206 are the same as those of FIG. 26.

<Advantageous Effects>

As described above, according to the present invention, the counter reading values of the packet counter before adding the increment for a packet are monitored at the slave node in a situation where the counter reading value rises and falls and the maximum value in the counter readings in each interval is managed to make it possible to compute the current clock synchronization accuracy on the basis of the deviation amount of the maximum value. If compared with the method described above for the fourth exemplary embodiment, the method of monitoring the maximum counter reading values described for this exemplary embodiment is such that the maximum value is obtained by subtracting the decrement for a packet from the corresponding maximum value obtained in the fourth exemplary embodiment so that the deviation amount of the maximum value in each interval is the same as the one determined in the fourth exemplary embodiment. Thus, the synchronization accuracy that is determined on the basis of the deviation amount of the maximum value is the same for the both exemplary embodiments. As a result, the present invention provides an advantage of making it possible to grasp the current clock synchronization accuracy between a master node and a slave node while providing services.

Seventh Exemplary Embodiment

Still another exemplary embodiment for carrying out the present invention will be described in detail by referring to the drawings. When computing the synchronization accuracy in the fourth exemplary embodiment and the sixth exemplary embodiment, the packet counter 530 at slave node 500 as shown in FIG. 25 performs an operation of "incrementing the counter reading value by a predetermined value each time it receives a TS packet from the TS packet receiving section 150 and, at the same time, decrements the counter reading value according to the frequency determined by the VCO 524". Then, it monitors the maximum value of the counter readings after adding the increment in the fourth exemplary embodiment and before adding the increment in the sixth exemplary embodiment and computes the synchronization accuracy from the deviation amount thereof.

The operation of the packet counter 530 of this exemplary embodiment is altered from that of the fourth exemplary embodiment and that of the sixth exemplary embodiment. The synchronization accuracy computing method of this exemplary embodiment will be described below.

The packet counter 530 of the fourth exemplary embodiment and that of the sixth exemplary embodiment are replaced by a subtraction/addition packet counter 920 in the seventh exemplary embodiment. As a result of the alteration, the operation of the subtraction/addition packet counter 920 becomes such that "it subtracts a predetermined value from the counter reading value each time it receives a packet and ordinarily increments the counter reading value by addition according to the speed of the VCO 524".

Figure 33:
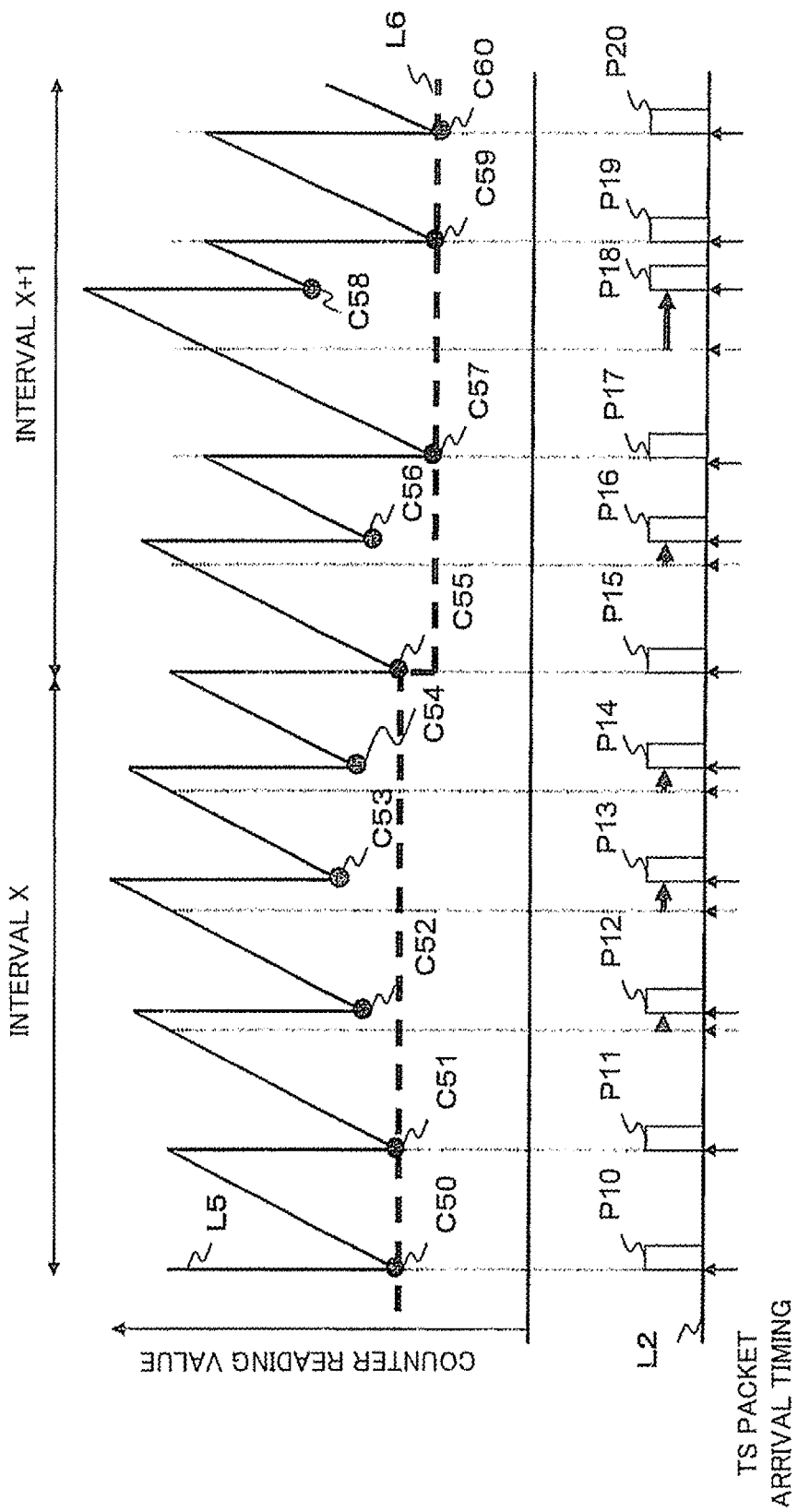
FIG. 33 An illustration of arrival timing of a TS packet and the corresponding increase/decrease of the reading of the subtraction/addition packet counter 3430 of the seventh exemplary embodiment of the present invention.

FIG. 33 of this exemplary embodiment corresponds to FIG. 31 of the sixth exemplary embodiment. The progress L5 of counter reading value shows how the counter reading value of the subtraction/addition packet counter 920 rises and falls. The arriving TS packets P10 through P20 and the timings of arrival thereof are the same as those of FIG. 31. In this exemplary embodiment, the counter reading values at the arrival times of packets are handled in such a way that the counter reading values C50 through C60 at the times of arrival are obtained after subtracting a counter decrement.

In the fourth through sixth exemplary embodiments, the counter reading value shows the maximum value when a packet arrives without delay and the counter reading value observed at the time when a packet to which a delay is added arrives shows a value that is decreased from the maximum value. In the seventh exemplary embodiment, on the other hand, the addition/subtraction method for the counter reading value of the subtraction/addition packet counter 920 is obtained by altering the above method. Thus, the counter reading value that is observed when a packet arrives without delay is the minimum counter reading value L6. The counter reading values C50 through C60 at the times of arrival of packets to which a delay is added are obtained by increasing the minimum counter reading value L6 according to the amount of delay. The change of the minimum counter reading value L6 is opposite to the one shown in FIG. 23, which was referred to for describing the operation of the fourth exemplary embodiment, and the changes of the maximum counter reading values L3 and L4 described above for the sixth exemplary embodiment. In other words, when the speed of the slave node 500 is slow, the maximum counter reading values L3 and L4 of FIG. 30, 31 and the maximum counter reading value of FIG. 23 gradually rise, while the minimum counter reading value L6 of FIG. 33 gradually falls.

While the operation of the subtraction/addition packet counter 920 is opposite to that of the packet counter 530 in terms of rising and falling movements of counter reading value, the deviation amount of the minimum value of the subtraction/addition packet counter 920 in each interval is the same as the corresponding deviation amount of the maximum value of the packet counter 530. However, since the sign of the deviation amount is inverted from positive to negative or vice versa, a process is required in this regard. The process will be described hereinafter in the description of the processing flow given below by referring to FIG. 35-1 and FIG. 35-2. As described above, the operation of this exemplary embodiment is the same as that of the fourth exemplary embodiment and that of the sixth exemplary embodiment in terms of deviation amount. Therefore, the level of synchronization accuracy of this exemplary embodiment is the same as that of the fourth exemplary embodiment and that of the sixth exemplary embodiment.

Now, the configuration of this exemplary embodiment will be described below. Since the operation of the packet counter is different, the configuration of the slave node 500 illustrated in FIG. 25 is altered to that of the slave node 910 illustrated in FIG. 34. More specifically, the packet counter 530 is replaced by the subtraction/addition packet counter 920, while the synchronization accuracy measuring section 540 is replaced by an accuracy measuring section 930, while the maximum counter reading monitoring section 541 is replaced by a minimum counter reading monitoring section 931.

The operation of slave node is altered from that of the fourth exemplary embodiment where a process of determining the maximum counter reading value is executed in each interval to that of this exemplary embodiment where a process of determining the minimum counter reading value is executed in each interval. However, all the subsequent operations for determining the synchronization accuracy from the deviation amount in this exemplary embodiment are the same as those of the fourth exemplary embodiment.

Figures 1, 35:
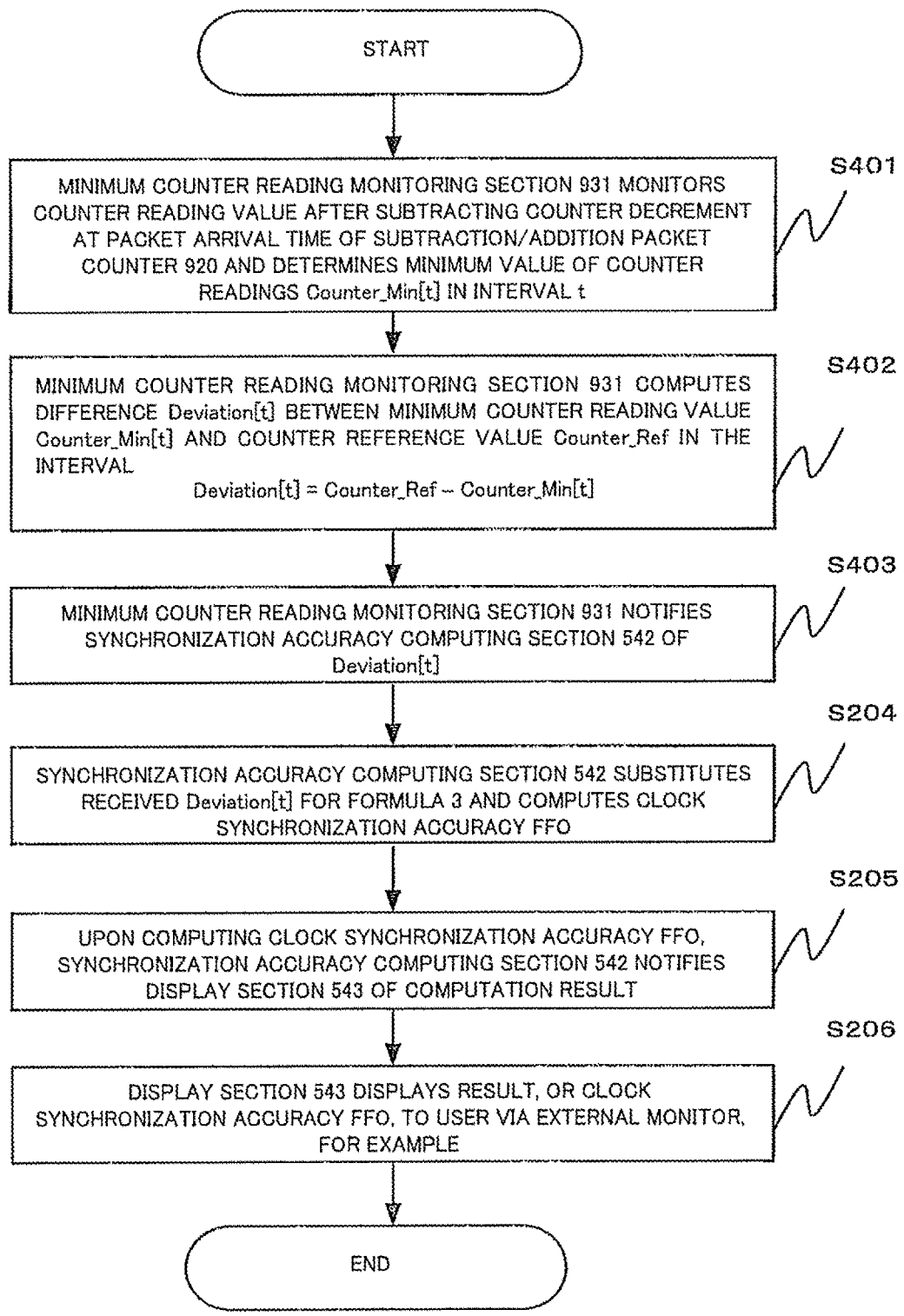
Figures 2, 35:
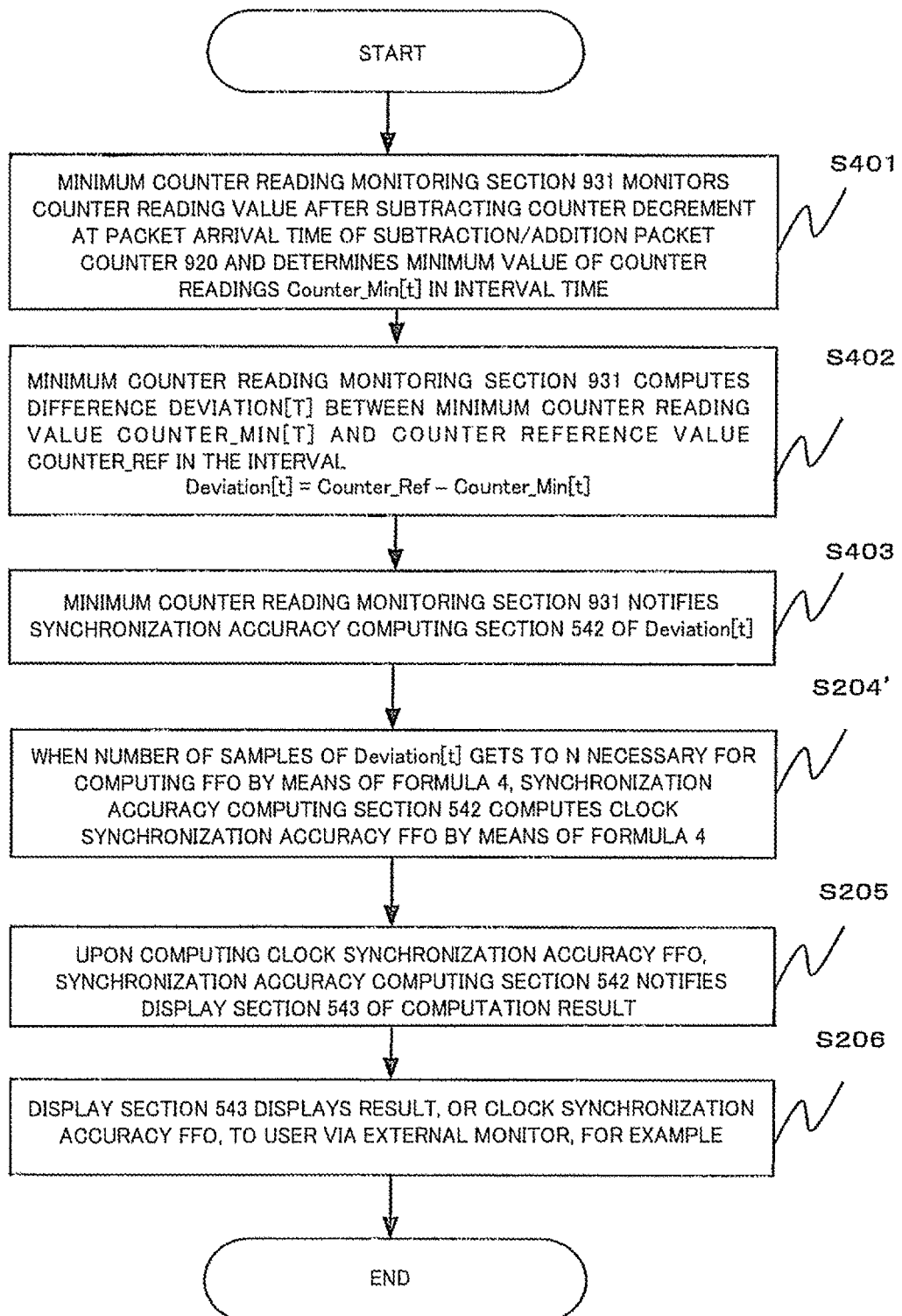

FIG. 35-1 and FIG. 35-2 show the processing flow of the synchronization accuracy measuring section 930.

In Step S301, the minimum counter reading monitoring section 931 monitors the counter reading value of the subtraction/addition packet counter 920. More specifically, it particularly monitors the value obtained after subtracting the decrement for a packet in a situation where the counter reading value rises and falls and determines the minimum value Counter_Min[t] in the values obtained after subtracting the decrement for a packet in interval t (Step S301).

Then, after determining the minimum counter reading value Counter_Min[t], the minimum counter reading monitoring section 931 computes the amount of difference, or Deviation [t], between the minimum counter reading value Counter_Min[t] and a reference counter reading value Counter_Ref (Step S302). The mathematical formula that is employed at this time is shown below.

$$\text{Deviation}[t] = \text{Counter\_Ref} - \text{Counter\_Min}[t]$$

The amount of difference, or Deviation[t], is the deviation amount of the minimum counter reading value as referred to in the above description. The Counter_Ref is the counter reading value at the time when the measurement is started or a predetermined counter reading value. The above formula is partly different from the formula described earlier because the sign of the deviation amount is inverted from positive to negative or vice versa between the packet counter 530 and the subtraction/addition packet counter 920.

Subsequently, after determining Deviation[t], the minimum counter reading monitoring section 931 notifies the synchronization accuracy computing section 542 of Deviation[t] (Step S303).

The processing operations in Step S204 and thereafter are the same as those of the fourth exemplary embodiment illustrated in FIG. 26-1 and FIG. 26-2.

ADVANTAGEOUS EFFECTS

As described above, according to the present invention, the packet counter of the slave node operates in such a way that it subtracts the decrement for a packet when a packet arrives and, on the other hand, ordinarily increments the counter reading value by addition according to the speed of the VCO 524. Then, after doing so, it particularly monitors the values obtained after subtracting the decrement for an arriving packet in a situation where the counter reading value rises and falls and manages the minimum value of the monitored values in each interval so that it can compute the current clock synchronization accuracy on the basis of the deviation amount of the minimum value. The method of monitoring the minimum counter reading value described above for this exemplary embodiment is opposite to the one described above for the fourth exemplary embodiment in terms of rising and falling movements of counter reading value, the deviation amount of the minimum value in each interval is the same as the corresponding deviation amount of the maximum value determined by the fourth exemplary embodiment. Therefore, the level of synchronization accuracy determined based on the deviation amount of the minimum value remains the same. Then, as a result, this exemplary embodiment provides an advantage of making it possible to grasp the current clock synchronization accuracy between a master node and a slave node while providing services.

Eighth Exemplary Embodiment

Figure 34:
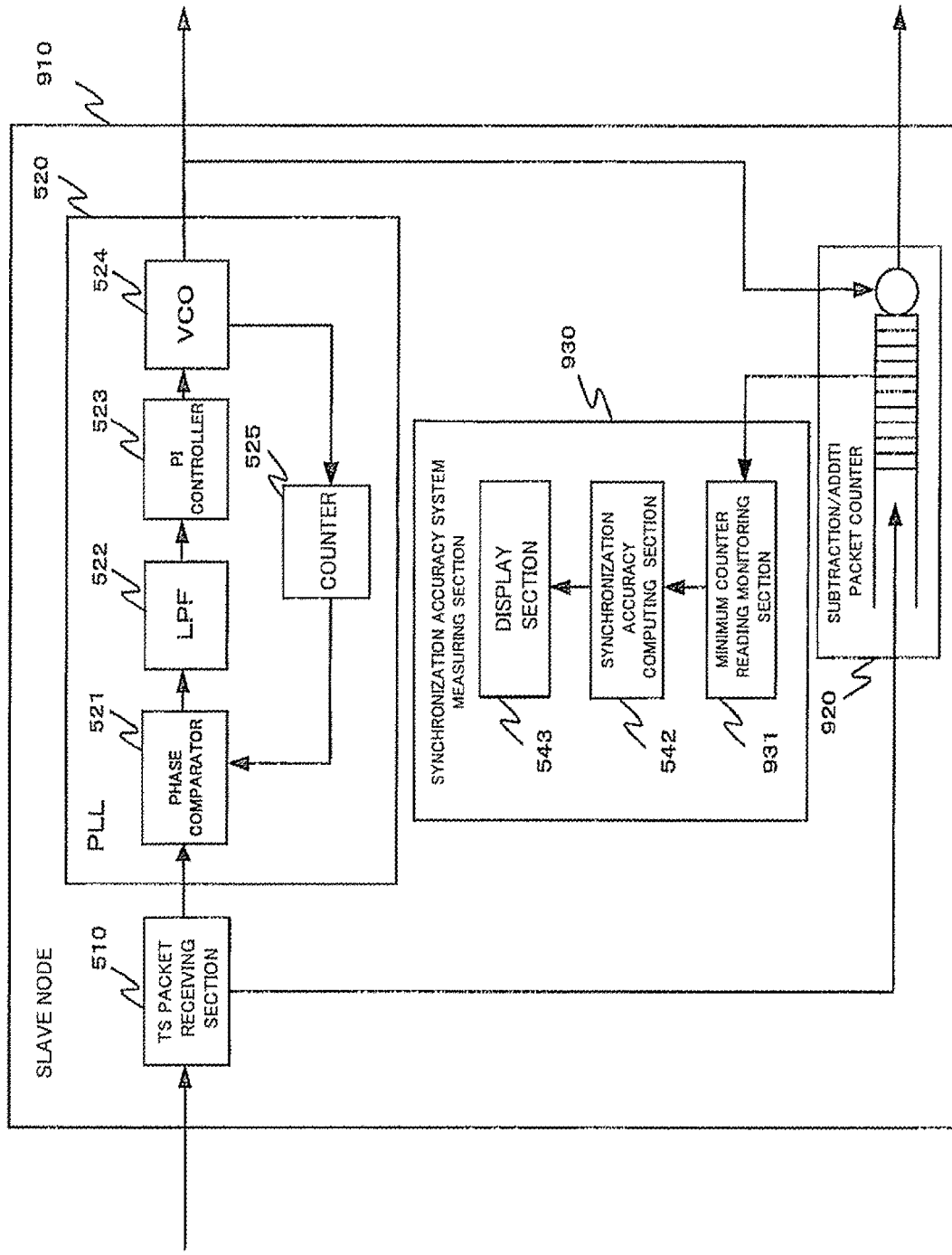
FIG. 34 An illustration of the configuration of a slave node of the seventh exemplary embodiment of the present invention including the configuration of the synchronization accuracy measuring section 3440 thereof shown in detail.

Still another exemplary embodiment for carrying out the present invention will be described in detail by referring to the drawings. When computing the synchronization accuracy in the seventh exemplary embodiment, the minimum value of the counter readings of the subtraction/addition packet counter 920 of the slave node 910 as illustrated in FIG. 34 is monitored and the synchronization accuracy is computed from the deviation amount thereof. The synchronization accuracy computing method of this exemplary embodiment is obtained by a method obtained by altering the method of monitoring the minimum value as will be described below.

The method of referring to the counter reading values of the seventh exemplary embodiment as described above by referring to FIG. 33 is altered for this exemplary embodiment in such a way that a different value is referred to as counter reading value at the time of arrival. This will be described below by referring to FIG. 36.

In FIG. 36, the arriving TS packets P10 through P20 and the timings of arrivals thereof are the same as those of FIG. 33. While counter reading values C50 through C60 are obtained by subtracting a counter decrement at the times of arrivals for the seventh exemplary embodiment as shown in FIG. 33, counter reading values C70 through C80 are obtained before or without subtracting a counter decrement at the times of arrivals for this exemplary embodiment. Since C70 through C80 are obtained as counter reading values before or without subtracting a counter decrement at the times of arrivals, the minimum counter reading value L8 is the minimum value in the counter reading values at the times of arrivals (note that the minimum counter reading value L8 is the minimum value of the counter readings at the times of arrivals before or without subtracting a counter decrement that is to be referred to and not indicating the minimum value of L8 illustrating the progress of counter reading value).

As already described above, in the operation of the subtraction/addition packet counter 920, the decrement that is subtracted for a packet at the time of arrival of a packet is constant. Therefore, if the counter reading value to be referred to is altered in such a way that counter reading value at the time of arrival of a packet before or without subtracting the decrement is employed for this exemplary embodiment instead of the counter reading value at the time of arrival after subtracting the decrement for the seventh exemplary embodiment, the net result is only that the counter reading value at the time of arrival is shifted by the decrement for a packet and the value of the deviation amount of the minimum value in each interval remains the same.

For this reason, the minimum value of the counter readings at the times of arrivals before or without subtracting a decrement is monitored in each interval and the synchronization accuracy is determined from the deviation amount of the minimum value.

If the method of monitoring the minimum counter reading values is altered, the value of the deviation amount of the minimum value in each interval is the same as that of the seventh exemplary embodiment. Thus, the operation of the slave node 910 is altered only in terms of determining the minimum counter reading value in each interval and all the remaining part of the operation for determining the synchronization accuracy from the deviation amount of the minimum value in each interval is the same as that of the seventh exemplary embodiment.

Figures 1, 37:
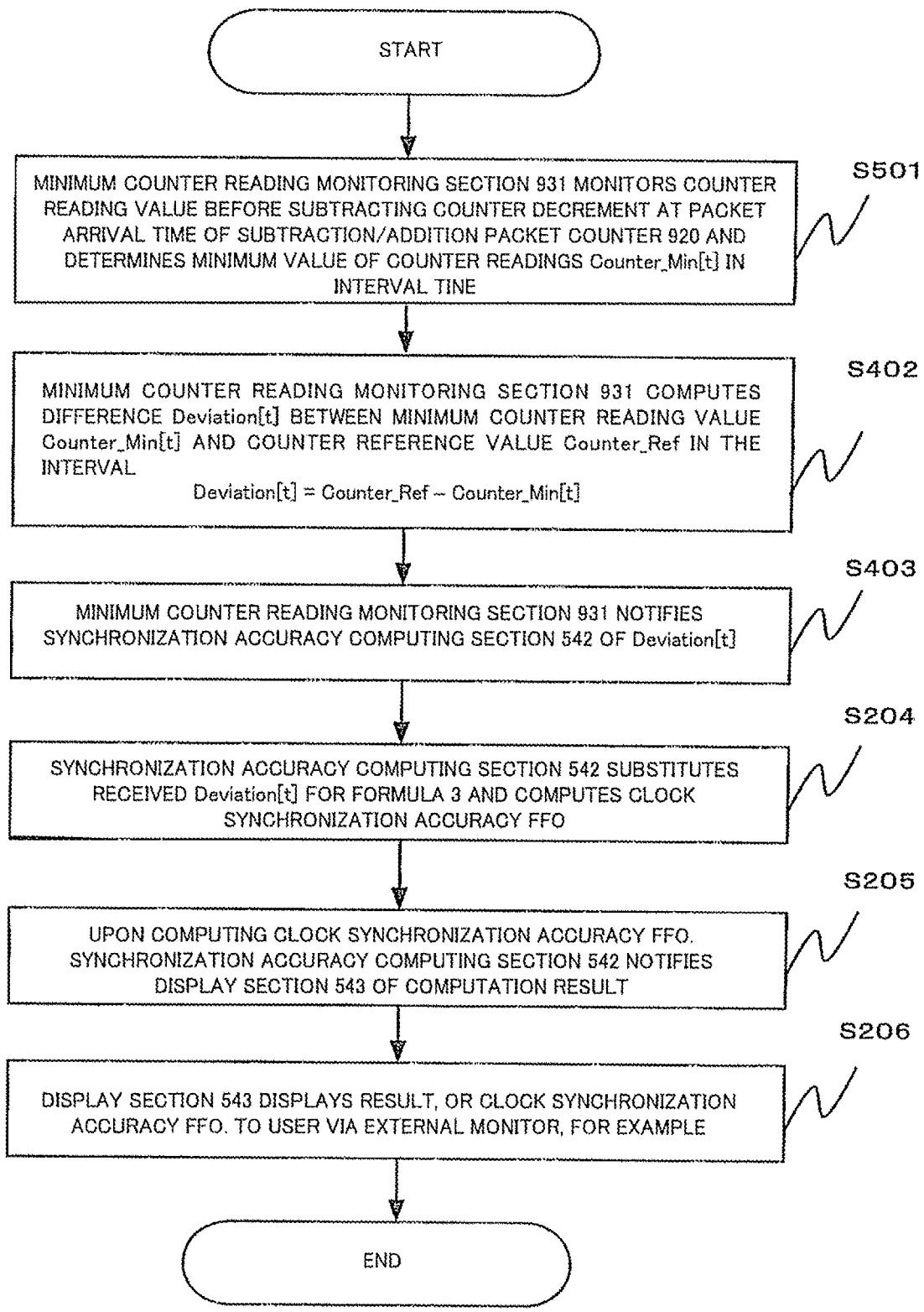
Figures 2, 37:
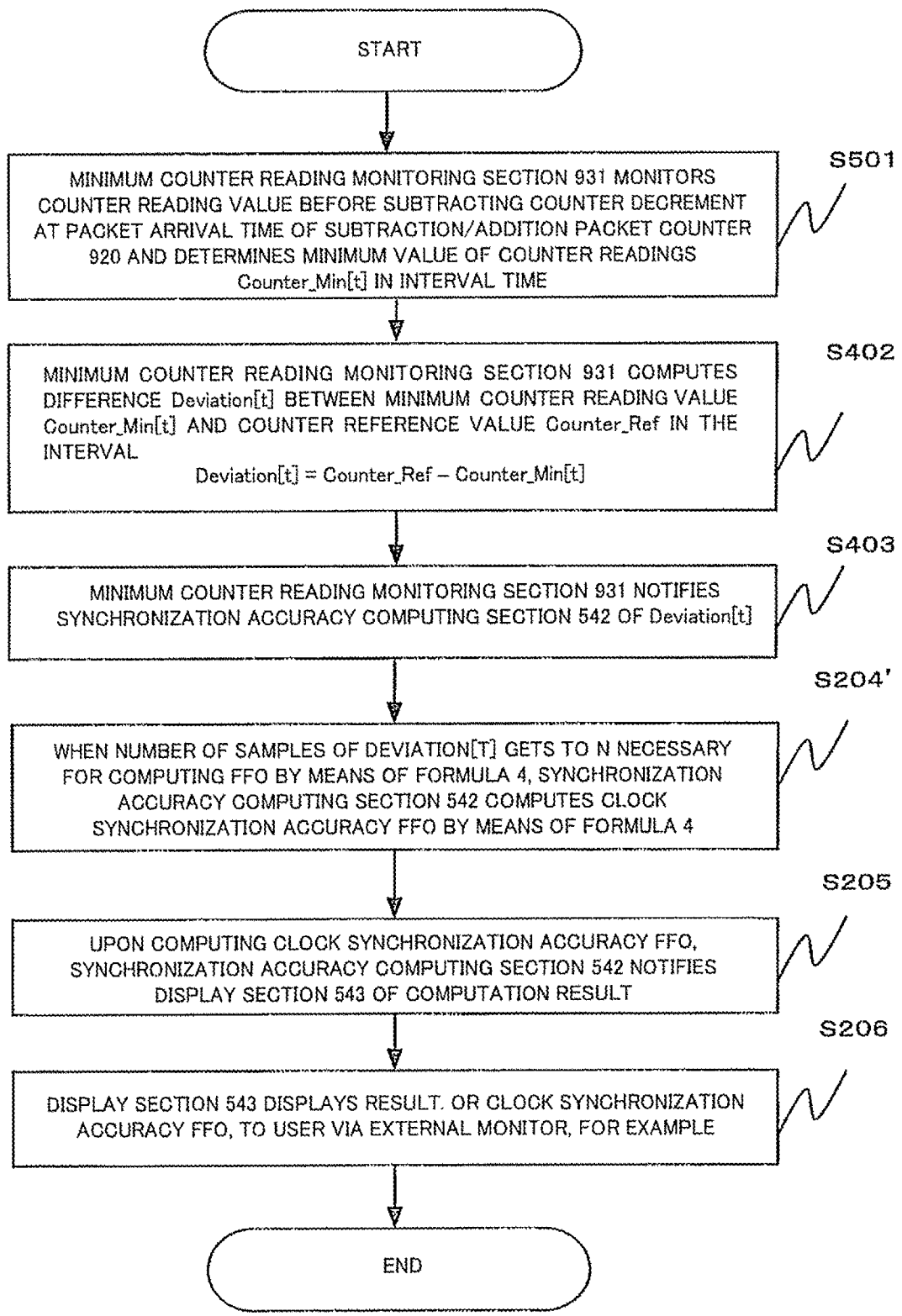

More specifically, with regard to the processing flow of the synchronization accuracy measuring section 930 of the seventh exemplary embodiment described above by referring to FIG. 35-1 and FIG. 35-2, the processing operation of Step S301 in FIG. 35-1 and FIG. 35-2 is replaced by Step S401 of FIG. 37-1 and FIG. 37-2. All the subsequent operation is the same as the one illustrated in FIG. 35-1 and FIG. 35-2.

As processing operation, the minimum counter reading monitoring section 931 monitors the counter reading value of the subtraction/addition packet counter 920 as shown in Step S401 in FIG. 37-1 and FIG. 37-2. It particularly monitors the value obtained after subtracting the decrement for a packet in a situation where the counter reading value rises and falls and determines the minimum value Counter_Min[t] in the values obtained after subtracting the decrement for a packet in interval t (Step S401). The processing operations of all the subsequent steps, or Steps S302 through S306 are the same as those of FIG. 35-1 and FIG. 35-2.

<Advantageous Effects>

As described above, according to the present invention, the packet counter of the slave node operates in such a way that it particularly monitors the values obtained before or without subtracting the decrement for a packet in a situation where the counter reading value rises and falls and manages the minimum value of the monitored values in each interval so that it can compute the current clock synchronization accuracy on the basis of the deviation amount of the minimum value. When the method of monitoring the minimum counter reading value described above for this exemplary embodiment is compared with the method described above for the seventh exemplary embodiment, the acquired minimum value is equal to that of the seventh exemplary embodiment plus the decrement for a packet so that the deviation amount of the minimum value in each interval is the same as the value determined in the seventh exemplary embodiment. Therefore, the level of synchronization accuracy determined based on the deviation amount of the minimum value remains the same. Then, as a result, this exemplary embodiment provides an advantage of making it possible to grasp the current clock synchronization accuracy between a master node and a slave node while providing services.

Ninth Exemplary Embodiment

Still another exemplary embodiment for carrying out the present invention will be described in detail by referring to the drawings. In this exemplary embodiment, when a TS packet 120 is scrapped in the packet network 130, the synchronization accuracy computing method takes a response to the scrap into consideration. This will be described below.

When a TS packet 120 that is supposed to arrive is scrapped in packet network 130, there arises a problem that the counter reading value is decremented by the value of a packet.

To cope with this problem, the TS value stored in the TS packet 120 is utilized. As already described above, TS provides a numerical value for realizing clock synchronization between nodes. It provides a value representing time information generated on the basis of the clock of master node 400. Therefore, the difference between the TS stored in the TS packet 120 that the master node 400 transmits at a certain clock time and the TS stored in the TS packet 120 that the master node 400 transmits next shows the transmission interval. Note that it is assumed that the master node 400 transmits TS packets 120 at regular intervals. Therefore, the difference between two consecutive TS packets 120 transmitted by the master node 400 shows a constant value (the constant value is represented by "T" here as an example). All the differences of the values of consecutive TSs, each of which is stored when the corresponding TS packet 120 arrives are equal to T when no packet is scrapped. On the other hand, when, for example, a packet is scrapped in the packet network 130, the interval of arrivals will be doubled so that the difference becomes equal to 2T to prove that a TS packet is scrapped. In short, it is possible if a packet is scrapped or not by computing the difference of the value of the TS of a TS packet 120 received by the slave node 500 and that of the TS of the immediately preceding TS packet 120 also received by the slave node 500.

Figure 38:
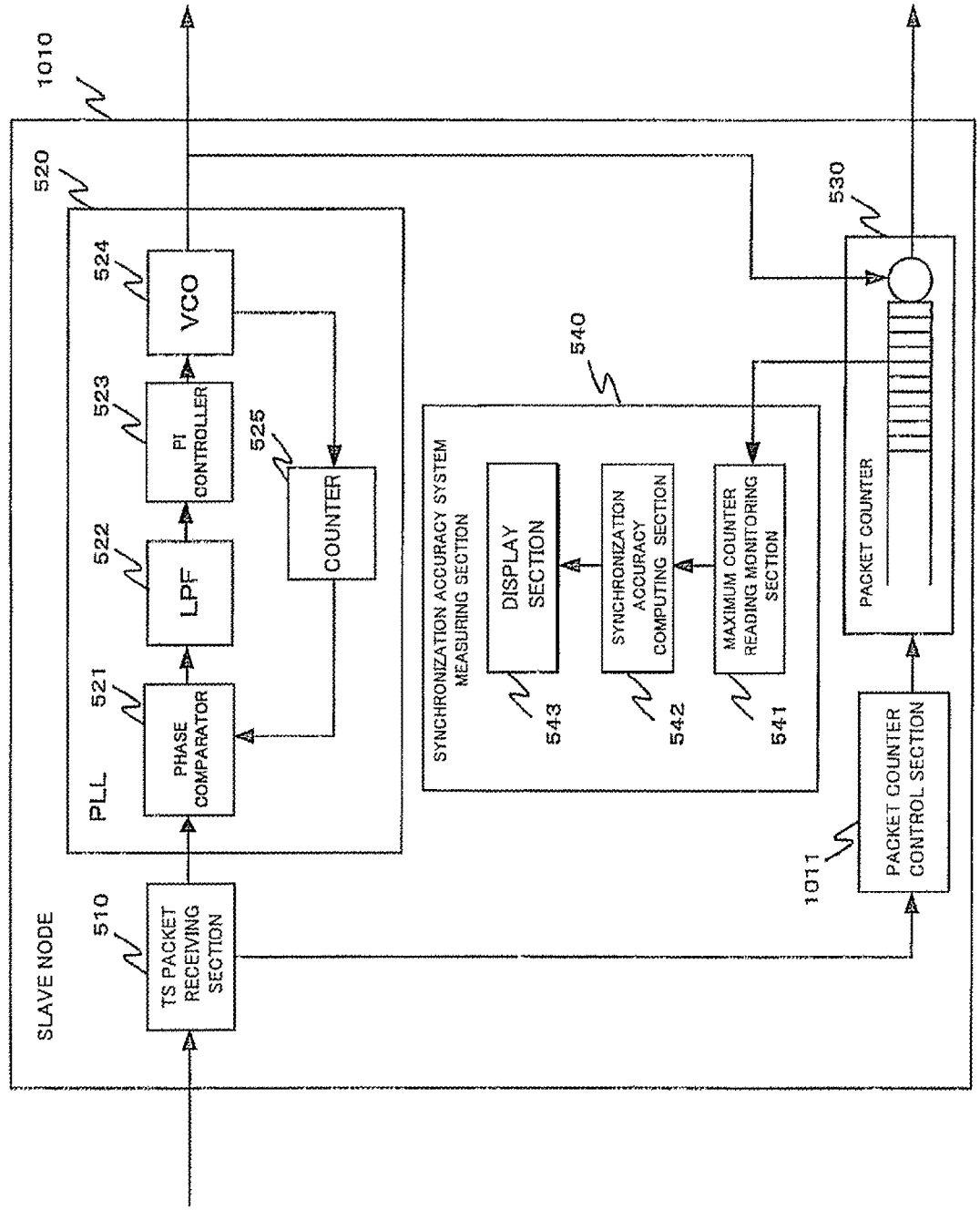
FIG. 38 An illustration of the configuration of slave node according to a ninth exemplary embodiment of the present invention.

In order to execute such a process, the slave node 500 of this exemplary embodiment has a configuration as shown in FIG. 38, where a packet counter control section 1011 is added. Thus, the slave node of this exemplary embodiment is expressed as a slave node 1010.

Figure 39:
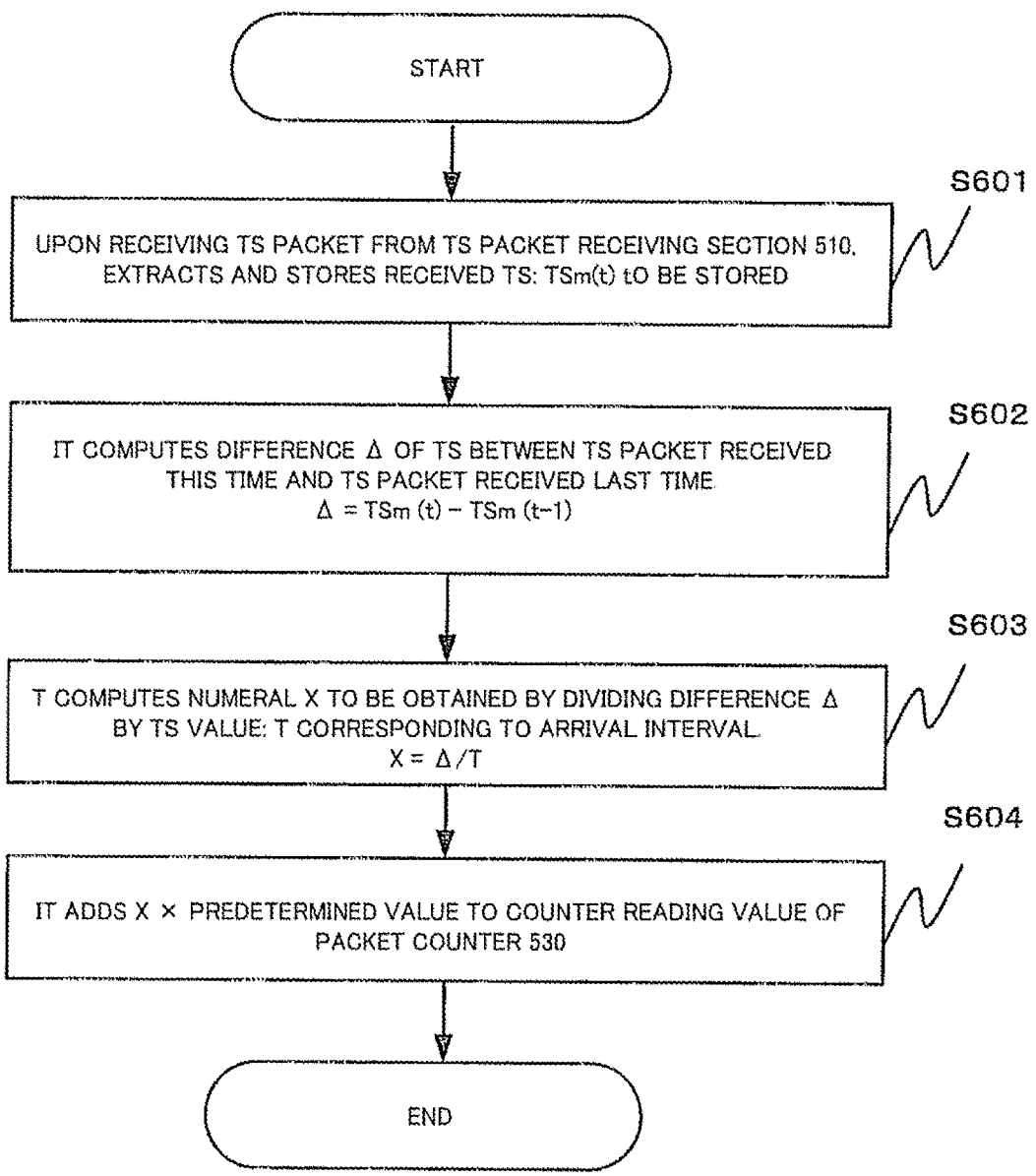
FIG. 39 An illustration of the processing flow of the packet counter control section 3801 of the ninth exemplary embodiment of the present invention.

FIG. 39 illustrates the processing flow of the packet counter control section 1011.

As the packet counter control section 1011 receives a TS packet 120 from the TS packet receiving section 510, it extracts the received TS value: TSm(t) to be stored and holds the value (Step S501).

As the packet counter control section 1011 extracts the received TS value, it computes the difference $\Delta$ between the received TS value TSm(t) of the TS packet 120 it receives this time and the received TS value TSm(t−) of the TS packet 120 it received last time (Step S502).

Then, it computes numeral X that is the value obtained by dividing the difference $\Delta$ by the TS value: T that corresponds to the interval of arrivals (Step S503).

Then, it increments the counter reading value of the packet counter 530 by X×a predetermined numeral (Step S504).

By following this processing flow, the counter reading value is incremented by a predetermined numeral as before when no packet is scrapped, whereas the counter reading value is incremented by X×a predetermined numeral when a packet is scrapped. As a result of this process, the level of counter reading value is properly held without being shifted.

Figure 40:
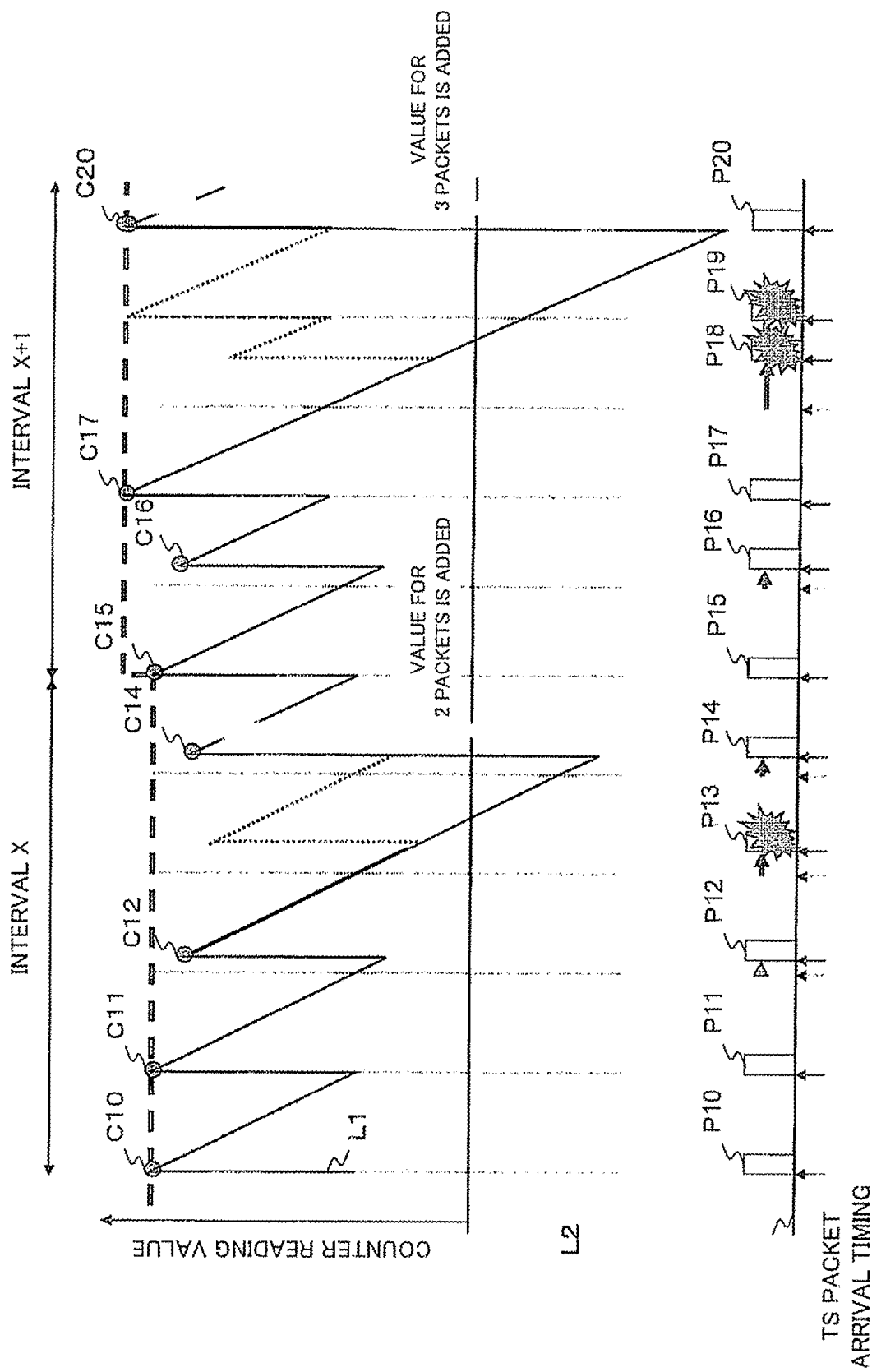
FIG. 40 An illustration of arrival timing of a TS packet and the corresponding increase/decrease of the reading of the packet counter 530 of the ninth exemplary embodiment of the present invention.

FIG. 40 and FIG. 41 illustrate a case where packets are scrapped in a situation where the counter reading value rises and falls as described above for the fourth exemplary embodiment by referring to FIG. 30. An example of numerical values that are obtained when the process described above for this exemplary embodiment is executed in this case will be described below.

In a state where packets arrive as shown in FIG. 30, TS packets P13, P18 and P19 are scrapped. The TS value that corresponds to the interval of TS packet arrivals is assumed to be T=1,000.

FIG. 41 illustrates the received TS values: TSm(t) stored in the TS packets P10 through P20, the difference $\Delta$ between the received TS value of a received TS packet and the received TS value of the TS packet received immediately before and the numeral value X obtained by dividing the difference $\Delta$ by the TS value (T=1,000) that correspond to the interval of packet arrivals.

$\Delta$=1,000 for the TS packet whose immediately preceding TS packet is not scrapped (e.g., TS packet P11 or P12) and X=1,000/1,000=1. Hence, the predetermined counter reading value is added as before.

On the other hand, since the TS packet P13 is scrapped, the received TS; TSm(t)=14,000 for the TS packet P14 that arrives as the immediately succeeding packet and hence the difference between the received TS: TSm(t−1)=12,000 of the packet that arrived immediately before is $\Delta$=14,000−12,000=2,000. Thus, X=2,000/1,000=2 and hence the increment that is doubled for two packets will be added.

Similarly, TS packets P18 and P19 are scrapped. Therefore, for the TS packet P20 that arrives immediately thereafter, the received TS: TSm(t)=20,000 and the difference between the received TS: TSm(t−1)=17,000 of the packet that arrived immediately before is $\Delta$=20,000−17,000=3,000. Thus, X=3,000/1,000=3 and hence the increment that is tripled for three packets will be added.

In this way, the level of counter reading value can be properly held by detecting one or more than one scrapped packets from the received TS value of the packet that arrives immediately after the scrap of the packets and adding a TS value so as to include the scrapped packets. Thus, it is possible to compute the clock synchronization accuracy as before if one or more than one packets are scrapped.

The measures to be taken of scrapped packets in the ninth exemplary embodiment is described above by way of an example where packets are scrapped in the fourth exemplary embodiment. However, the above-described method of detecting one or more than one scrapped packets from the received TS value and adding a TS value so as to include the scrapped packets is straightly applicable to the sixth exemplary embodiment.

The arrangement of this exemplary embodiment may be combined with those of the seventh exemplary embodiment and the eighth exemplary embodiment. In such a case, the packet counter 530 in FIG. 38 is replaced by a subtraction/addition packet counter 920. Then, the counter reading value of the subtraction/addition packet counter 920 is decremented by X×a predetermined numeral. In other words, the counter reading value is decremented by a predetermined numeral as before when there is not any scrapped packet, whereas the counter reading value is decremented by X×a predetermined numeral when one or more than one packets are scrapped. As a result of this process, the level of counter reading value is properly held without being shifted.

As described above, with the above-described exemplary embodiments of the present invention, the maximum values of the packet counter for managing the state of arrivals and that of outputs of TS packets at a slave node are managed on an interval by interval basis to make it possible to compute the current clock synchronization accuracy on the basis of the deviation amount of the maximum value. Then, as a result, the present invention provides an advantage of making it possible to grasp the current clock synchronization accuracy between a master node and a slave node while providing services.

Particularly, since the exemplary embodiments of the present invention make it possible to measure the accuracy by way of a process at the slave node so that the present invention can be applied to a network that is being actually run so dissolve the problem that it is difficult to measure the synchronization accuracy on an actual field where a master node and a slave node are located at places that are physically remote from each other. Additionally, since the accuracy can be computed from the information obtained by monitoring the counter reading value at the slave node, it is not necessary to provide a specific system such as GPS. Therefore, a system according to the present invention can be realized at low cost and stably because the present invention is free from particular restrictions for providing services typically in terms of places for installing devices.

Note that any of the clock synchronization system using a clock synchronization accuracy monitor in a network, the slave node and the master node in any of the above-described exemplary embodiments of the present invention may be realized by means of hardware, software of a combination of them.

While the present invention is described above in detail by way of representative exemplary embodiments thereof, it should be understood that various changes, substitutions and alternatives can be made without departing from the spirit and scope of the invention as defined in the appended claims. If any of the claims is amended in the procedures of patent application, the inventor claims that the equivalence of the scope of the claimed invention should be maintained.

INDUSTRIAL APPLICABILITY

The present invention can suitably be applied to measurement of the clock synchronization accuracy among devices connected to each other by way of a network.

The invention claimed is:

1. A slave node comprising:
   a receiver for receiving time stamp packets transmitted from a master node;
   a clock reproducer for reproducing a clock of the slave node by using the received time stamp packets;
   a buffer for storing the received time stamp packets and reading out the stored time stamp packets by using the reproduced clock;
   an accuracy monitor coupled to the buffer for generating deviation information of the reproduced clock with respect to a clock at the master node by detecting a maximum value of an amount of stored time stamp packets in the buffer in a time period for controlling a threshold value controller; and
   a packet filter for inputting the received time stamp packets and passing only time stamp packets including a delay jitter which is not greater than a threshold value,
   wherein the time stamp packets which have passed through the packet filter are supplied to the clock reproducer.

2. The slave node according to claim 1,
   wherein the accuracy monitor computes, as the deviation information, a magnitude of a difference between the maximum value of an amount of time stamp packets stored in the buffer and an ideal value of the amount of the time stamp packets stored in the buffer in the time period.

3. The slave node according to claim 1, further comprising:
   a synchronization accuracy computer for computing an accuracy of the reproduced clock on the basis of the deviation information, the time period, and a bit rate of the time stamp packets if the computation uses deviation information for one time stamp packet, and on the basis of the deviation information, the time period, a bit rate of the time stamp packets, and a number of time stamp packets if the computation uses deviation information for two or more time stamp packets.

4. The slave node according to claim 3, further comprising:
   a display for displaying the accuracy of the reproduced clock.

5. The slave node according to claim 3,
   wherein the accuracy monitor computes, as the deviation information, a magnitude of a difference between a maximum amount of the time stamp packets stored in the buffer and an ideal amount of the time stamp packets stored in the buffer in each of a plurality of time periods,
   wherein the synchronization accuracy computer computes the accuracy using a numerical formula as follows:

$$\text{Clock synchronization accuracy} = \frac{C \cdot \text{Deviation}(n)}{B \cdot T}$$

wherein
   Deviation (n) is measured in bits and stands for deviation in the deviation information,
   T is measured in seconds and is the time period,
   B is measured in bits per second and is a bit rate of time stamp packets, and
   C is a constant coefficient.

6. The slave node according to claim 3,
   wherein the accuracy monitor computes, as the deviation information, a magnitude of a difference between a maximum amount of the time stamp packets stored in the buffer and an ideal amount of the time stamp packets stored in the buffer in each of a plurality of time periods, wherein the synchronization accuracy computer computes the accuracy using a numerical formula as follows:

$$\text{Clock synchronization accuracy} = \sum_{i=1}^{N}\left[\frac{C \cdot \text{Deviation}(i)}{B \cdot T} \cdot \left(\frac{2i}{N^2 - 1} - \frac{1}{N - 1}\right)\right]$$

wherein
   Deviation (n) is measured in bits and stands for deviation in the deviation information,
   T is measured in seconds and is the time period,
   B is measured in bits per second and is a bit rate of time stamp packets, and
   C is a constant coefficient.

7. The slave node according to claim 1,
   wherein the accuracy monitor computes, as the deviation information, a magnitude of a difference between a maximum value of an amount of time stamp packets stored in the buffer and an ideal value of the amount of time stamp packets stored in the buffer in each of a plurality of time periods,
   wherein the accuracy monitor further computes a control direction on the basis of the magnitude computed presently and the magnitude computed just before the magnitude computed presently, and
   wherein the slave node further comprises a threshold value controller for controlling the threshold value on the basis of the deviation information and the control direction.

8. The slave node according to claim 7, further comprising:
   a time constant adjuster for adjusting, together with the threshold value, a time constant in the clock reproducer.

9. The slave node according to claim 1, further comprising:
   a jitter computer for computing respective transfer delay times of the received time stamp packets on the basis of time stamps described in the received time stamp packets, for detecting a minimum transfer delay time among the computed transfer delay times as a fixed transfer delay time, and computing a jitter of each received time stamp packet by subtracting the fixed transfer delay time from a transfer delay time of each received time stamp packet.

10. A clock synchronization method comprising the steps of:
    receiving time stamp packets transmitted from a master node;
    reproducing a clock of a slave node using the received time stamp packets;
    storing the received time stamp packets and reading out the stored time stamp packets by using the reproduced clock;
    generating deviation information of the reproduced clock with respect to a clock at the master node by detecting a maximum value of an amount of stored time stamp packets in a buffer in a time period for controlling a threshold value controller; and
    inputting the received time stamp packets and passing only time stamp packets including a delay jitter which is not greater than a threshold value,
    wherein the time stamp packets which have passed by the passing are supplied to be used in the reproducing.

11. A non-transitory computer-readable medium storing therein a clock synchronization program for causing a computer to function as a slave node comprising:
- a receiver for receiving time stamp packets transmitted from a master node;
- a clock reproducer for reproducing a clock of the slave node by using the received time stamp packets;
- a buffer for storing the received time stamp packets and reading out the stored time stamp packets by using the reproduced clock;
- an accuracy monitor coupled to the buffer for generating deviation information of the reproduced clock with respect to a clock at the master node by detecting a maximum value of an amount of stored time stamp packets in the buffer in a time period for controlling a threshold value controller; and
- a packet filter for inputting the received time stamp packets and passing only time stamp packets including a delay jitter which is not greater than a threshold value,
- wherein the time stamp packets which have passed through the packet filter are supplied to the clock reproducer.

12. A slave node comprising:
- a receiver for receiving time stamp packets transmitted from a master node;
- a clock reproducer for reproducing a clock of the slave node by using the received time stamp packets;
- a packet counter for managing a state of arrivals and a state of outputs of the time stamp packets;
- an accuracy monitor for generating deviation information of the reproduced clock with respect to a clock at the master node by detecting a peak value of a count of the packet counter in a time period, and then measuring clock synchronization accuracy on the basis of the peak value; and
- a packet filter for inputting the received time stamp packets and passing only time stamp packets including a delay jitter which is not greater than a threshold value,
- wherein the time stamp packets which have passed through the packet filter are supplied to the clock reproducer.

13. The slave node according to claim 12,
- wherein the accuracy monitor computes, as the deviation information, a magnitude of a difference between a peak value of the count of the counter with respect to a predetermined direction and an ideal value of the count of the counter with respect to the predetermined direction.

14. The slave node according to claim 12, further comprising:
- a synchronization accuracy computer for computing an accuracy of the reproduced clock on the basis of the deviation information, the time period, and a bit rate of the time stamp packets if the computation uses deviation information for one time stamp packet, and on the basis of the deviation information, the time period, a bit rate of the time stamp packets, and a number of time stamp packets if the computation uses deviation information for two or more time stamp packets.

15. The slave node according to claim 14, further comprising:
- a display for displaying the accuracy of the reproduced clock.

16. The slave node according to claim 14,
- wherein, in the packet counter, a count is varied to a predetermined direction by a predetermined amount each time when the receiver receives the time stamp packet and of which the count is reversely varied at a rate corresponding to a frequency of the reproduced clock,
- wherein the accuracy monitor computes, as the deviation information, a magnitude of a difference between a peak value of the count of the counter with respect to the predetermined direction and an ideal value of the count of the counter with respect to the predetermined direction, and
- wherein the synchronization accuracy computer computes the accuracy using a numerical formula as follows:

$$\text{Clock synchronization accuracy} = \frac{\text{Deviation}}{B \cdot T}$$

wherein
Deviation is measured in bits and stands for deviation in the deviation information,
T is measured in seconds in the time period, and
B is measured in bits per second and is a bit rate of time stamp packets.

17. The slave node according to claim 14,
- wherein, in the packet counter, a count is varied to a predetermined direction by a predetermined amount each time when the receiver receives the time stamp packet and of which the count is reversely varied at a rate corresponding to a frequency of the reproduced clock,
- wherein the accuracy monitor computes, as the deviation information, a magnitude of a difference between a peak value of the count of the counter with respect to the predetermined direction and an ideal value of the count of the counter with respect to the predetermined direction,
- wherein the synchronization accuracy computer computes the accuracy using a numerical formula as follows:

$$\text{Clock synchronization accuracy} = \frac{6 \times 10^{-9}}{N \cdot B \cdot T} \sum_{i=1}^{N} \text{Deviation}\ [i] \cdot \left( \frac{2i}{N^2 - 1} - \frac{1}{N - 1} \right)$$

wherein
Deviation[i] is measured in bits and stands for deviation in the deviation information,
T is measured in seconds in the time period,
B is measured in bits per second and is a bit rate of time stamp packets, and
N is the number of time stamp packets of which Deviations [i] are used for the computation.

18. The slave node according to claim 14,
- wherein, in the packet counter, a count is varied to a predetermined direction by an amount obtained by multiplying a predetermined amount by N, wherein N is an integer not smaller than one, if a difference between a time stamp in the time stamp packet received presently and a time stamp in the time stamp packet received just before the time stamp packet received presently is equal to an amount obtained by multiplying the predetermined amount by N each time when the receiver receives the time stamp packet and of which the count is reversely varied at a rate corresponding to a frequency of the reproduced clock,
- wherein the accuracy monitor computes, as the deviation information, a magnitude of a difference between a peak value of the count of the counter with respect to the predetermined direction and an ideal value of the count of the counter with respect to the predetermined direction, wherein the synchronization accuracy computer computes the accuracy using a numerical formula as follows:

$$\text{Clock synchronization accuracy} = \frac{\text{Deviation}}{B \cdot T}$$

wherein

Deviation is measured in bits and stands for deviation in the deviation information, T is measured in seconds in the time period, and B is measured in bits per second and is a bit rate of time stamp packets.

19. The slave node according to claim 14, wherein, in the packet counter, a count is varied to a predetermined direction by an amount obtained by multiplying a predetermined amount by N, wherein N is an integer not smaller than one, if a difference between a time stamp in the time stamp packet received presently and a time stamp in the time stamp packet received just before the time stamp packet received presently is equal to an amount obtained by multiplying the predetermined amount by N each time when the receiver receives the time stamp packet and of which the count is reversely varied at a rate corresponding to a frequency of the reproduced clock, wherein the accuracy monitor computes, as the deviation information, a magnitude of a difference between a peak value of the count of the counter with respect to the predetermined direction and an ideal value of the count of the counter with respect to the predetermined direction, wherein the synchronization accuracy computer computes the accuracy using a numerical formula as follows:

$$\text{Clock synchronization accuracy} = \frac{6 \times 10^{-9}}{N \cdot B \cdot T} \sum_{i=1}^{N} \text{Deviation } [i] \cdot \left( \frac{2i}{N^2 - 1} - \frac{1}{N - 1} \right)$$

wherein

Deviation[i] is measured in bits and stands for deviation in the deviation information, T is measured in seconds in the time period, B is measured in bits per second and is a bit rate of time stamp packets, and N is the number of the time stamp packets of which Deviations [i] are used for the computation.

20. The slave node according to claim 12, wherein the accuracy monitor computes, as the deviation information, a magnitude of a difference between a peak value of the count of the counter with respect to a predetermined direction and an ideal value of the count of the counter with respect to the predetermined direction, wherein the accuracy monitor further computes a control direction on the basis of the magnitude computed presently and the magnitude computed just before the magnitude computed presently, and wherein the slave node further comprises a threshold value controller for controlling the threshold value on the basis of the deviation information and the control direction.

21. The slave node according to claim 20, further comprising:

a time constant adjuster for adjusting, together with the threshold value, a time constant in the clock reproducer.

22. The slave node according to claim 12, further comprising:

a jitter computer for computing respective transfer delay times of the received time stamp packets on the basis of time stamps described in the received time stamp packets, for detecting a minimum transfer delay time among the computed transfer delay times as a fixed transfer delay time, and computing a jitter of each received time stamp packet by subtracting the fixed transfer delay time from a transfer delay time of each received time stamp packet.

23. The slave node according to claim 12, wherein, in the packet counter, a count is varied to a predetermined direction by a predetermined amount each time when the receiver receives the time stamp packet and of which the count is reversely varied at a rate corresponding to a frequency of the reproduced clock, and wherein the accuracy monitor computes, as the deviation information, a magnitude of a difference between a peak value of the count of the counter with respect to the predetermined direction and an ideal value of the count of the counter with respect to the predetermined direction.

24. The slave node according to claim 12, wherein, in the packet counter, a count is varied to a predetermined direction by an amount obtained by multiplying a predetermined amount by N, wherein N is an integer not smaller than one, if a difference between a time stamp in the time stamp packet received presently and a time stamp in the time stamp packet received just before the time stamp packet received presently is equal to an amount obtained by multiplying the predetermined amount by N each time when the receiver receives the time stamp packet and of which the count is reversely varied at a rate corresponding to a frequency of the reproduced clock, and wherein the accuracy monitor computes, as the deviation information, a magnitude of a difference between a peak value of the count of the counter with respect to the predetermined direction and an ideal value of the count of the counter with respect to the predetermined direction.

25. A clock synchronization method comprising the steps of:

receiving time stamp packets transmitted from a master node;

reproducing a clock of a slave node using the received time stamp packets;

managing a state of arrivals and a state of outputs of the time stamp packets;

generating deviation information of the reproduced clock with respect to a clock at the master node by detecting a peak value of a count of a counter in a time period, and then measuring clock synchronization accuracy on the basis of the peak value; and inputting the received time stamp packets and passing only time stamp packets including a delay jitter which is not great than a threshold value, wherein the time stamp packets which have passed by the passing are supplied to be used in the reproducing.

26. A non-transitory computer-readable medium storing therein a clock synchronization program for causing a computer to function as a slave node comprising:
- a receiver for receiving time stamp packets transmitted from a master node;
- a clock reproducer for reproducing a clock of the slave node by using the received time stamp packets;
- a packet counter for managing a state of arrivals and a state of outputs of the time stamp packets;
- an accuracy monitor for generating deviation information of the reproduced clock with respect to a clock at the master node by detecting a peak value of a count of the packet counter in a time period, and then measuring clock synchronization accuracy on the basis of the peak value;
- a packet filter for inputting the received time stamp packets and passing only time stamp packets including a delay jitter which is not greater than a threshold value,
- wherein the time stamp packets which have passed through the packet filter are supplied to the clock reproducer.

* * * * *